US006885563B2

(12) United States Patent
Panella et al.

(10) Patent No.: US 6,885,563 B2
(45) Date of Patent: Apr. 26, 2005

(54) POWER DELIVERY AND OTHER SYSTEMS FOR INTEGRATED CIRCUITS

(75) Inventors: Augusto P. Panella, Naperville, IL (US); James L. McGrath, Bloomingdale, IL (US)

(73) Assignee: Molex Incorporated, Lisle, IL (US)

( * ) Notice: Subject to any disclaimer, the term of this patent is extended or adjusted under 35 U.S.C. 154(b) by 217 days.

(21) Appl. No.: 10/255,376

(22) Filed: Sep. 26, 2002

(65) Prior Publication Data

US 2003/0193791 A1 Oct. 16, 2003

Related U.S. Application Data

(60) Provisional application No. 60/325,107, filed on Sep. 26, 2001.

(51) Int. Cl.[7] .............................. H05K 1/11; H05K 1/14
(52) U.S. Cl. ...................................... 361/794; 361/780
(58) Field of Search ................................. 361/760–764, 361/778–780, 794; 174/260–261; 257/723–724

(56) References Cited

U.S. PATENT DOCUMENTS

| | | | |
|---|---|---|---|
| 4,734,819 A | 3/1988 | Hernandez et al. | |
| 4,754,366 A | 6/1988 | Hernandez | |
| 4,853,826 A | 8/1989 | Hernandez | |

(Continued)

FOREIGN PATENT DOCUMENTS

| WO | WO 89 05570 A | 6/1989 |
|---|---|---|
| WO | WO 01 65344 A2 | 9/2001 |

OTHER PUBLICATIONS

International Search Report for International Application No. PCT/US02/30593 mailed Jul. 29, 2003.

*Primary Examiner*—Kamand Cuneo
*Assistant Examiner*—Tuan Dinh
(74) *Attorney, Agent, or Firm*—Thomas D. Paulius

(57) ABSTRACT

Systems for power delivery, signal transfer, package design, thermal management, and electromagnetic interference ("EMI") control are provided to support an integrated circuit ("IC"). The power delivery system includes a power supply, a voltage regulator module and a decoupling capacitance in the form of discrete and/or integral capacitors. The voltage regulator module and decoupling capacitance are located in a connector that may be formed as a cover, socket or a frame for the IC. The power delivery system delivers power to the IC along top, bottom or sides of the IC. The signal transfer system couples signals from the IC to one or more circuits on a circuit board. The package design system for the IC permits signals and/or power to be coupled to selected sides of the IC at connections outside, flush with, recessed or inside the IC package. The package design system also permits the transferred signals to have different frequencies, such as high and low frequencies, and to utilize different types of signal interfaces, such as galvanic, capacitive or the like. The thermal management system utilizes a heat sink, a fan and/or a heat spreader to dissipate heat generated by the IC and/or voltage regulator module. The EMI control system blocks EMI generated by the IC.

21 Claims, 48 Drawing Sheets

U.S. PATENT DOCUMENTS

| | | | |
|---|---|---|---|
| 5,022,869 A | | 6/1991 | Walker |
| 5,103,283 A | | 4/1992 | Hite |
| 5,212,402 A | | 5/1993 | Higgins, III |
| 5,272,590 A | | 12/1993 | Hernandez |
| 5,306,948 A | | 4/1994 | Yamada et al. |
| 5,369,058 A | * | 11/1994 | Burns et al. ............... 438/118 |
| 5,403,195 A | | 4/1995 | Thrush et al. |
| 5,403,784 A | | 4/1995 | Hashemi et al. |
| 5,438,481 A | | 8/1995 | Murphy et al. |
| 5,481,436 A | | 1/1996 | Werther |
| 5,483,099 A | | 1/1996 | Natarajan et al. |
| 5,640,048 A | * | 6/1997 | Selna ........................ 257/738 |
| 5,692,296 A | * | 12/1997 | Variot ........................ 29/827 |
| 5,694,297 A | | 12/1997 | Smith et al. |
| 5,717,249 A | | 2/1998 | Yoshikawa et al. |
| 5,721,673 A | | 2/1998 | Klein et al. |
| 5,734,555 A | | 3/1998 | McMahon |
| 5,747,875 A | | 5/1998 | Oshima |
| 5,831,810 A | | 11/1998 | Bird et al. |
| 5,844,419 A | | 12/1998 | Akram et al. |
| 5,892,275 A | | 4/1999 | McMahon |
| 5,895,966 A | | 4/1999 | Penchuk |
| 5,956,576 A | | 9/1999 | Toy et al. |
| 6,046,911 A | | 4/2000 | Dranchak et al. |
| 6,222,260 B1 | | 4/2001 | Liang et al. |
| 6,271,607 B1 | | 8/2001 | Vandenbossche |
| 6,342,724 B1 | | 1/2002 | Wark et al. |
| 6,469,895 B1 | | 10/2002 | Smith et al. |
| 6,489,686 B1 | | 12/2002 | Farooq et al. |
| 6,558,181 B1 | | 5/2003 | Chung et al. |
| 2003/0194832 A1 | | 10/2003 | Lopata et al. |
| 2003/0197198 A1 | | 10/2003 | Panella et al. |
| 2003/0198033 A1 | | 10/2003 | Panella et al. |
| 2003/0202330 A1 | | 10/2003 | Lopata et al. |

* cited by examiner

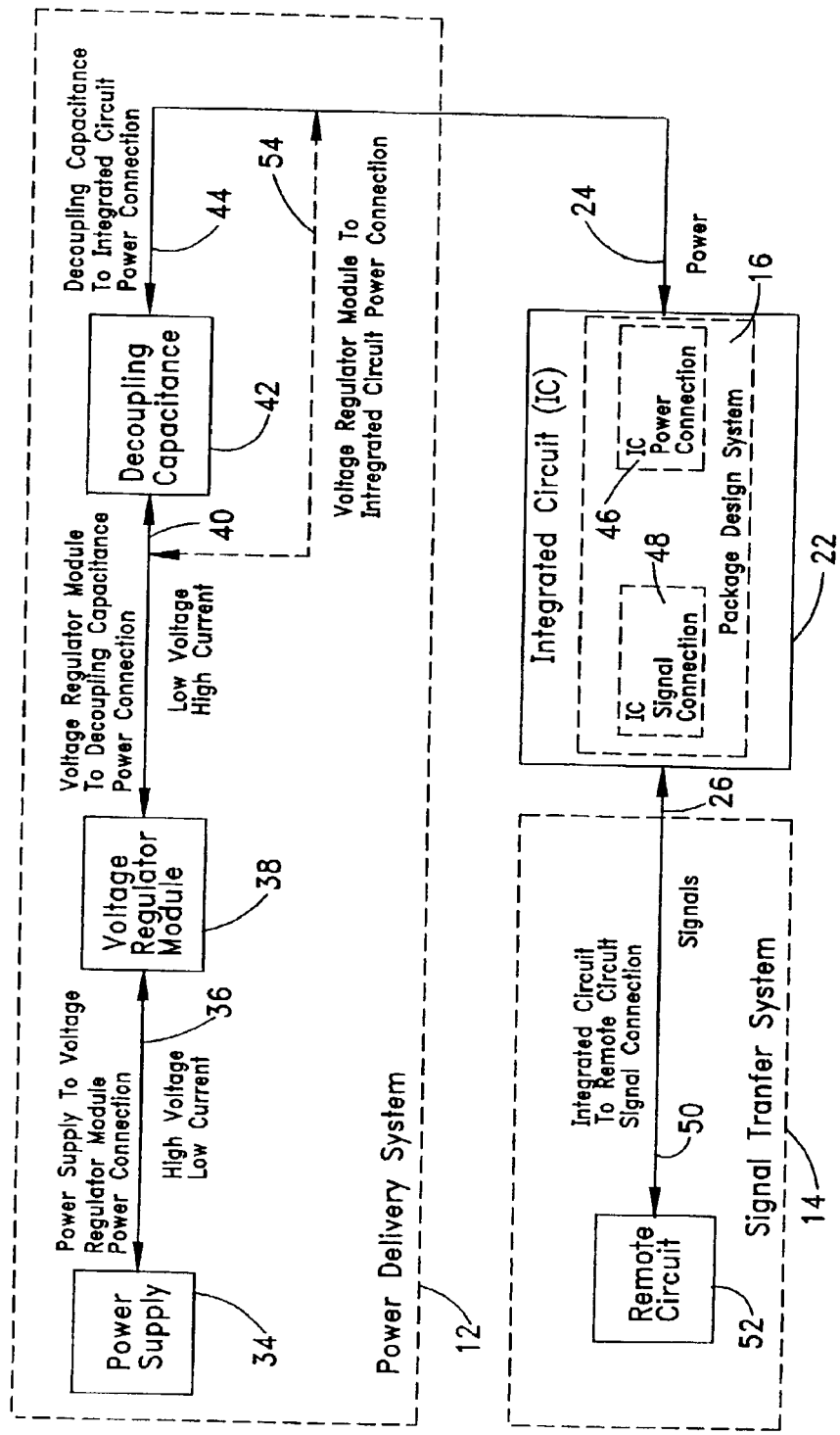

FIG. 3  Table Listing Alternative Locations For Each Block Shown In FIG.2 And Alternative Connections Between The Blocks Shown In FIG.2

| | A (34) | B 36 | C (38) | D 40 | E (42) | F 44 | G (46) | H (22) | I (48) | J 50 | K (52) |
|---|---|---|---|---|---|---|---|---|---|---|---|
| | Power Supply Location | Power Supply To Voltage Regulator Module Power Connection | Voltage Regulator Module Location | Voltage Regulator Module To Decoupling Capacitance Power Connection | Decoupling Capacitance Location | Decoupling Capacitance to IC Power Connection | IC Power Connection Location | Intrgrated Circuit(IC) Location | IC Signal Connection Location | IC to Remote Circuit Signal Connection | Remote Circuit Location |
| 1 | Remote | Conductor | Connector | Conductor | Connector | Conductor | Top of IC | Connector | Top of IC | Conductor | Connector |
| 2 | | PCB Trace | PCB | PCB Trace | PCB | PCB Trace | Side of IC | PCB | Side of IC | PCB Trace | PCB |
| 3 | | | Conductor | | Conductor | | Bottom of IC | Conductor | Bottom of IC | | Conductor |
| 4 | | | | | | | | | | | |

56

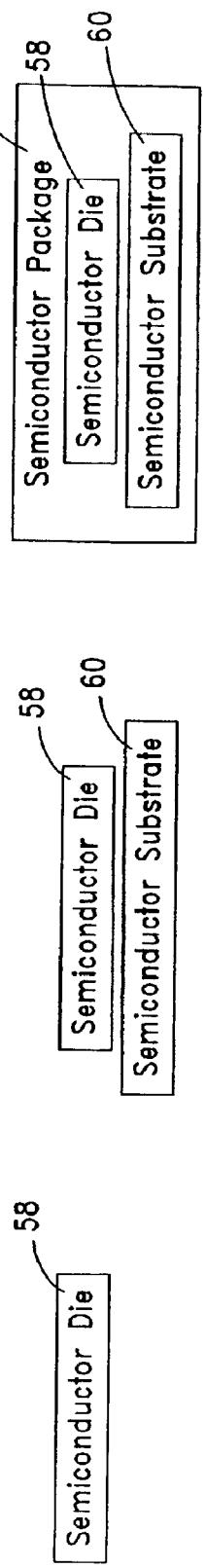
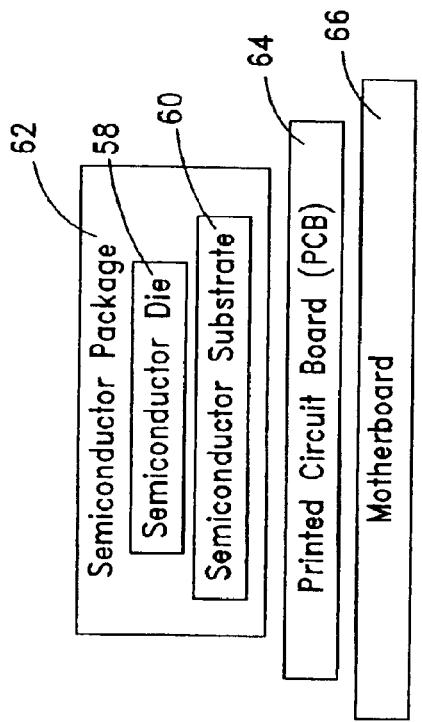
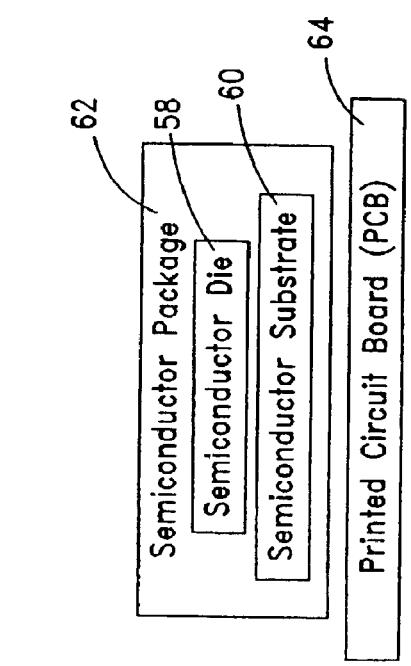
FIGS. 4A-4E Integrated Circuit, As Shown In Figs. 1, 2, 3A and 3B, Having Various Levels Of Integration (0-4)

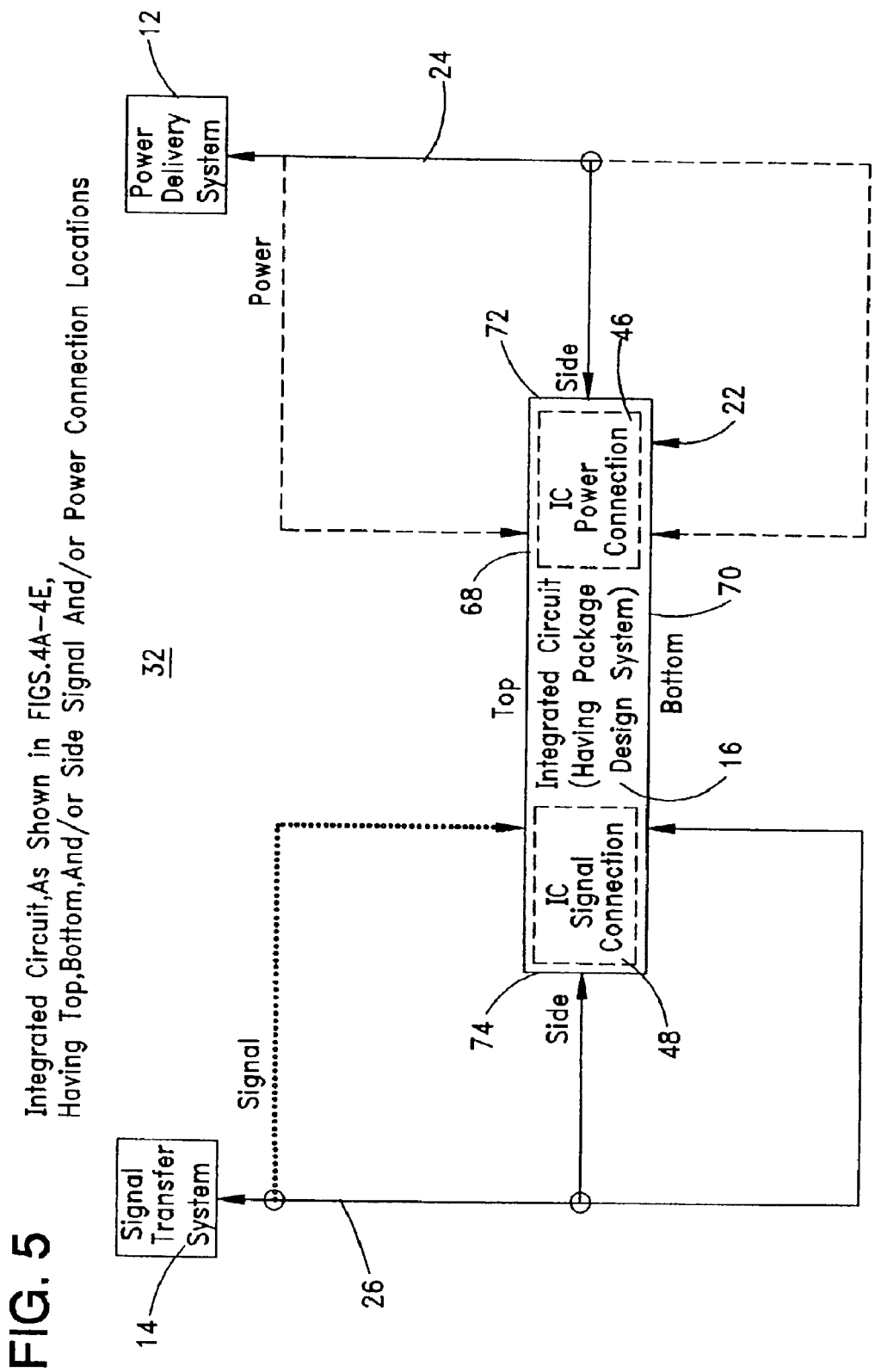
FIG. 5  Integrated Circuit, As Shown in FIGS. 4A–4E, Having Top, Bottom, And/or Side Signal And/or Power Connection Locations

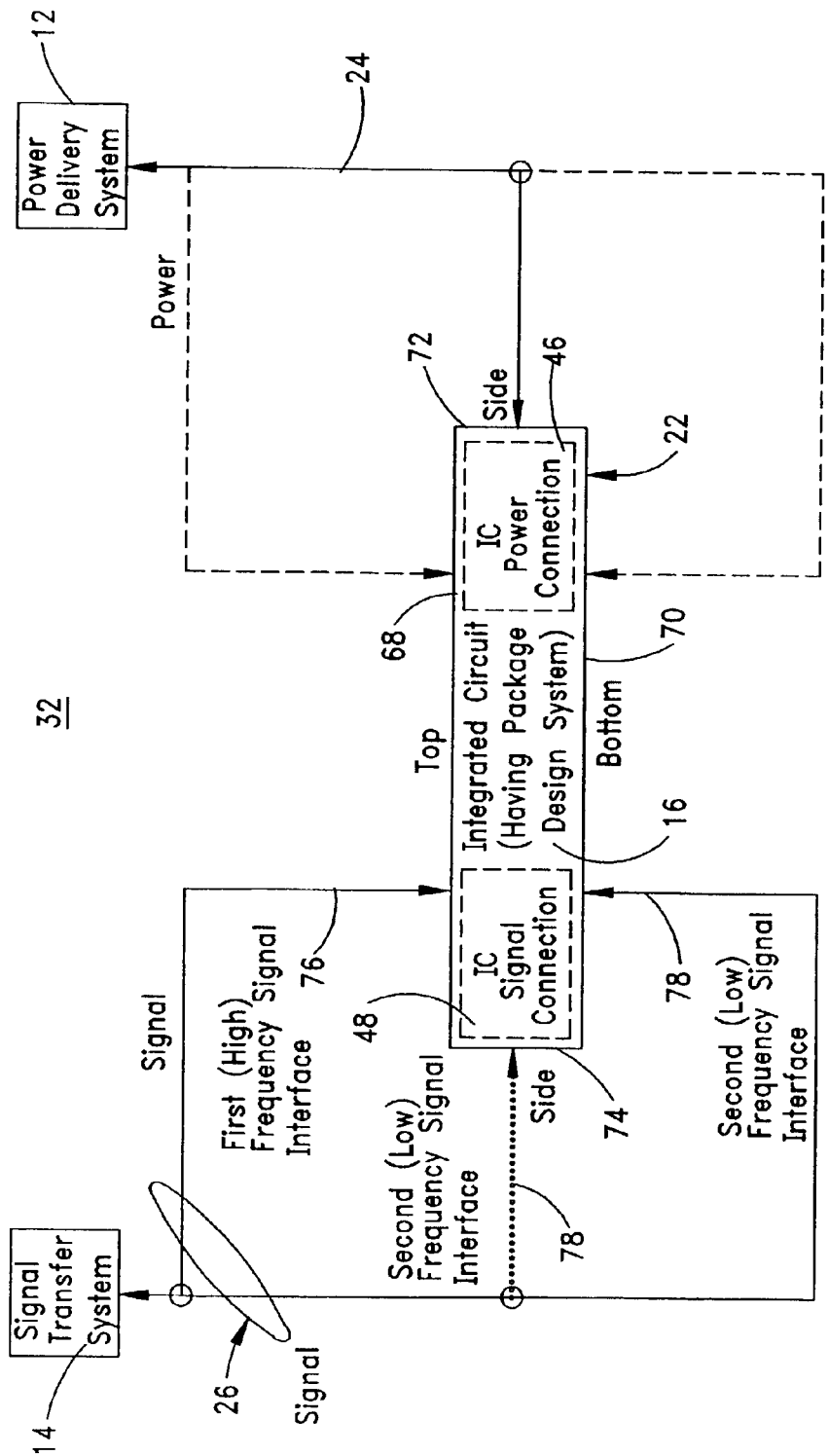
FIG. 6A Integrated Circuit, As Shown in FIG. 5, Having A First (High) Frequency Signal Interface And A Second (Low) Frequency Signal Interface, Different From The First Frequency Signal Interface, Each Coupled To Different Sides Of The Integrated Circuit

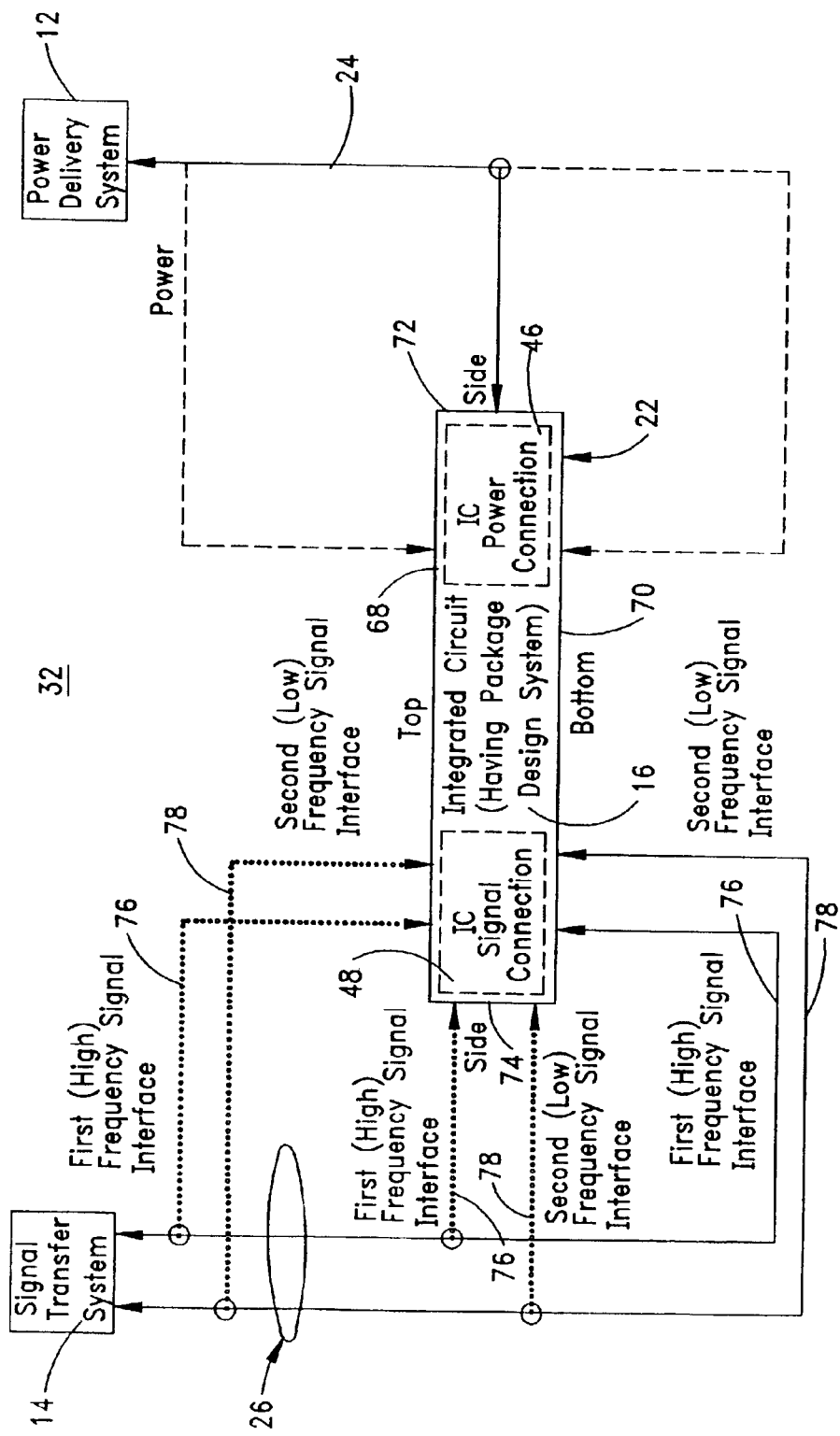

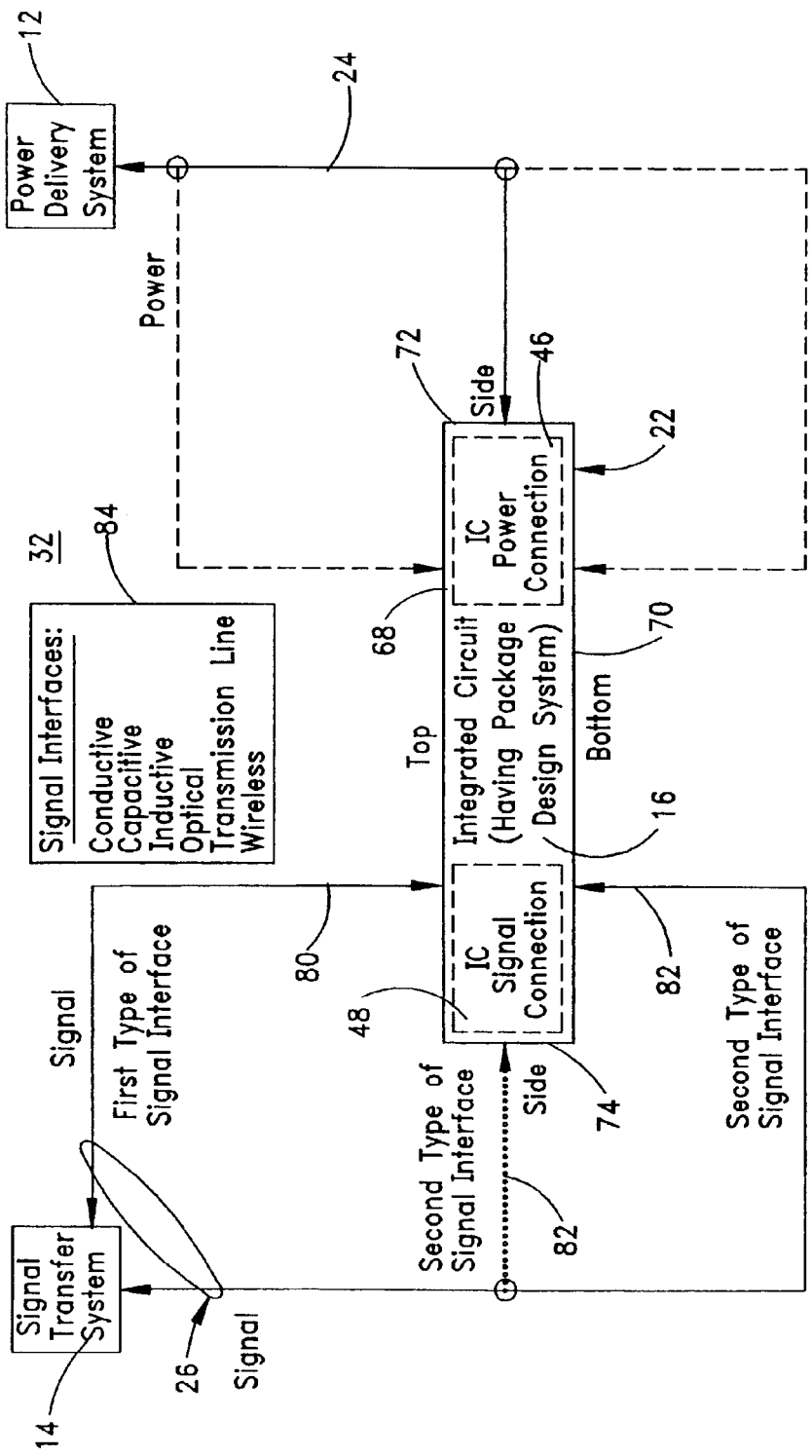

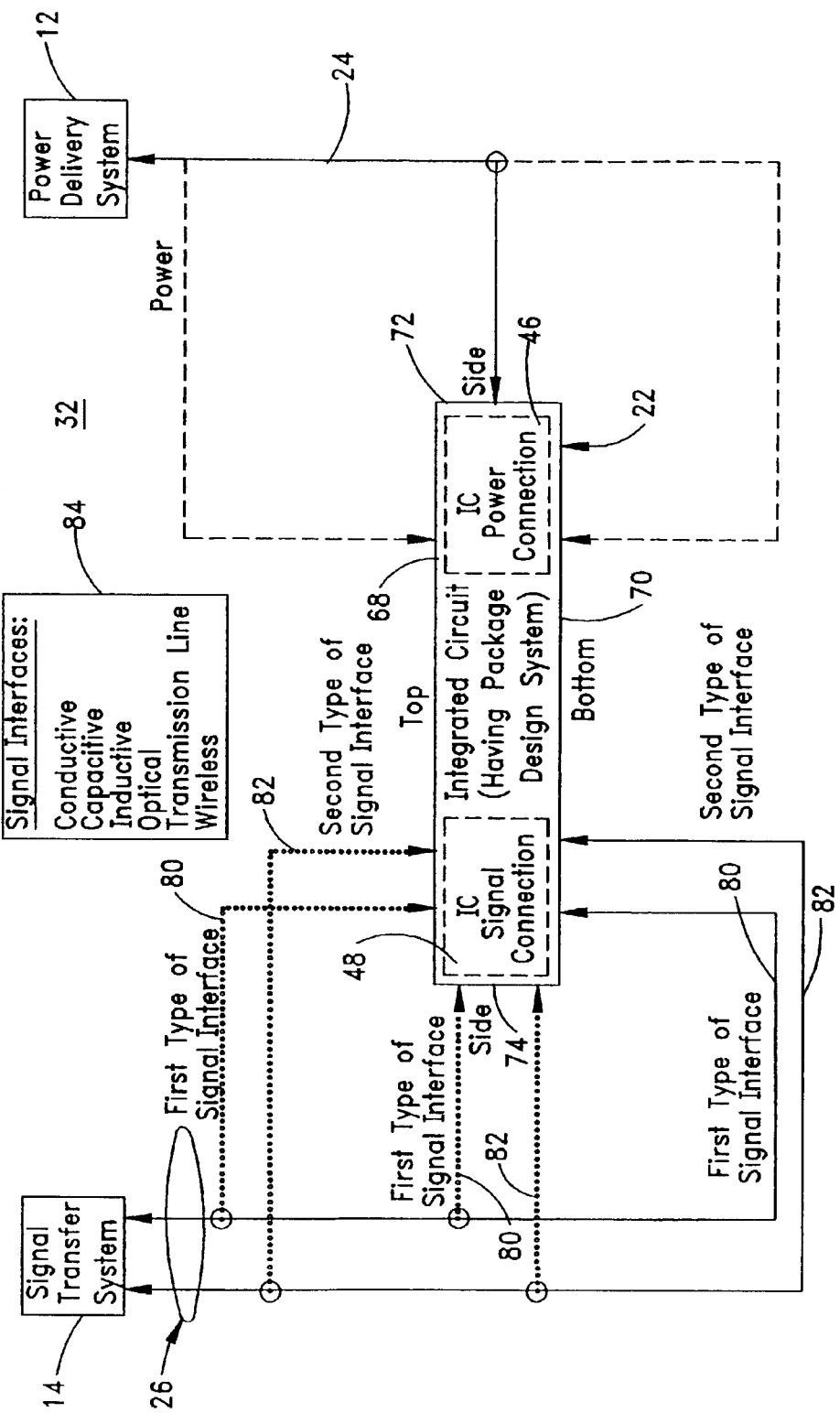
FIG. 7B Integrated Circuit, As Shown in FIG.5, Having A First Type Of Signal Interface And A Second Type Of Signal Interface, Different From the First Type Of Signal Interface, Each Coupled To Different Sides Of The Integrated Circuit

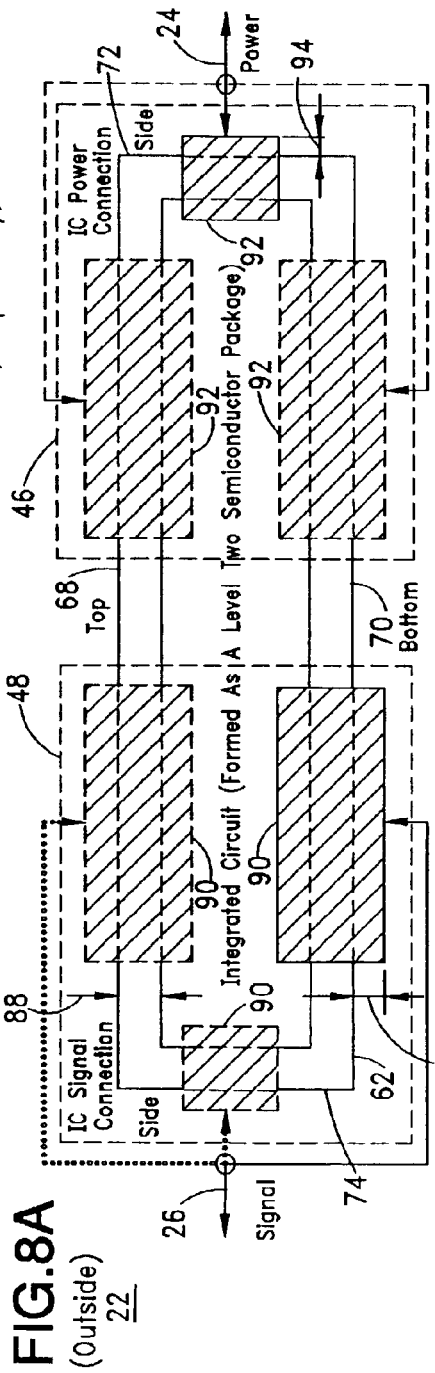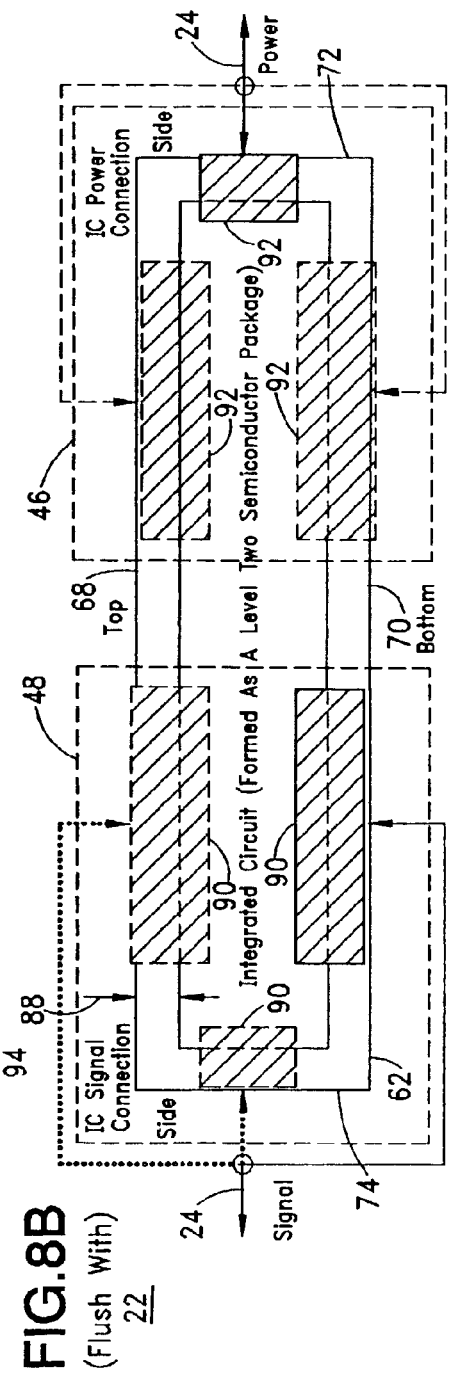
FIGS. 8A and 8B Integrated Circuit, As Shown in FIGS. 4C and 5, Having Signal And/Or Power Connections Located Outside and Flush With, Respectively, the Semiconductor Package
FIG. 8A (Outside)
FIG. 8B (Flush With)

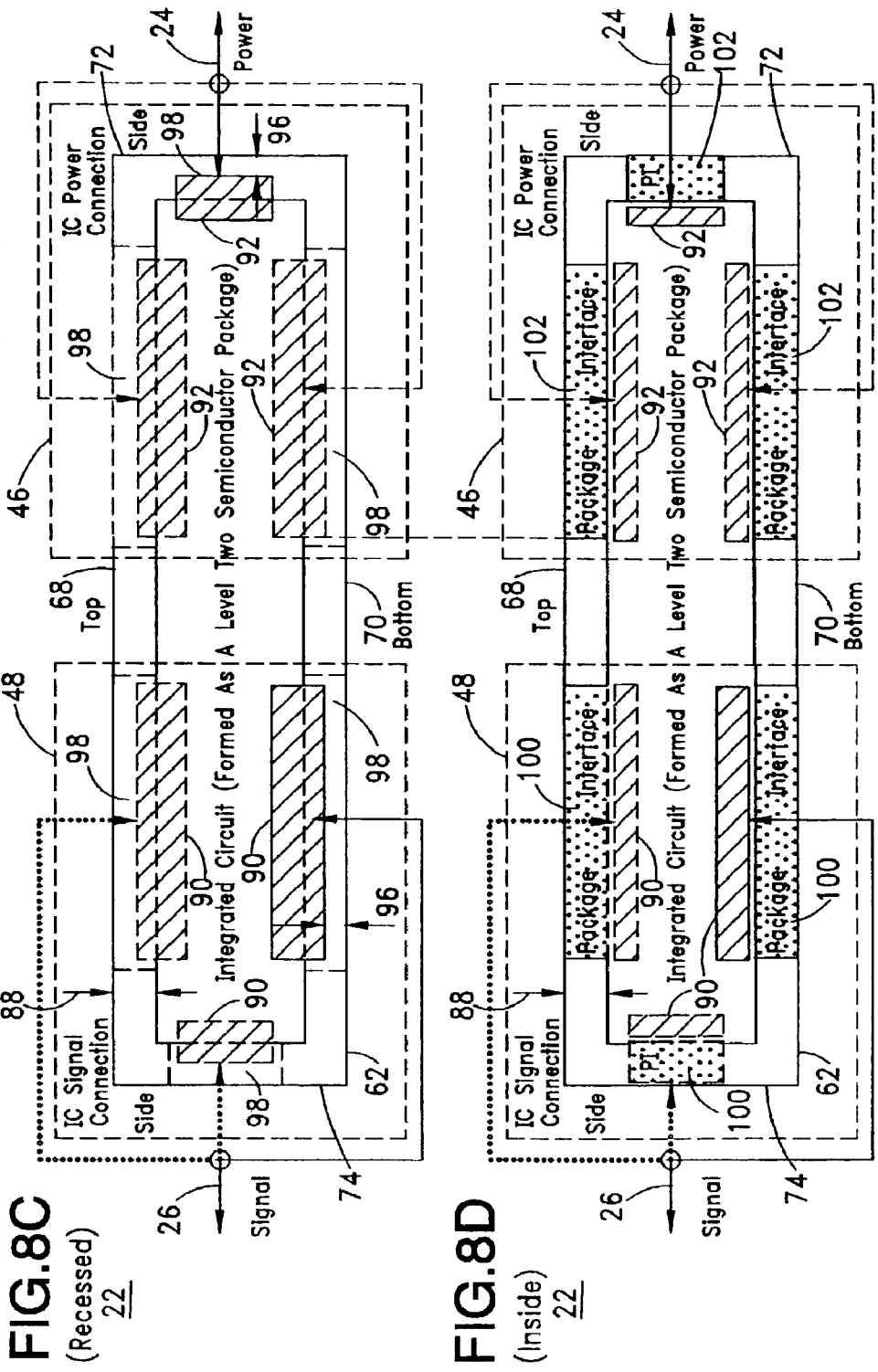

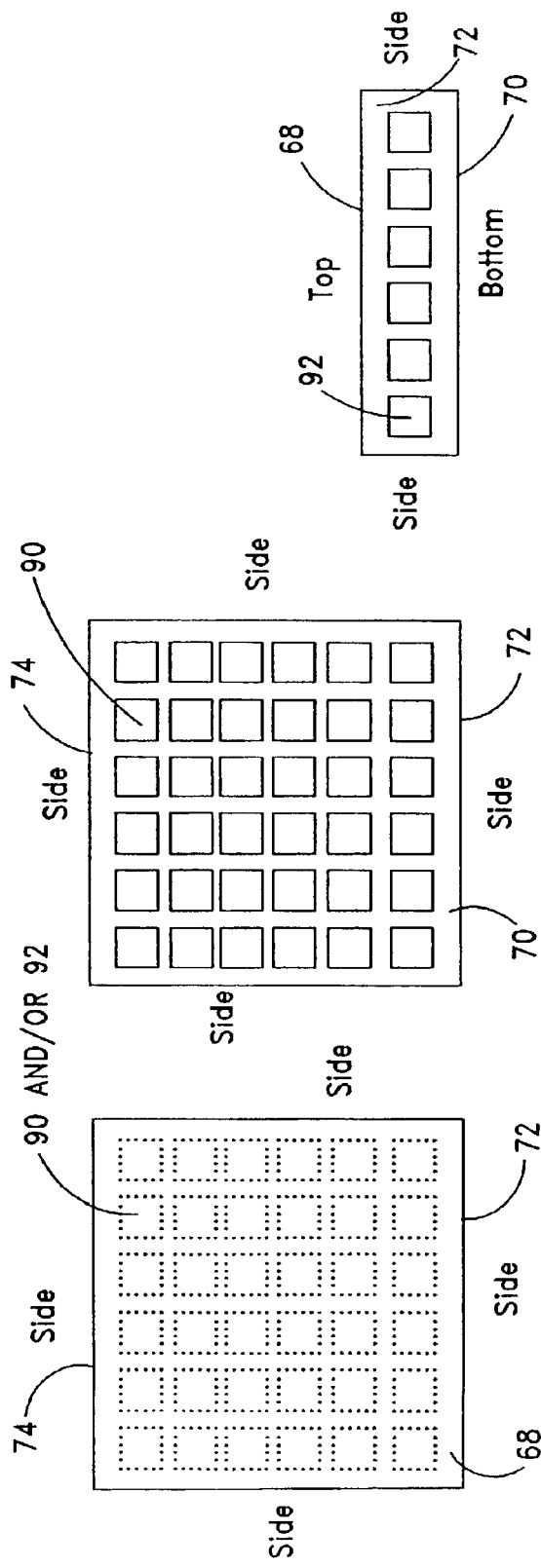
FIGS.9A,9B,9C Integrated Circuit, As Shown in FIGS.4A,4B,4C,4D or 4E and Fig.5, Having Signal And/or Power Connections Located on the Top, Side And/or Bottom of the Integrated Circuit

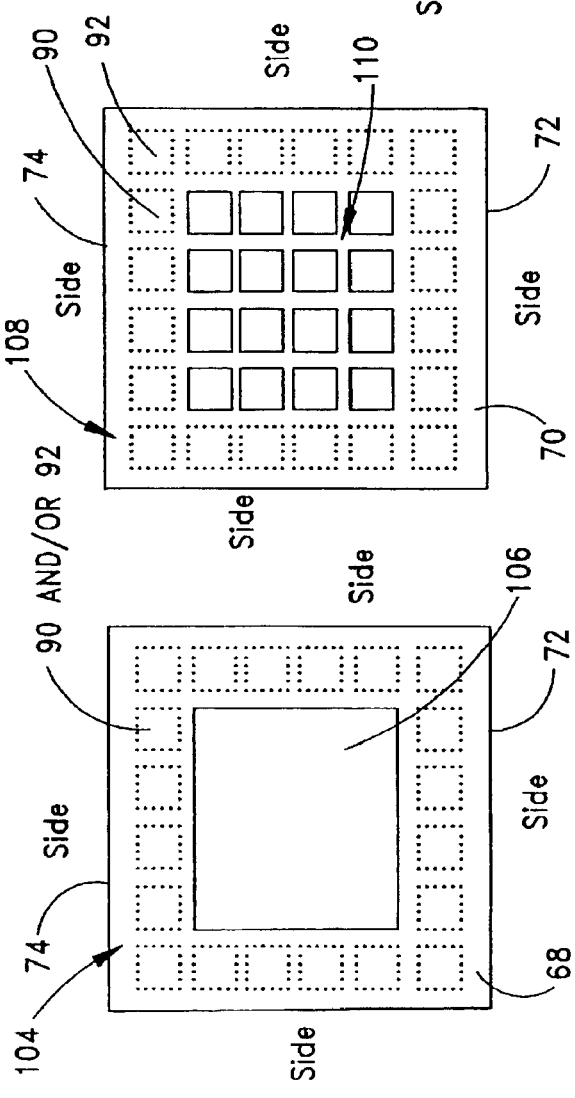

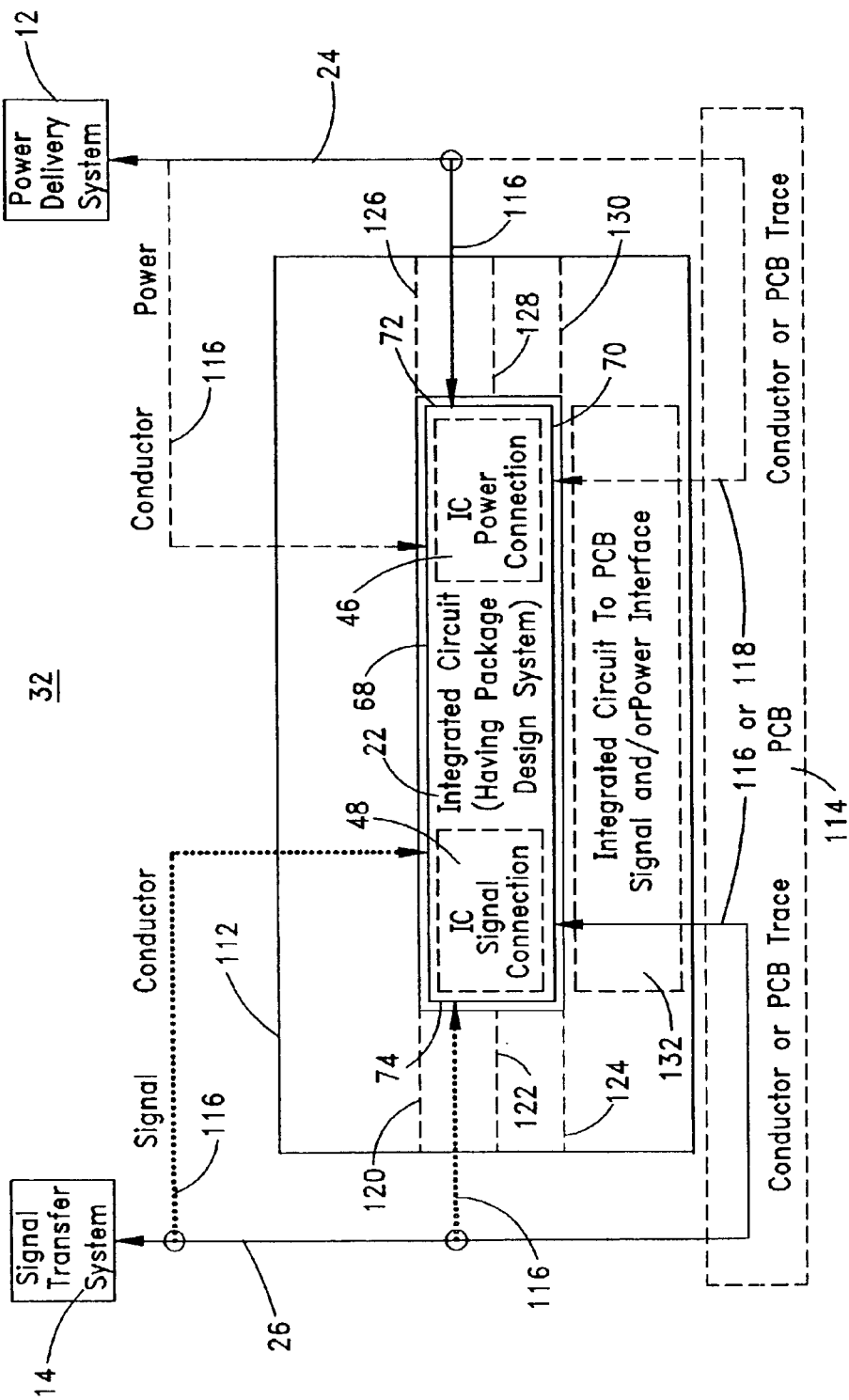

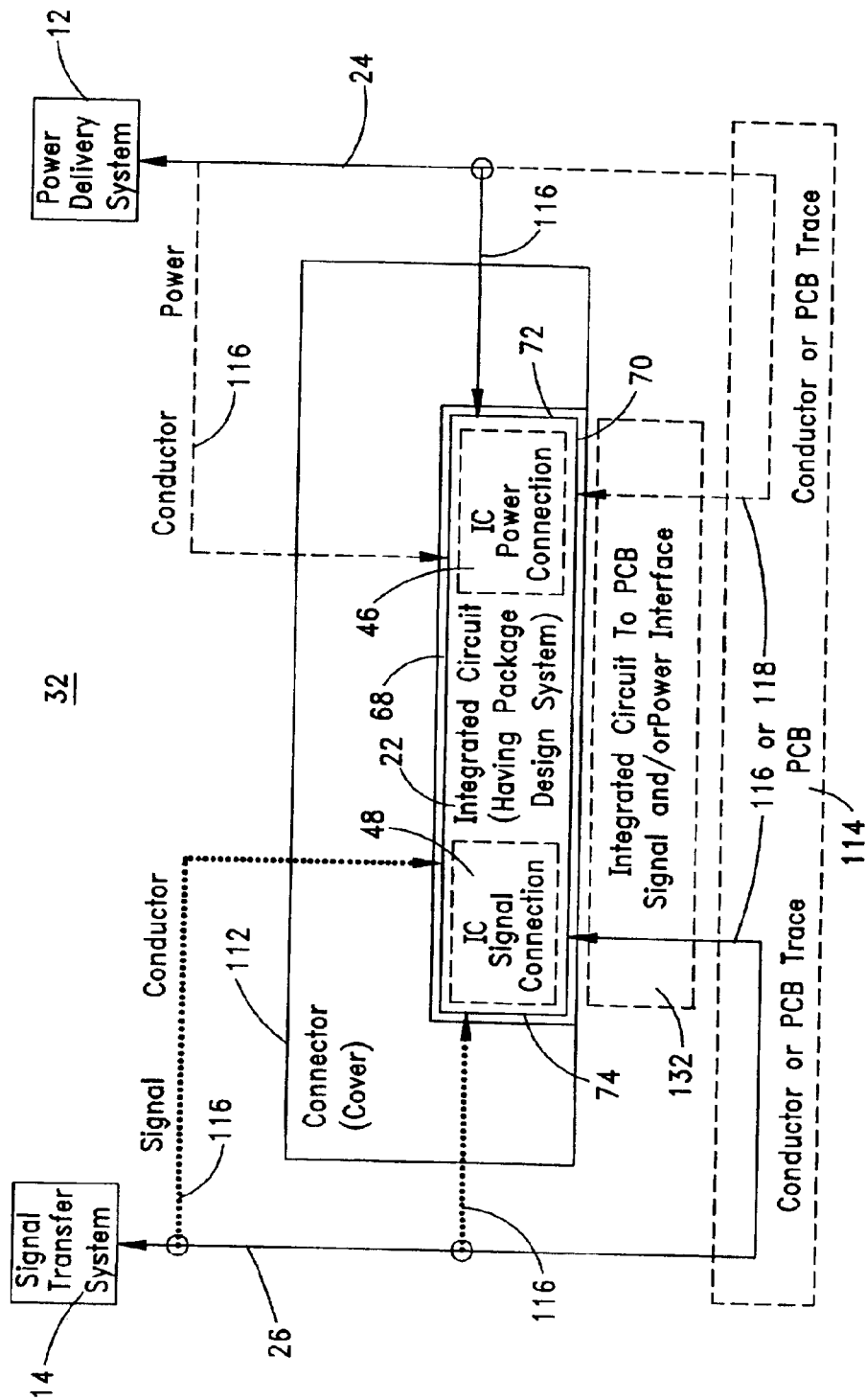

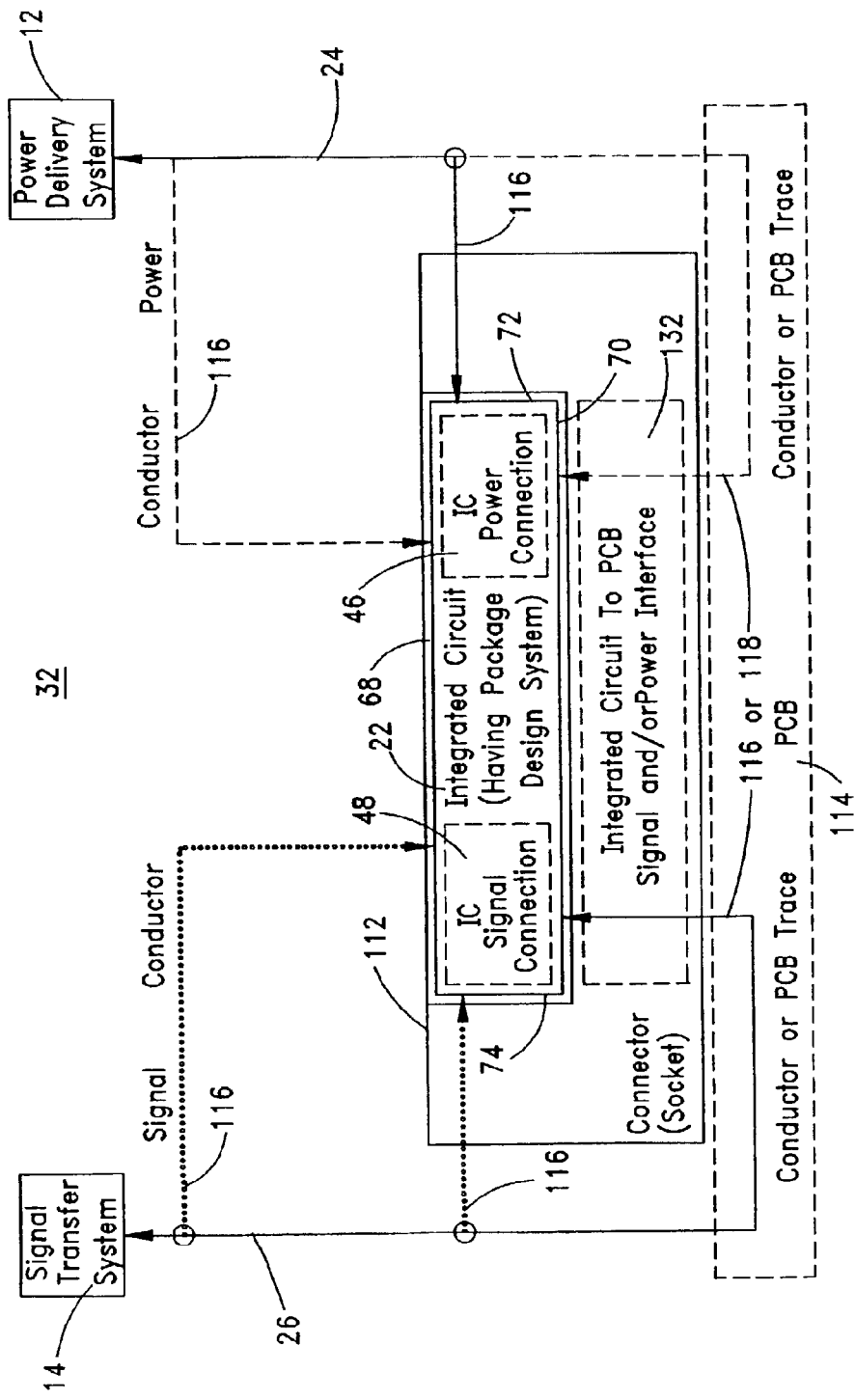
FIG. 12B  Integrated Circuit, As Shown In FIG.11, Located In a Connector Formed As A Socket

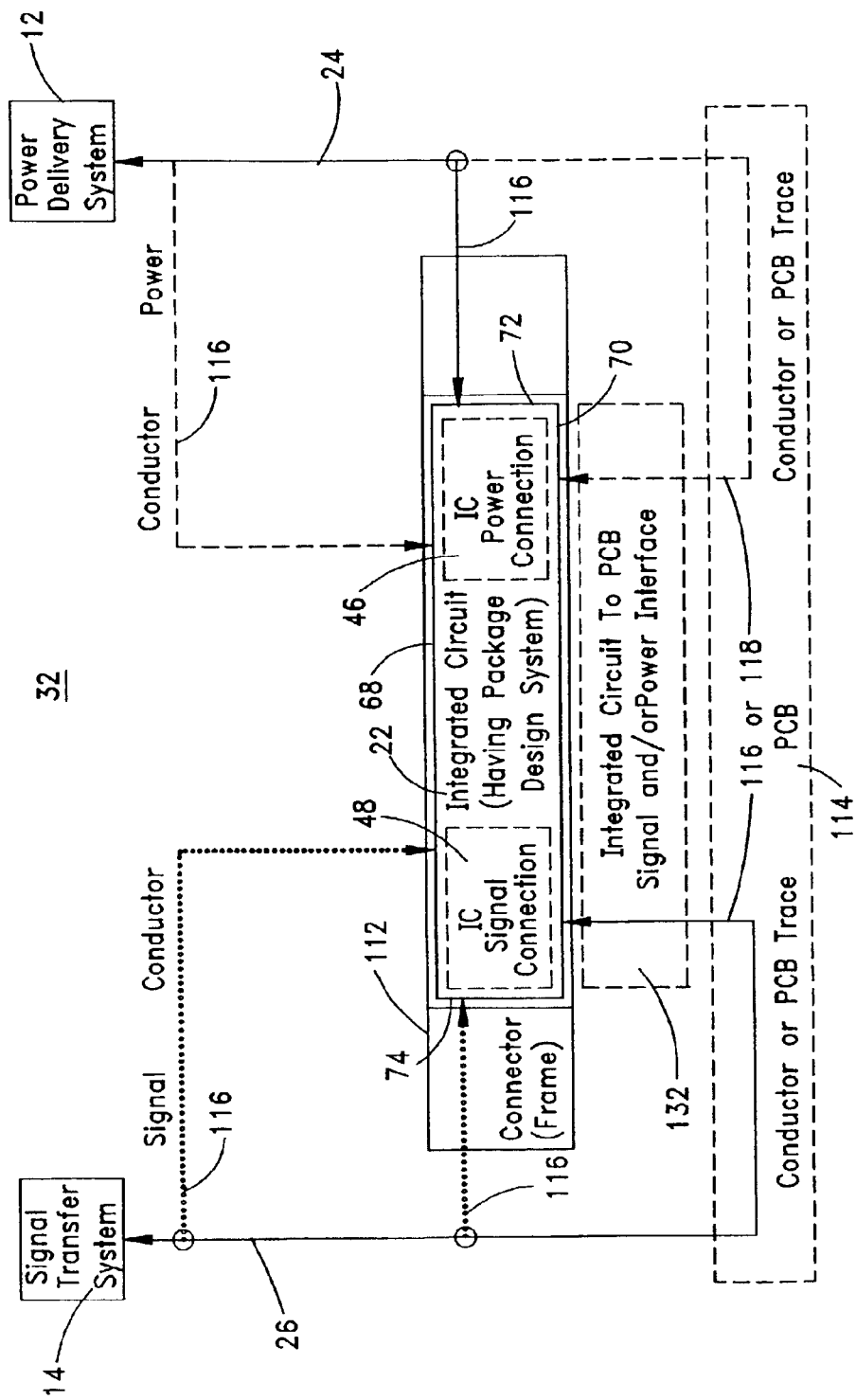
FIG. 12C  Integrated Circuit, As Shown In FIG. 11, Located In a Connector Formed As A Frame

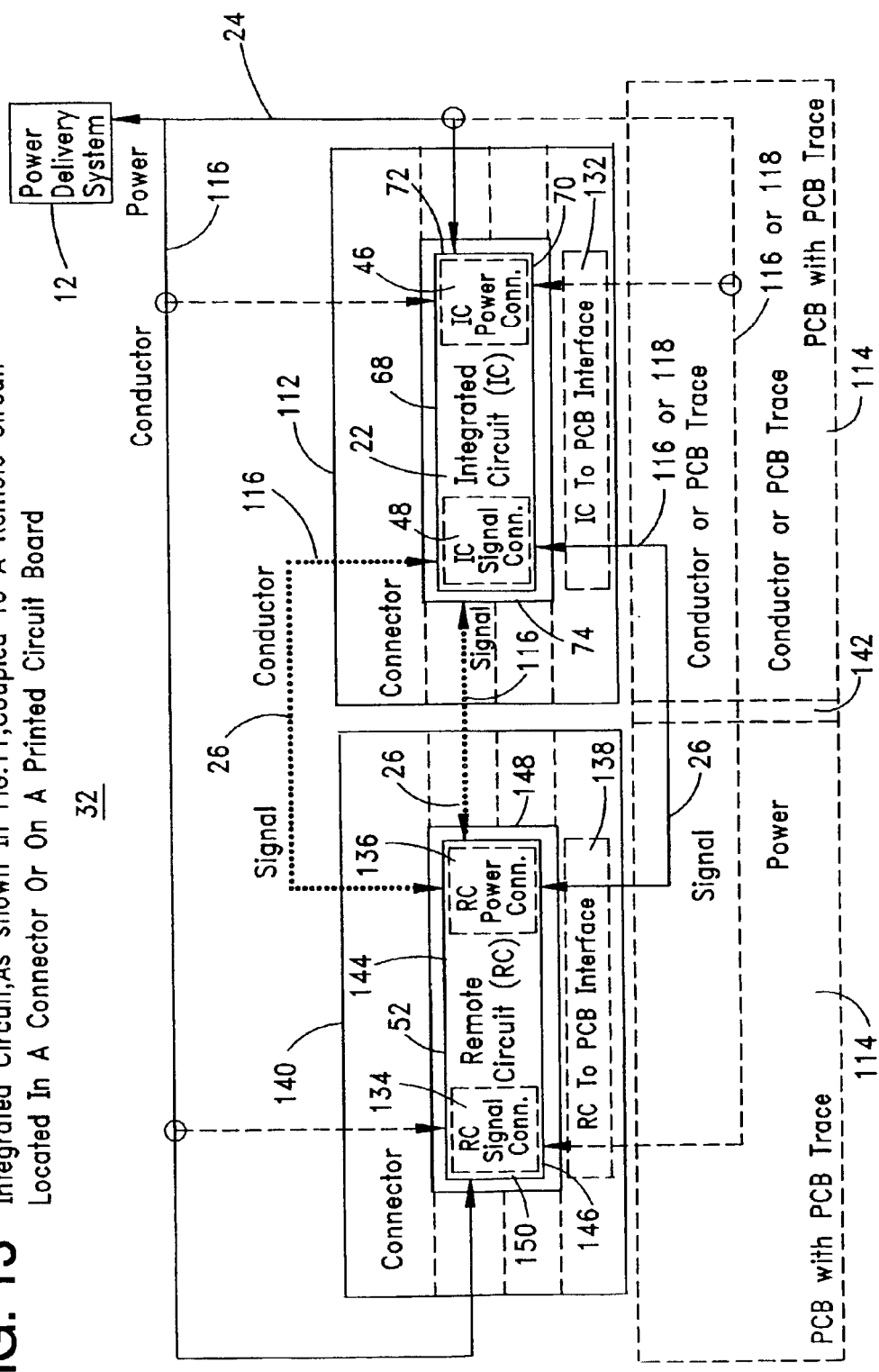
FIG. 13   Integrated Circuit, As shown In FIG.11, Coupled To A Remote Circuit Located In A Connector Or On A Printed Circuit Board

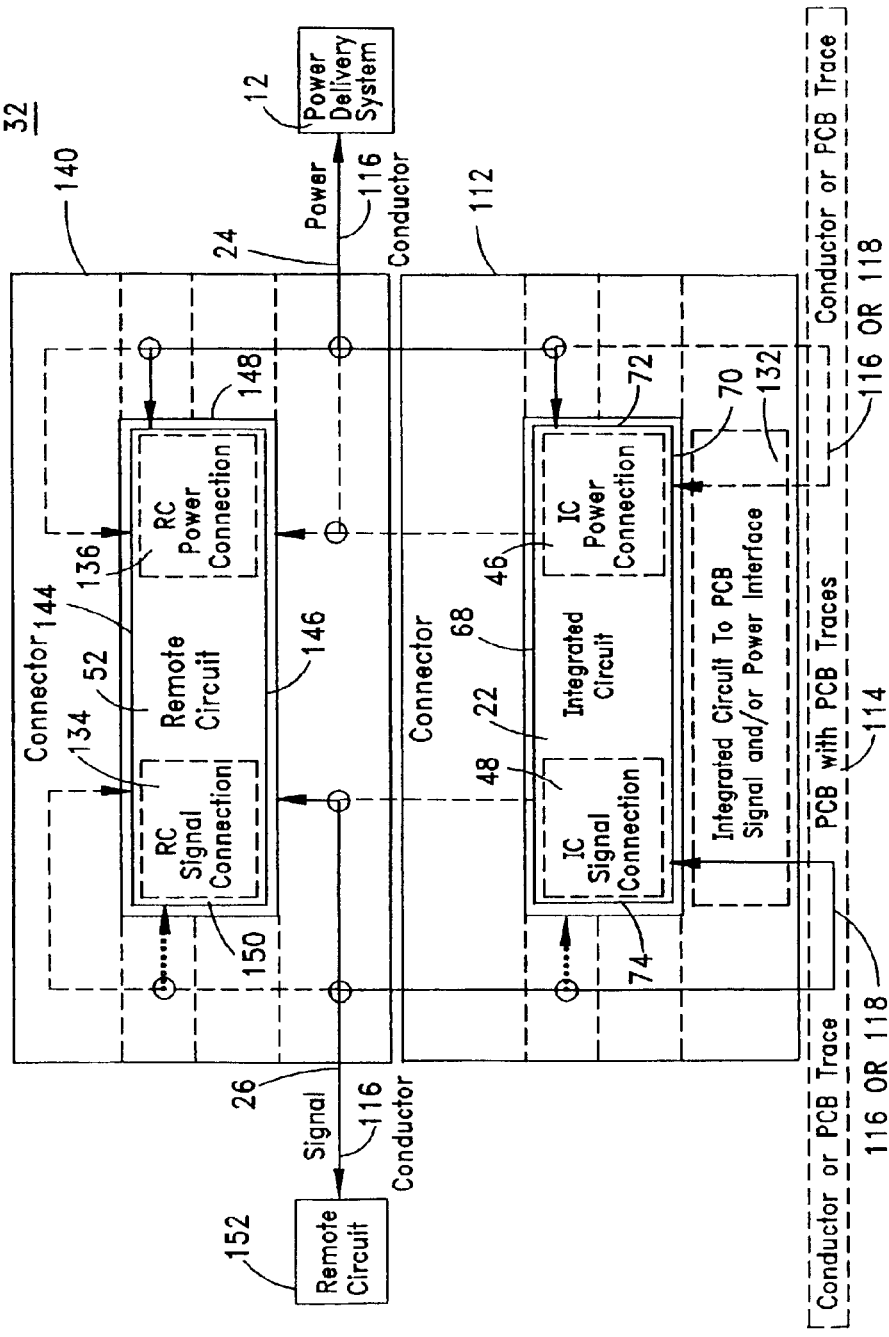

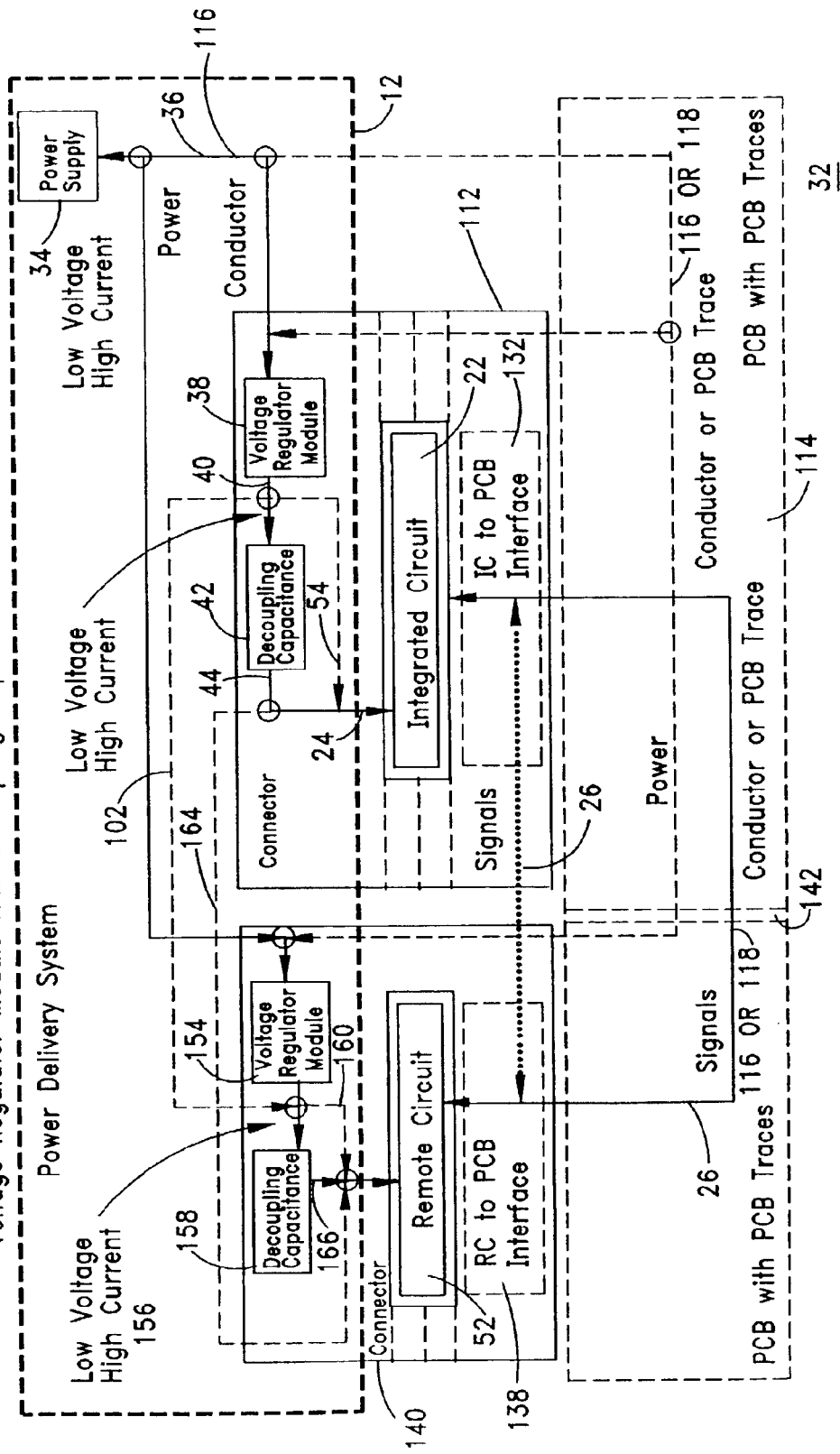
FIG. 15 Integrated Circuit And Remote Circuit, As Shown In FIGS. 13 or 14, Each Having A Voltage Regulator Module And Decoupling Capacitance Located In A Connector

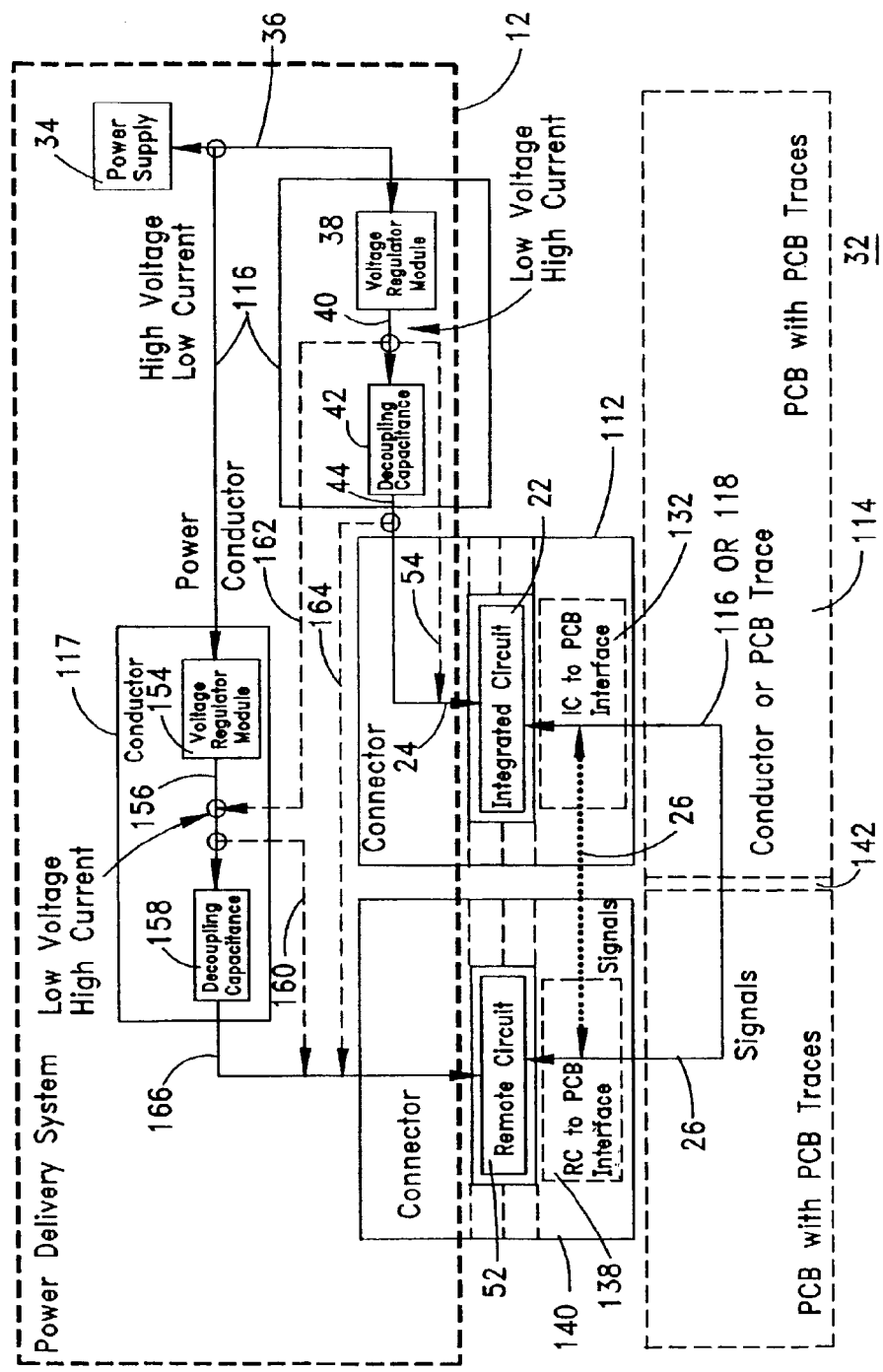
FIG. 16 Integrated Circuit And Remote Circuit, As Shown In FIGS. 13 or 14, Each Having A Voltage Regulator Module And Decoupling Capacitance Located In A Conductor

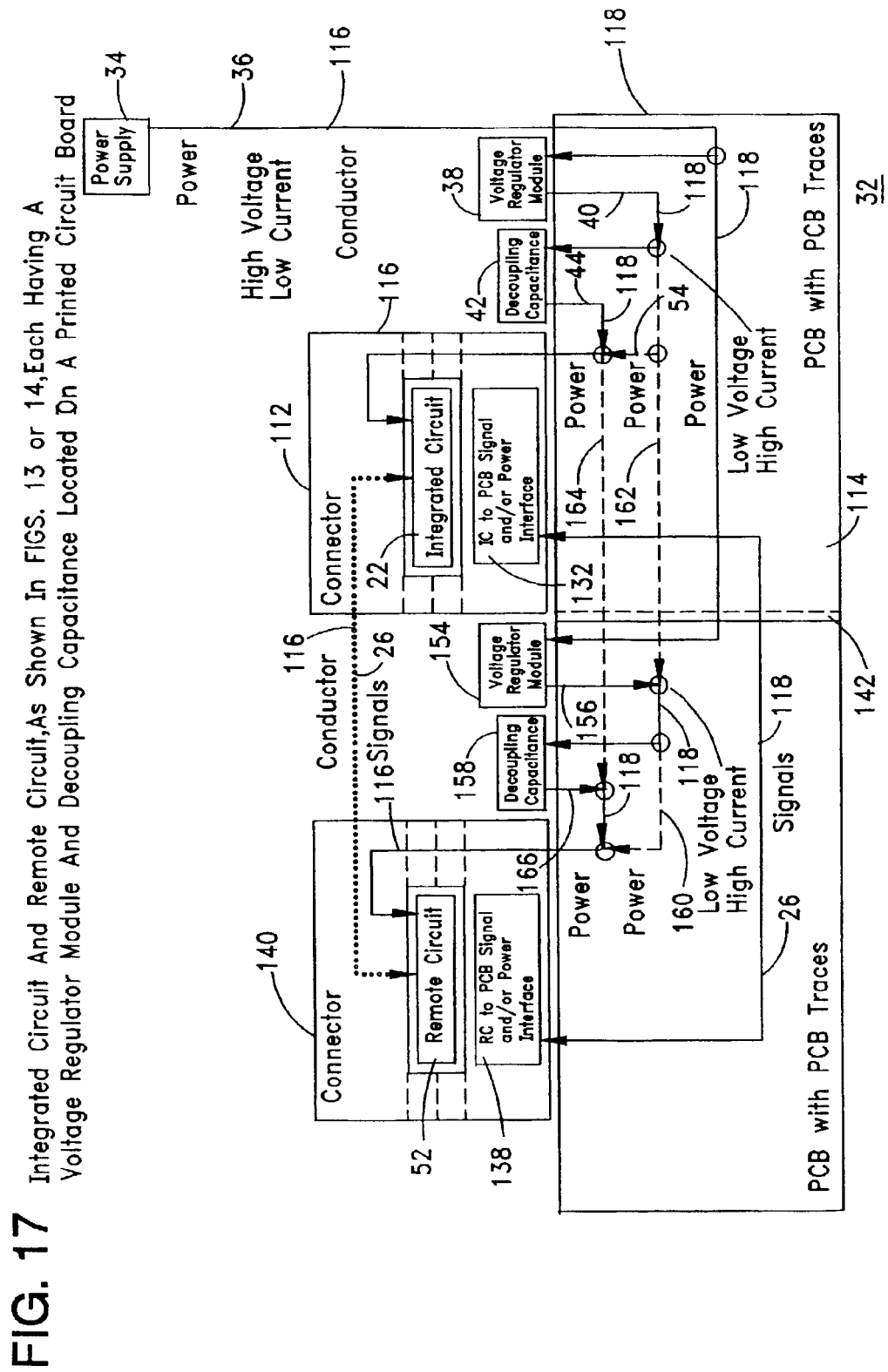
FIG. 17  Integrated Circuit And Remote Circuit, As Shown In FIGS. 13 or 14, Each Having A Voltage Regulator Module And Decoupling Capacitance Located On A Printed Circuit Board

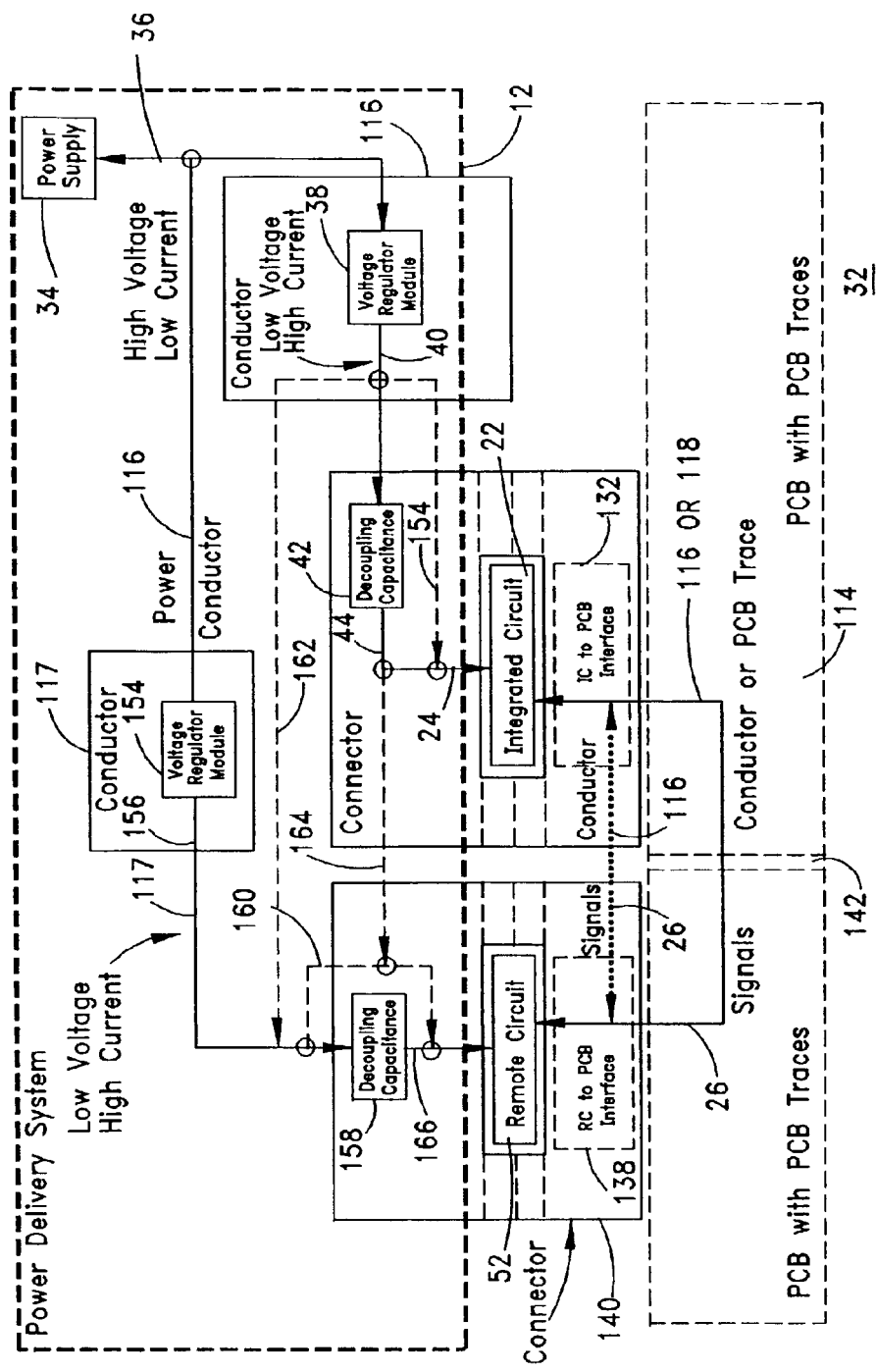
FIG. 18 Integrated Circuit And Remote Circuit, As Shown In FIGS. 13 or 14, Each Having A Voltage Regulator Module Located On A Conductor And Having Decoupling Capacitance Located In A Connector

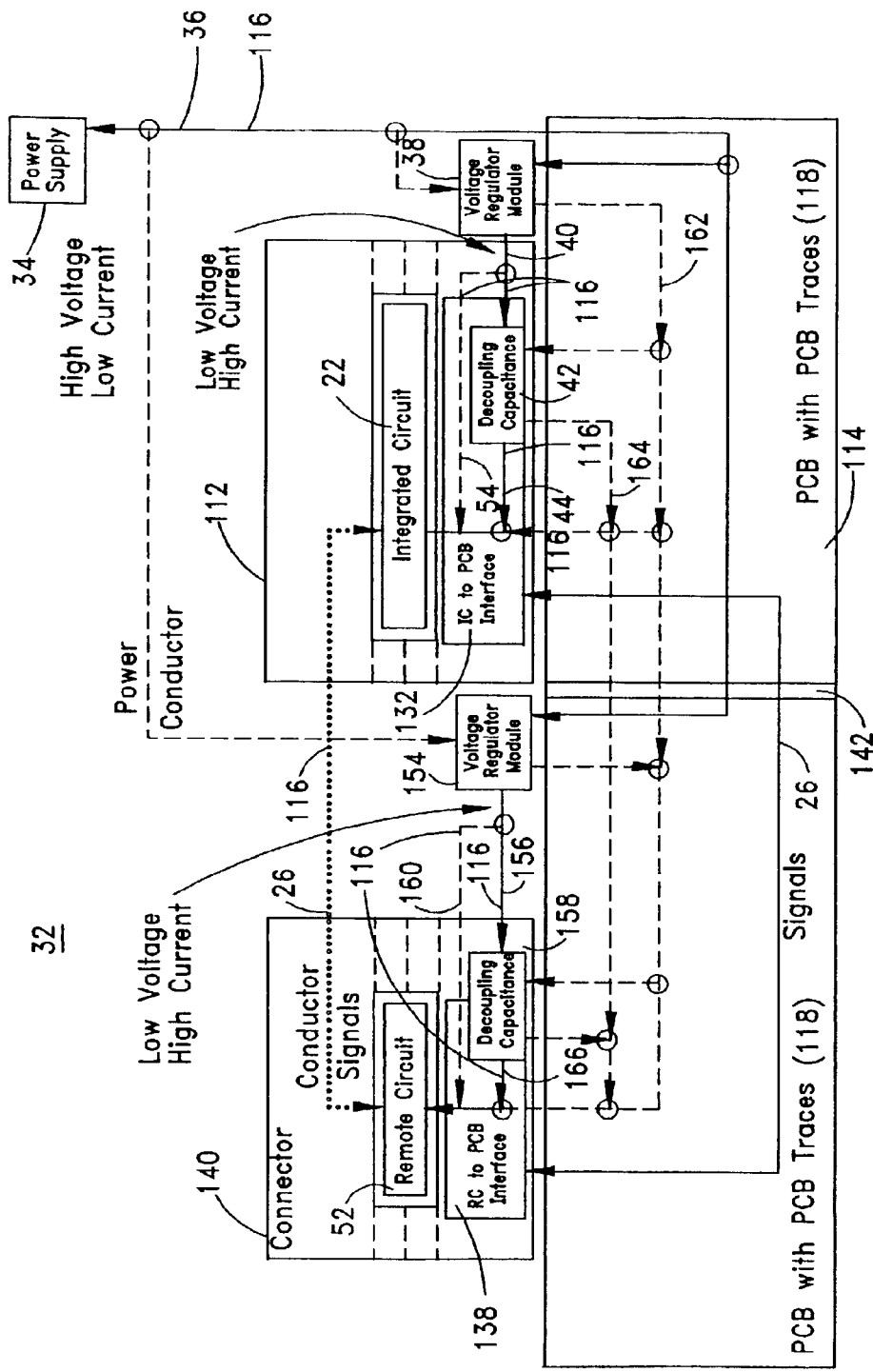
FIG. 19 Integrated Circuit And Remote Circuit, As Shown In FIGS. 13 or 14, Each Having A Voltage Regulator Module Located on A Printed Circuit Board And Having Decoupling Capacitance Located In A Connector

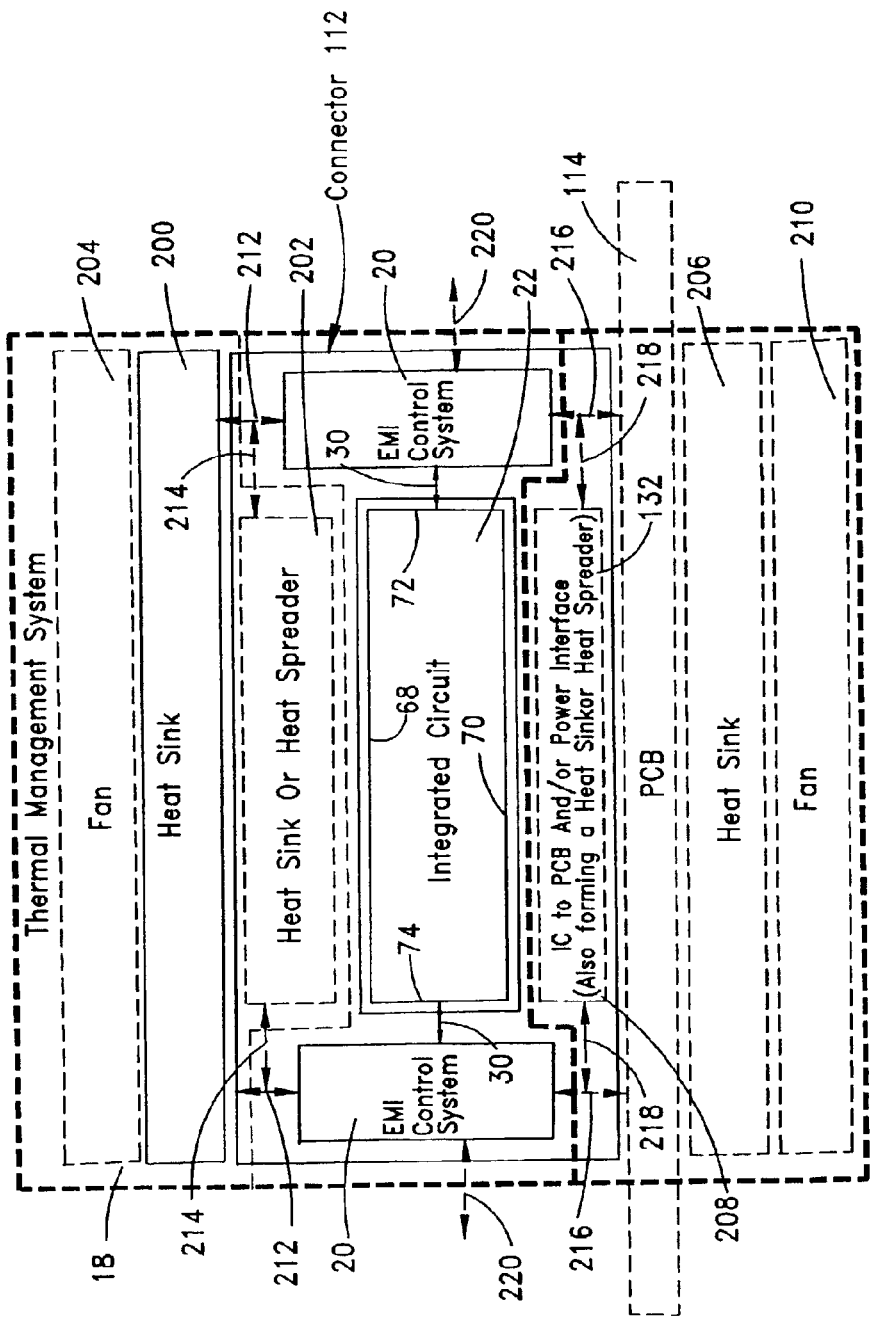
FIG. 20 Integrated Circuit, As Shown In FIG. 11, And Having A Thermal Management System And An Electromagnetic Interference (EMI) Control System

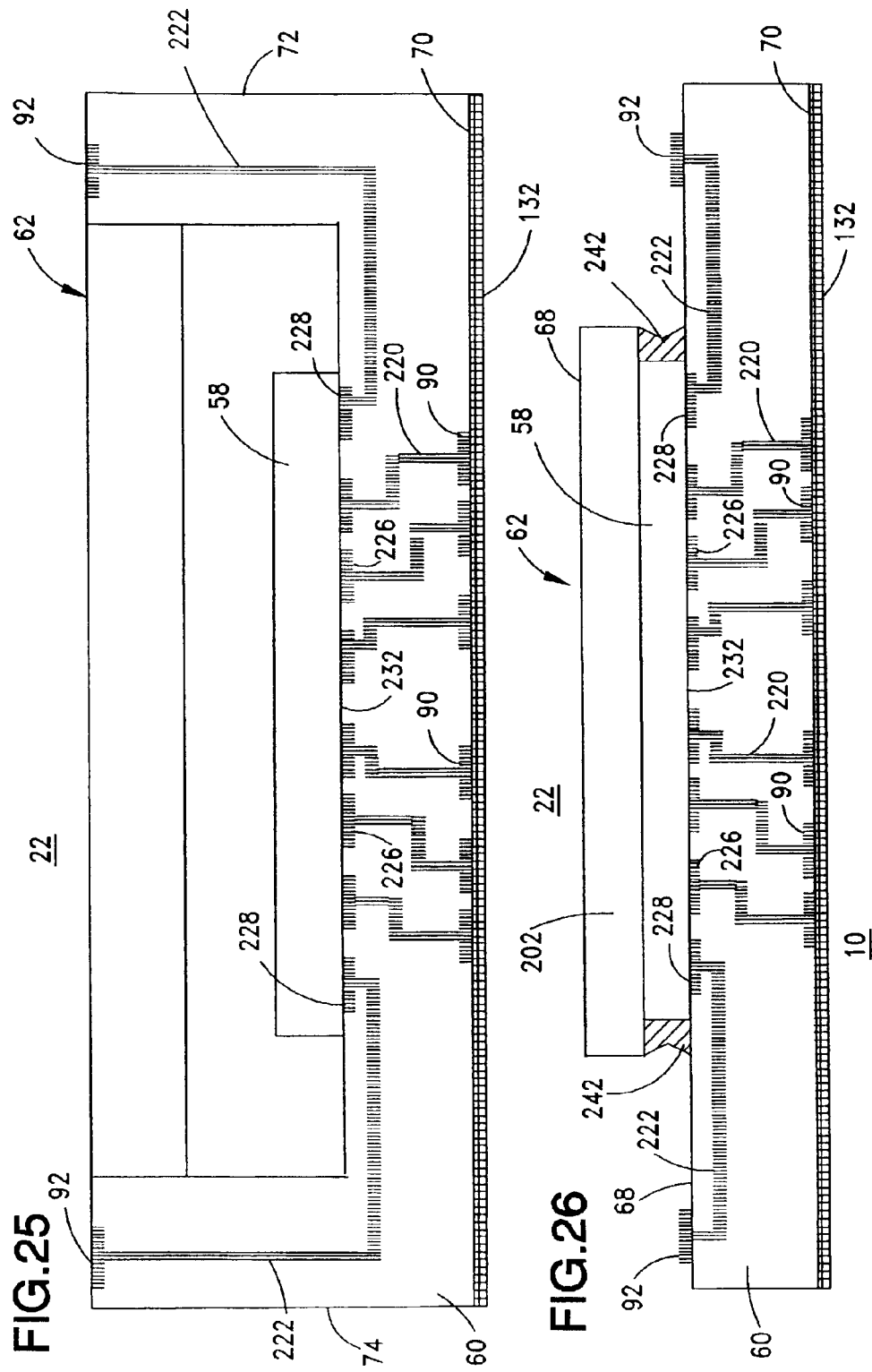

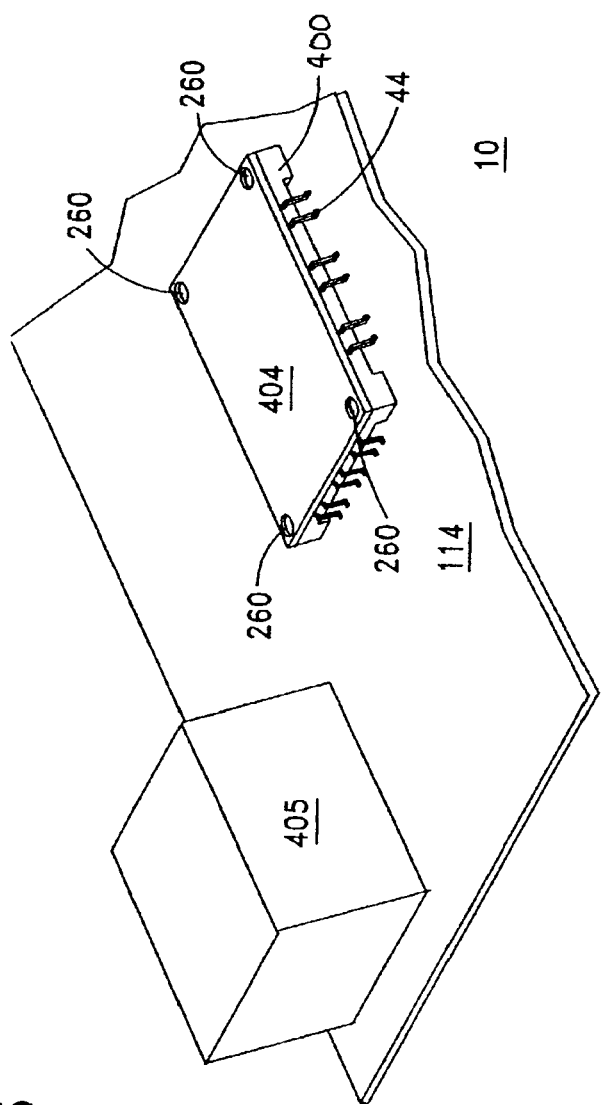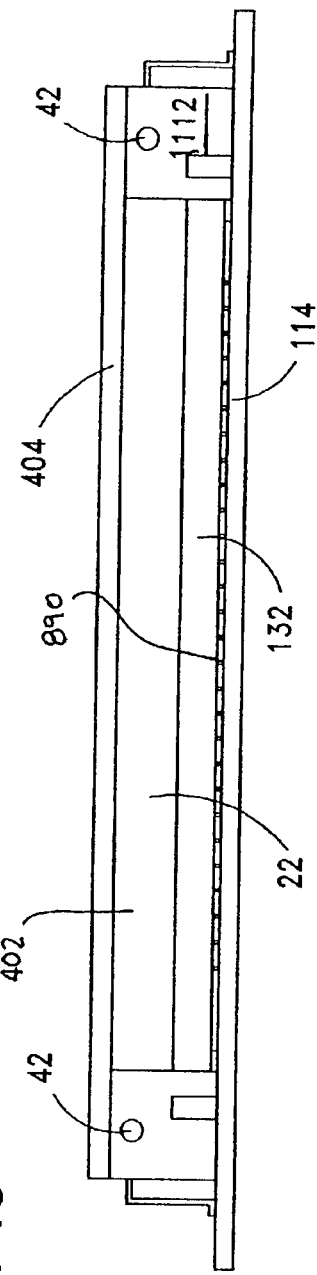
FIG. 45
FIG. 46

POWER DELIVERY AND OTHER SYSTEMS FOR INTEGRATED CIRCUITS

REFERENCE TO RELATED APPLICATIONS

This application claims priority from U.S. provisional patent application, Ser. No. 60/325,107, filed Sep. 26, 2001.

BACKGROUND OF THE INVENTION

The present invention generally relates to systems for integrated circuits. More particularly, the present invention relates to a power delivery system, a signal transfer system, a package design system, a thermal management system, and an electromagnetic interference (EMI) emission control system for an integrated circuit to support advancements in semiconductor technology.

I. Semiconductor Technology

Consumers demand innovative electronic products that have more functionality, better performance, smaller size, less weight, better reliability, lower cost and faster time-to-market. Semiconductor technology is the core building block for the innovative electronic products desired by consumers. Over the years, advancements in semiconductor technology have led to dramatic increases in the functionality and performance of integrated circuit (IC) devices while minimizing the size, weight, defects and cost of the IC devices.

Historically, the number of transistors that the electronic industry can place on a semiconductor chip doubles about every eighteen months. This rapid development cycle permits fast delivery of the new innovative products to the market. For example, semiconductor manufacturers took nearly thirty years to perfect microprocessor clock rates to run at 1 GHz, yet manufacturers recently reached the 2 GHz microprocessor clock rate less than eighteen months after reaching 1 GHz. Manufacturers anticipate that there are no fundamental barriers to extending the rapid advancement of semiconductor technology for another decade by building the even faster silicon transistors. These transistors are anticipated to be around 20 nanometers (nm) in size and should permit the manufacturers to build microprocessors containing a billion transistors which run at speeds approaching 20 GHz and operate at less than one volt within the next few years. These new transistors, which act like switches controlling the flow of electrons inside a microprocessor, will turn on and off more than a trillion times per second. Such advancements in semiconductor technology will result in microprocessors that have faster clock rates, higher power, lower supply voltages, higher DC currents, higher transient currents, narrower voltage margins, higher non-uniform heat densities, and higher frequency electromagnetic interference emissions. Ancillary benefits to these advancements include microprocessors that have increased interconnect densities, reduced circuit board real estate and package volume, and improved product manufacturing and reliability.

Specifications for near future microprocessors require 1.0V operating voltage, 100A current, 300A/$\mu$sec transient currents, efficiency greater than 90%, regulation within 5%, and voltage ripple less than 1%. These requirements present a significant advancement over present microprocessor designs. Microprocessors having these characteristics and requirements and future microprocessors having even more demanding characteristics and requirements will need new support systems, such as power delivery, signal transfer, packaging, thermal management, and electromagnetic interference (EMI) emission control.

II. Power Delivery

Power delivery concerns supplying power to devices that need it. Traditionally, an ideal power supply is assumed and little consideration is given to power delivery until the end of the design. Printed circuit board (PCB) designers attempt to create the ideal power delivery supply with conventional power and ground planes in the PCB and with wide, heavy traces on the PCB to distribute the power among the devices on the PCB. High frequency ceramic capacitors control high frequency noise, created by switching the transistors on and off, by shorting the high frequency noise to ground. Lower frequency bulk capacitors (such as tantalum capacitors) subsequently recharged the high frequency ceramic capacitors. Various rules of thumb exist for determining the amount of each type of capacitance that is required for various ICs.

To electrically model this power delivery system, considerations include the inductance and resistance of cables, connectors, PCB, pins, contacts and components, such as resistors and capacitors, of the receiving device(s) and power source(s). In the past, voltage drops due to inductance (V=L di/dt) and resistance (V=IR) have been nearly negligible relative to the tolerance of devices in most systems. Similarly, simple rules of thumb determine the method for decoupling the high frequency noise.

Each generation of semiconductor technology has reduced power supply voltage to support the requirements of deep sub-micron semiconductor technologies and to improve reliability. Lower power supply voltages should lower the power consumption. However, even at lower power supply voltages the power consumption of microprocessors is increasing because of more transistors, increased density of transistors on the die, thinner insulators that increase capacitance, and higher operating frequencies. Power consumption in microprocessors continues to rise as much as three times every two years while microprocessor power supply voltages approach 1.0 V. Power consumption (P) is related to the operating frequency (f), the power supply voltage (V), and the chip capacitance (C) of the microprocessor by the formula ($P=CfV^2$). By one example, a microprocessor with a typical chip capacitance of 20 nanofarads, a power supply voltage of 1.65 volts, and an operating frequency of 1 GHz, will consume 55 watts of power (0.020×1.65×1.65×1,000). By another example, a microprocessor with a typical chip capacitance of 40 nanofarads, a power supply voltage of 1 volt, and an operating frequency of 3 GHz, will consume 120 watts (0.040×1.0×1.0×3,000).

Power consumption (P) is also related to the power supply voltage (V) and the current (I) by the formula (P=VI). This formula shows that high power consumption (P) at low power supply voltages (V) requires that high currents (I) (I=P/V) be delivered to the microprocessor. Continuing with the two examples above, the microprocessor consuming 55 watts of power and having a power supply voltage of 1.65 volts requires a supply current of 33 amps (55/1.65), and the microprocessor consuming a 120 watts of power and having a power supply voltage of 1.0 volts requires a supply current of 120 amps (120/1), representing an increase of about 3.6 times over the 33 amp microprocessor.

At these voltage and current levels, it is more difficult for a central power supply to deliver high current and low voltage power throughout a computer system because of impedance levels that cause unacceptable voltage drops along the power distribution paths. Computer systems presently use distributed power systems to route power throughout the computer system at high voltage and low current and then convert to low voltage and high current as needed by the microprocessor. Voltage regulators or modular DC/DC converters, which provide the needed low voltage, high current power, are located as close as possible on the motherboard to the microprocessor to minimize the impedances and the resulting voltage drops. The location of the power distribution path on the mother board takes up valuable space that could be used for other components.

Even with distributed power delivery systems, every part of the distribution path must still have a low impedance to minimize the resulting voltage drops. Typically, the voltage variance at the voltage regulator is less than (e.g., about one-half) of the voltage variance at the microprocessor. Traditionally, connectors with a high pin count and heavy copper power/ground planes are used to minimize the impedance. However, these solutions also consume extra printed circuit board space and add cost.

In one power distribution approach, the microprocessor and the voltage regulator each form modules and rely upon corresponding sockets to connect each module to the motherboard. The microprocessor may be mounted to an interposer board, and the motherboard has one socket that receives the voltage regulator and another socket that receives the interposer board. The microprocessor and voltage regulator are modular for fast and easy exchange for efficient-manufacturing and service. Current flows from the voltage regulator to the microprocessor over a path from the voltage regulator, through its socket, the motherboard, the interposer socket and board, the microprocessor package, and ends at the die. This relatively long path of current flow introduces impedance and voltage drops, which are not desirable for advanced microprocessor designs.

An alternative power system approach bypasses the motherboard and the microprocessor socket. In this approach, the interposer board carries the microprocessor die and the voltage regulator. Current flows from the voltage regulator to the microprocessor over a path starting from the voltage regulator, through the voltage regulator socket, the interposer board, the microprocessor package, and ending with the die. Since this approach bypasses the motherboard and the interposer socket, the path of current flow is shorter. Therefore, this approach improves the impedance and the resulting voltage drop of the relatively shorter path.

Someday it may be possible to integrate the voltage regulator into the microprocessor package, making the path of current flow very short, reducing the impedance and resulting voltage drop. However, semiconductor technology has not advanced far enough to provide this level of an integrated system.

Microprocessor response time or transient current requirement (di/dt), i.e., the rate at which the current demand changes is another power-related concern. Varying computing demands of the microprocessor requires varying current demands from the power supply. The computing demands vary because of high clock speed circuits and power conservation design techniques, such as clock gating and sleep modes. These techniques result in fast, unpredictable and large magnitude changes in supply current ultimately requiring hundreds of amps within a few nanoseconds. The resulting current surge demanded by the microprocessor from the voltage regulator can cause unacceptable voltage spikes on the power delivery voltage according to the formula (dV=IR+Ldi/dt).

Attempts have been made to manage surge currents by placing decoupling capacitors throughout the power delivery system such as on the voltage regulation module, the motherboard, the interposer PCB, the die package, and on the die itself. Decoupling capacitors are typically located on the circuit board outside the microprocessor package, typically using several discrete decoupling capacitors mounted next to the microprocessor package on the circuit board. In this approach, conductive traces on the circuit board connect the decoupling capacitors to power and ground pins on the microprocessor. In another approach, a discrete decoupling capacitor is formed as part of the IC.

These decoupling capacitors are commonly used to ensure that the power supply system can provide the microprocessor with a surge current when required. The decoupling capacitors connect power sources to the power leads of the microprocessor. The amount of decoupling capacitance needed depends on the power requirement of the microprocessor. The microprocessor is able to draw its required surge current from the power stored in the decoupling capacitors, and hence, the decoupling capacitors stabilize the power delivery system by storing power local to the microprocessor in order to meet the surge current needs of the microprocessor. However, use of discrete, broad-mounted decoupling capacitors not only increase the cost of the power delivery system, but also consume additional area on the IC or the circuit board, or elsewhere.

As the power requirement of microprocessor increases, the need for more decoupling capacitance increases, which in turn requires larger value or size decoupling capacitors and more space to accommodate them. Unfortunately, larger value or size decoupling capacitors consume more area on the circuit board.

As the switching speeds of the transistors increases, an undesirable amount of resistance due to inductance, associated with the interconnection between the semiconductor die and the decoupling capacitor, increases according to the formula ($X_L=2\partial fL$). The longer the conductive path interconnecting the decoupling capacitor and the semiconductor die inside the microprocessor, the higher the inductance. The higher the frequency of operation of the microprocessor, the higher the resistance of the system due to the inductance, and higher resistance causes a higher voltage drop. Therefore, it is desirable to locate the decoupling capacitors as close to the semiconductor die as possible, such as by putting the decoupling capacitor inside the microprocessor package, as described above, in order to minimize the conductive path to minimize the inductance.

Further, capacitors exhibit inductance and resistance characteristics as well as capacitance characteristics and can be electrically modeled as a series RLC circuit. At higher frequencies, such as above 100 MHz, the inductance characteristic limits the effectiveness of conventional discrete decoupling capacitors. If large surge currents are required by the microprocessor, this residual inductance can cause unacceptable voltage drops and AC noise.

Historically, power has been brought to the IC through pins in the IC socket. As the power requirements of an IC increase, it will require additional pins to accommodate the power, and these additional pins increase the size of the IC package and therefore take up valuable space on the circuit board. The increase in the pin numbers also increases the amount of force required for inserting the IC into and removing it from its socket of the circuit board. The power pins are run through the same surface of the IC, typically the bottom surface, and with high densities, the power and signal pins should be isolated from each other to prevent crosstalk and noise.

Hence, there is a need for a power delivery system that delivers low voltage, narrow voltage margin, high current, and high transient current to a high performance integrated circuit, such as a microprocessor, that minimizes cost and space while improving reliability.

III. Signal Transfer

Signal integrity is a complex field of study involving digital and analog design, circuit, and transmission line theory and involves phenomenon such as cross talk, ground bounce, and power supply noise. Although signal integrity has always been important, in the past the switching speed of microprocessor transistors was so slow that digital signals actually resembled high pulses, representing ones, and low pulses, representing zeros. Electrical modeling of signal propagation was often not necessary. Unfortunately, at today's microprocessor speeds of 1 GHz and above even the simple, passive elements of a high-speed design, such as wires, PC boards, connectors, and microprocessor packages, can significantly affect the wave shape and voltage level of the signal. Further, these passive elements can cause glitches, resets, logic errors, and other problems.

Typically, a microprocessor makes contact with the motherboard using galvanic (i.e., metal-to-metal) connections such as a land grid array (LGA), ball grid array (BGA), pin grid array (PGA) and solder, to transfer signals between the microprocessor and the motherboard. As the switching speeds of the transistors increases, an undesirable amount of resistance due to inductance, associated with the conductive interconnection between the semiconductor die located inside the microprocessor and the motherboard, increases according to the formula ($X_L=2\partial fL$). The longer the conductive p microprocessor to the motherboard, the higher the inductance. A higher frequency of operation of the microprocessor causes a higher resistance due to the inductance on the signal path, and this resistance causes a higher voltage drop of the signal level. Therefore, it is desirable to minimize the inductance of the signal path as the frequency of operation of the microprocessor increases. Other disadvantages of signaling via conductive contacts are disclosed in U.S. Pat. No. 5,629,838, issued May 13, 1997. An engineering tradeoff exists between increasing the desired operating frequency of the microprocessor and the signal integrity of the system.

Hence, there is a need for a system that permits the operating frequency of the microprocessor to increase without degrading the integrity of the signal. Such a system would maximize the performance and minimize the cost of interconnection technology used in high-speed digital signal designs.

IV. Integrated Circuit Package Design

Advances in semiconductor technology provide microprocessors that have higher performance and are smaller in size, which directly affects the design of the microprocessor package. Factors related to microprocessor package design include: current per contact and per socket, the number of ground and power pins, the number of signal contacts and signal contacts per square area, the contact pitch, the number of total contacts and total contacts per square area, the contact force along the Z-axis, the mated contact height, the signal bandwidth, the semiconductor die size, and other factors.

Increasing the number and power of transistors in the microprocessor typically increases current per contact and socket as well as increases the number of ground and power pins. Increasing the performance of the microprocessor will need an increase in the number of signal contacts and the semiconductor die size. Increasing both the power and performance of the microprocessor will increase the total contacts and will decrease the contact pitch. Increasing the number of total contacts while decreasing the contact pitch will increase the contact force required along the Z-axis which may require an increase in the mated contact height. Increasing the frequency of operation of the microprocessor will decrease the signal bandwidth. Hence, it should be understood that engineering tradeoffs exist among these factors in order to produce a microprocessor having an optimized package design.

V. Thermal Management

Advances in electronic packaging design provide devices with higher performance and smaller size, which lead to increased heat generation and heat density, which in turn may cause thermal management to be given higher priority in package design to maintain reliability of the device.

For microprocessors, higher performance, increased level of integration, and optimization of die size has led to higher non-uniform heat density in certain areas of the microprocessor die. Heat generation and heat density continue to increase with more advanced semiconductor technology. The reliability of a microprocessor is exponentially dependent on the operating temperature of the die junction, which depends on the power consumed by the transistor having the die junction.

Thermal management of the microprocessor is related to thermal management of the voltage regulator. Both the efficiency of the voltage regulator and the power consumed by the processor must be considered together. For example, a voltage regulator operating at 85 percent efficiency and which drives a microprocessor consuming 120 watts of power, dissipates about 18 watts of power. This power must be drawn away from the voltage regulator and microprocessor to cool the devices in order to maintain their reliability. Therefore, an engineering tradeoff exists between locating the voltage regulator near the microprocessor to minimize impedance and the resulting voltage drop, as described above, and locating the voltage regulator far from the microprocessor to minimize the heat generation and heat density.

Hence, there is a need for a thermal management solution that permits a high power microprocessor to be located near voltage regulator to minimize the impedance and resulting voltage drop while efficiently dissipating heat generation and heat density to maximize reliability.

VI. Electromagnetic Interference

Sources of electromagnetic interference (EMI) emission include the transistors within a microprocessor and signal paths on circuit boards and cables. The microprocessor is one of the largest sources of EMI in computer systems. Microprocessor clock signals have increased in frequency to 1 GHz and beyond today. At 1 GHz, these clock signals can generate harmonic frequency signals that reach 5 Ghz, and both of these signals generate EMI waves with wavelengths that are inversely proportional to the frequency of the signal (i.e., the higher the frequency, the shorter the wavelength).

Typically, a conductive shield or cover is used to control EMI. The shield is grounded to provide a dissipating path for the EMI to prevent it from interfering with other circuits. The shield usually contains holes for thermal management to create airflow to cool the device generating the EMI. However, large holes in the shield permit EMI to escape through the shield, and thus the shield holes must be sized so that the EMI does not escape, but airflow is not restricted to cool the device. High frequency signals require smaller holes in the shield for EMI containment, but the smaller holes restrict the airflow available for cooling. Hence, an engineering tradeoff exists in sizing the holes in the shield to for cooling and EMI containment purposes.

The shield may be located at the microprocessor or chassis level, or both. The microprocessor generates the high frequency harmonic signals that cause EMI, so that locating the shield close to the microprocessor may effectively contain the harmonic signals near the source of the EMI. Localized containment prevents the EMI from interfering with other circuitry in the computer system, but it also restricts the airflow needed to dissipate the microprocessor heat. Alternatively, the chassis of the computer system may be used as the shield which improves the airflow around the microprocessor but permits EMI to interfere with other circuits in the system. A chassis level solution requires small holes in the chassis for EMI blockage, but reduces airflow.

Grounding a heat sink that located near the microprocessor is another way to reduce EMI. However, EMI from the microprocessor that couples with the heat sink may cause the heat sink to act as an antenna and radiate the EMI. It is difficult to ground the heat sink through the microprocessor package, and although grounding the heat sink may reduce EMI, this solution alone may not be sufficient to pass required FCC emission tests. Additional shielding may be necessary to block the EMI. Therefore, there is a need for an EMI containment system that contains EMI from high frequency signals without compromising the thermal management of the system.

In summary, systems related to power delivery, signal transfer, package design, thermal management, and electromagnetic interference (EMI) emission control for an integrated circuit are needed to support future and current advancements in semiconductor technology.

SUMMARY OF THE INVENTION

Accordingly, it is a general object of the present invention to provide an improved power delivery system and apparatus that overcomes the aforementioned disadvantages in delivering power to an integrated circuit without occupying large amounts of space on the circuit board.

Another object of the present invention is to provide a system and apparatus for providing power to an integrated circuit by utilizing one or more capacitors that are supported by a cover or similar member that engages the integrated circuit.

A further object of the present invention is to provide a connector for an integrated circuit which incorporates a power transfer means into the body of the connector, and which is preferably capable of supplying power to the integrated circuit along the sides or top of the integrated circuit which results in a reduction of the number of conductive pins (leads) needed for the integrated circuit which, in turn, reduces the force required to insert and remove the integrated circuit from the connector, and frees up additional pins for use in signal transmission to and from the integrated circuit.

Yet another object of the present invention is to provide a power delivery member in the form of either a socket or a cover that includes a plurality of planar capacitors formed therein, the capacitors including at least two metal plates that are separated from each other by a dielectric material, preferably in the form of a film, the capacitors being further separated from each other with the power delivery member, whereby the capacitors supply a plurality of different voltages to distinct areas of the integrated circuit.

A further object of the present invention is to provide a power delivery member that integrates one or more capacitors therein and which includes a plurality of individual contact arms that extend therefrom to engage leads on an integrated circuit, the leads being disposed around the top, bottom or sides of the integrated circuit.

A further object of the present invention is to provide a processor package that takes up less space on a circuit board and which does not rely upon galvanic coupling to mate with leads on a circuit board, the package including a housing that receives the integrated circuit thereon, the housing having a dielectric plate forming a wall of the housing, the housing further having a plurality of contact pads formed on an inner surface thereof to which are terminated, leads of the integrated circuit, the dielectric plate separating the inner contact pads of the housing from contact pads disposed on an opposing surface of the circuit board, the inner contact pads of the housing being aligned with corresponding contact pads on the circuit board to provide capacitive coupling therebetween to effect signal transfer from the integrated circuit to the circuit board, the housing further having at least one capacitor supported thereby, the capacitor providing a supply of power to the integrated circuit.

Yet a still further object of the present invention is to provide a power transfer connector for use with integrated circuits, the connector taking the form of a cover member that is dimensioned to overlie an integrated circuit mounted on a circuit board, whether or not the integrated circuit is mounted within a mounting socket, the cover member including a plurality of conductive, spaced-apart capacitor plates disposed therein, the connector further having terminals extending from the capacitor plates for contacting conductive traces on the integrated circuit when the cover member is applied to an integrated circuit, the capacitor plates selectively storing power when a voltage is applied to them and selectively discharging power to the integrated circuit as needed, the capacitor plate terminals contacting the integrated circuit from either the sides or top of the integrated circuit, thereby eliminating the need for power contacts or terminals on the circuit board or in the mounting socket leading to a reduced terminal count therein and a reduction in the mounting force required for the integrated circuit.

Still another object of the present invention is to provide a system and apparatus that capacitively provides power to a microprocessor and which incorporates means for dissipating heat generated by the microprocessor during operation.

The present invention accomplishes these and other objects by means of its unique and novel structure.

The power delivery system of the present invention includes a power supply, a voltage regulator module, and decoupling capacitance in the form of discrete and/or integral capacitors. The voltage regulator module and the decoupling capacitance are each located in a connector that engages the IC. The connector may take the form of a cover, a socket, or a frame that engages the IC in a manner so that the system delivers power to one or more sides of the IC. The system may include a signal transfer system that couples signals from the IC to a remote circuit, located in the connector, on the circuit board on which the IC is located, via a conductor or a PCB trace.

The package design system of the present invention permits signals and/or power to be coupled to one or more surfaces on the IC utilizing connections that are outside, flush with, recessed or inside the semiconductor package. This package design system preferably permits the transferred signals to have different frequencies, such as high and low frequencies with different types of signal interfaces, such as conductive, capacitive, inductive, optical, transmission line and wireless.

The present invention also contemplates a thermal management aspect to its various systems in which a heat sink and a fan may be attached to the connector in a manner such that the heat sink makes contact with a heat generating surface of the IC so that it may dissipate both heat generated by the IC and the power delivery system, including the voltage regulator module used therein.

The present invention further may utilize an EMI control system, that is formed as part of the connector to shield EMI radiated by the IC. All of these systems advantageously permit increased interconnect densities, reduced circuit board real estate and IC package volume, and improved product manufacturing and reliability.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which:

FIG. 2 is a detailed block diagram of the systems of FIG. 1;

FIG. 3 is a table listing alternative locations for each of the system aspects of FIG. 2 and listing alternative connections between the system aspects;

FIGS. 4A, 4B, 4C, 4D and 4E are diagrammatic views of the integrated circuit of FIGS. 1, 2 and 3, illustrating increasing Levels 0, 1, 2, 3 and 4 of integration, respectively and the package design system aspects of the present invention;

FIG. 5 is a diagrammatic view of the integrated circuit of FIGS. 4A–4E illustrating the IC package design power and signal connections in accordance with the principles of the present invention;

FIG. 6A is the same view as FIG. 5, but illustrating high and low frequency signal interfaces coupled to different sides of the IC;

FIG. 6B is the same view as FIG. 5, but illustrating pairs of first (high) and second (low) frequency signal interfaces which are coupled to the same side of the integrated circuit;

FIG. 7A is the same view as FIG. 5, but illustrating different first and second signal type interfaces coupled to different sides of the integrated circuit;

FIG. 7B is the same view as FIG. 5, but illustrating different first and second type of signal interfaces interface coupled to the same side of the integrated circuit;

FIGS. 8A, 8B, 8C and 8D are diagrammatic cross-sectional views of the integrated circuit of FIGS. 4C and 5, illustrating the signal and/or power connections located outside, flush with, recessed or inside the semiconductor package;

FIGS. 9A, 9B and 9C are diagrammatic views of the integrated circuit, as shown in FIGS. 5 and 8A–8D, illustrating the locations of the signal and/or power contact on the respective top, bottom and/or sides of the integrated circuit;

FIGS. 10A, 10B and 10C illustrate a plan view of the integrated circuit, as shown in FIG. 8A, 8B, 8C or 8D, and FIG. 5, having signal contacts and/or power contacts located on the top, side and/or bottom of the integrated circuit representing the package design system in accordance with the preferred embodiments of the present invention.

FIG. 11 is a diagrammatic elevational view of the integrated circuit of FIG. 5 and located in a connector;

FIG. 12A is a diagrammatic elevational view of the integrated circuit of FIG. 11 located in a connector formed as a cover of the integrated circuit;

FIG. 12B is a diagrammatic elevational view of the integrated circuit of FIG. 11 located in a connector formed as a socket that receives the integrated circuit;

FIG. 12C is a diagrammatic elevational view of the integrated circuit of FIG. 11 located in a connector formed as a frame that receives the integrated circuit;

FIG. 13 is a diagrammatic elevational view of the integrated circuit of FIG. 11 coupled to a remote circuit located in a connector or on a circuit board;

FIG. 14 is a diagrammatic elevational view of the integrated circuit of FIG. 13 that is coupled together in a stacked arrangement;

FIG. 15 is a diagrammatic elevational view of the integrated circuit and remote circuit of FIG. 13 or 14, with each such circuit including a voltage regulator module and decoupling capacitance located in a connector;

FIG. 16 is a diagrammatic elevational view of the integrated circuit and remote circuit of FIG. 13 or 14, with each circuit including a voltage regulator module and a decoupling capacitance;

FIG. 17 is a diagrammatic elevational view of the integrated circuit and remote circuit of FIG. 13 or 14, with each circuit including a voltage regulator module and decoupling capacitance located on a circuit board;

FIG. 18 is a diagrammatic elevational view of the integrated circuit and remote circuit of FIG. 13 or 14, with each circuit including a voltage regulator module located on a conductor and a decoupling capacitance located in a connector;

FIG. 19 is a diagrammatic elevational view of the integrated circuit and remote circuit of FIG. 13 or 14, with each circuit including a voltage regulator module located on a circuit board and a decoupling capacitance located in a connector;

FIG. 20 is a diagrammatic elevational view of the integrated circuit of FIG. 11 combined with a thermal management and electromagnetic interference (EMI) control system;

FIG. 25 is a cross-sectional view of a of a Level Two semiconductor package of the present invention with a flipped semiconductor die, capacitive type of signal interface and power contacts on the top of the package;

FIG. 26 is a cross-sectional view of a Level One semiconductor package with a flipped semiconductor die, capacitive type of signal interface and power contacts on the top of the integrated circuit;

FIG. 45 is the same view as FIG. 44, but with the components assembled together on a circuit board;

FIG. 46 is a sectional view of the assembly of FIG. 45 taken along lines 46—46 thereof;

DETAILED DESCRIPTION OF THE PREFERRED EMBODIMENTS

Figure 1:
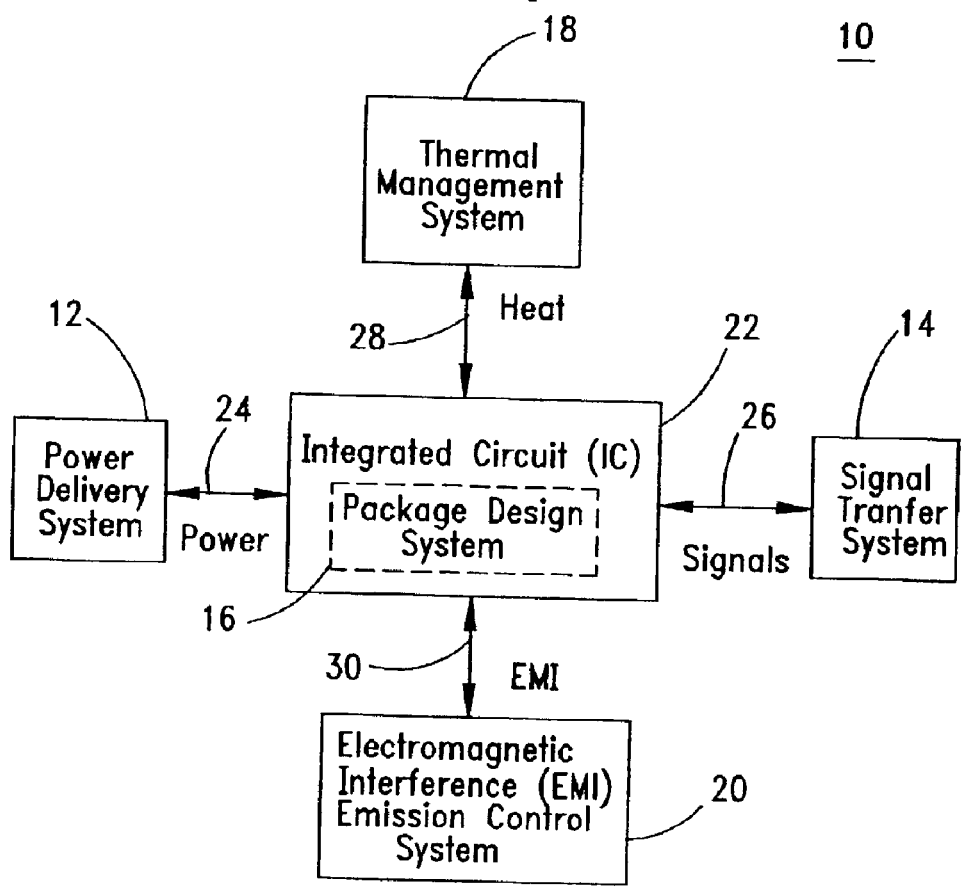
FIG. 1 is a functional block diagram of the broadest aspect of the present invention illustrating the association of the various systems aspects thereof with an integrated circuit.

The present invention is directed to an improved power delivery system 12, a signal transfer system 14, a package design system 16, a thermal management system 18, and an EMI control system 20 for an IC 22. Present and anticipated advancements in semiconductor technology have and will produce ICs, such as microprocessors, that have faster clock rates, higher power, lower supply voltages, higher DC currents, higher transient currents, narrower voltage margins, high non-uniform heat densities, and increased frequency EMI emissions. Ancillary benefits to these advancements include microprocessors that have increased interconnect densities and improved product manufacturability and reliability. Semiconductor manufacturers anticipate that near future microprocessors typically will require 1.0V or less operating voltage, 100A or greater current, 300 A/$\mu$sec or faster transient currents, voltage regulator efficiency greater than 90%, voltage regulation within 5% or less, and voltage ripple less than 1%. These requirements present a significant advancement over present microprocessor designs, and microprocessors having these characteristics, as will future packaging will need new support systems for power delivery, signal transfer, packaging, thermal management, and EMI control. The present invention is directed to improvements for these systems and others, all of which will beneficially support advanced semiconductor technology.

FIGS. 1 to 20 generally illustrate and FIGS. 21 to 58 more particularly illustrate, the power delivery system 12, the signal transfer system 14, the package design system 16, the thermal management system 18, and the EMI control system 20 for the IC 22, all in the different embodiments of the present invention which are illustrated therein. FIG. 1 illustrates a general block diagram of an electronic device or system 10 that includes a power delivery system 12, a signal transfer system 14, a package design system 16, a thermal management system 18, and an EMI control system 20 for an IC 22. FIG. 2 illustrates a more detailed block diagram 32 of the power delivery, signal transfer and package design systems of FIG. 1, which explains the relationship among and between the power delivery system 12, the signal transfer system 14 and the package design system 16 for the IC 22.

Figure 21:
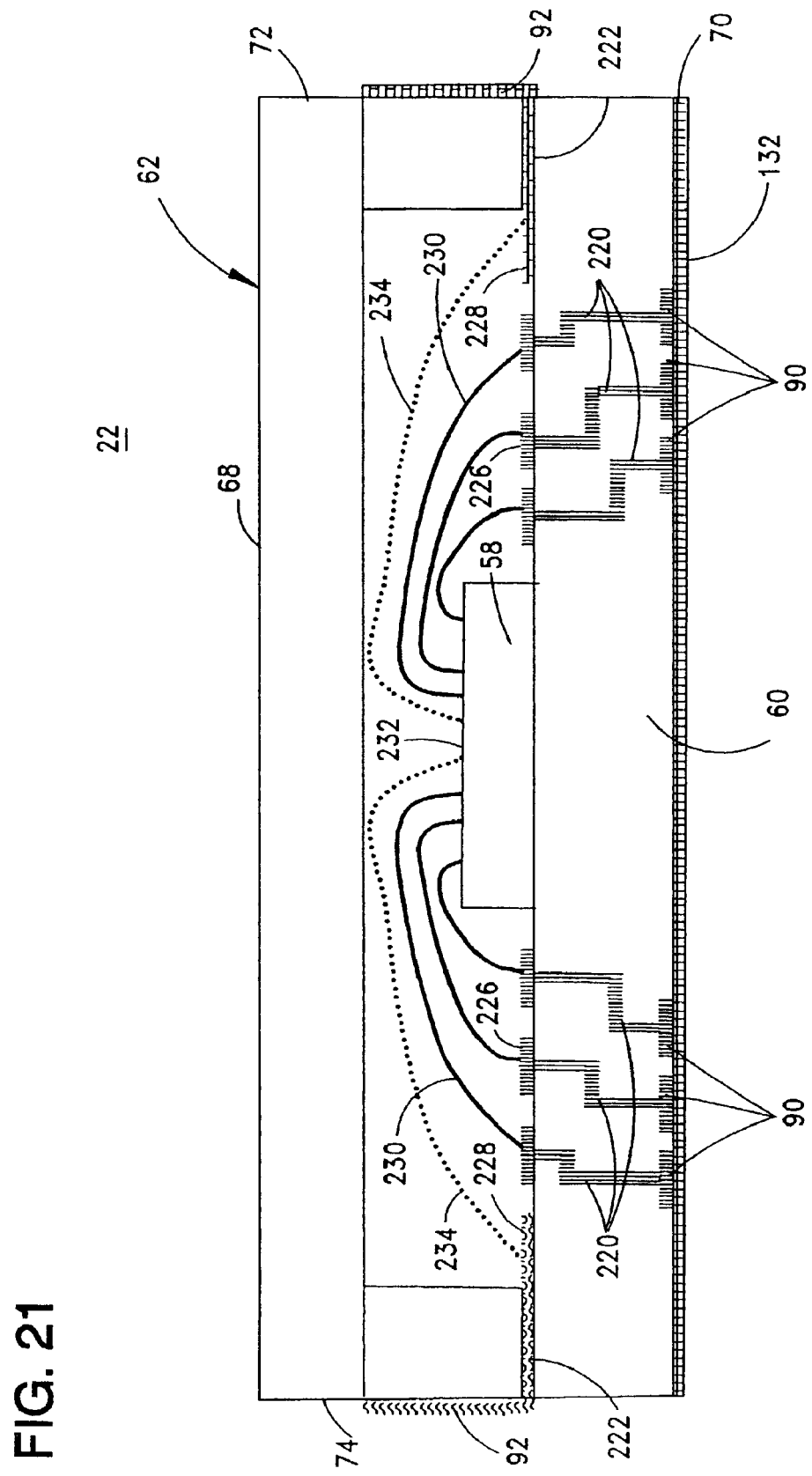
FIG. 21 is a cross-sectional view of a Level Two semiconductor package constructed in accordance with the principles of the present invention with an upright semiconductor die and capacitive type signal interface, with power supplied to the side of the IC.
Figure 22:
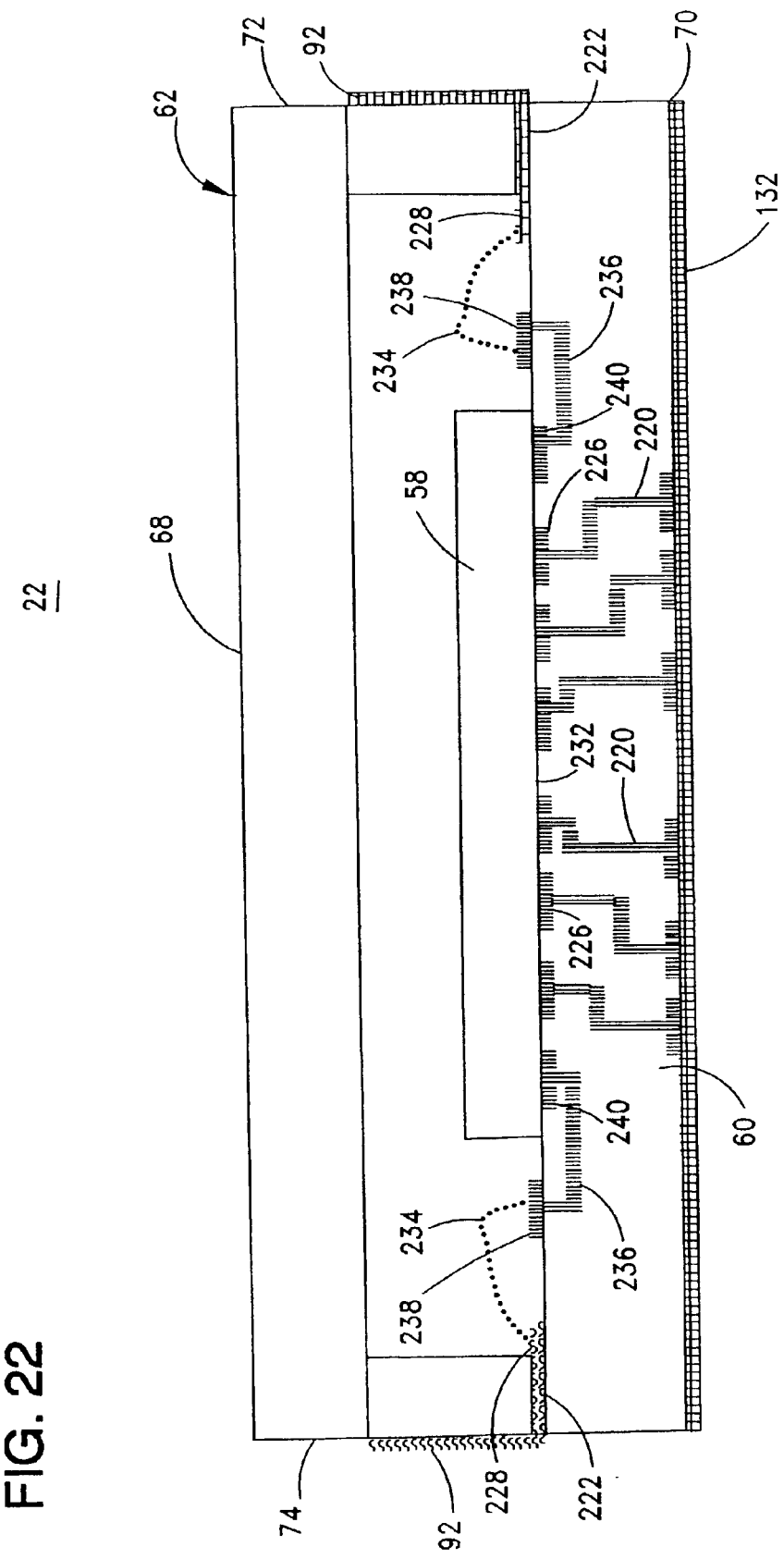
FIG. 22 is a cross-sectional view of a Level Two semiconductor package constructed in accordance with the principles of the present invention with a flipped semiconductor die and utilizing a capacitive type signal interface and power supplied to the side of the integrated circuit.
Figure 23:
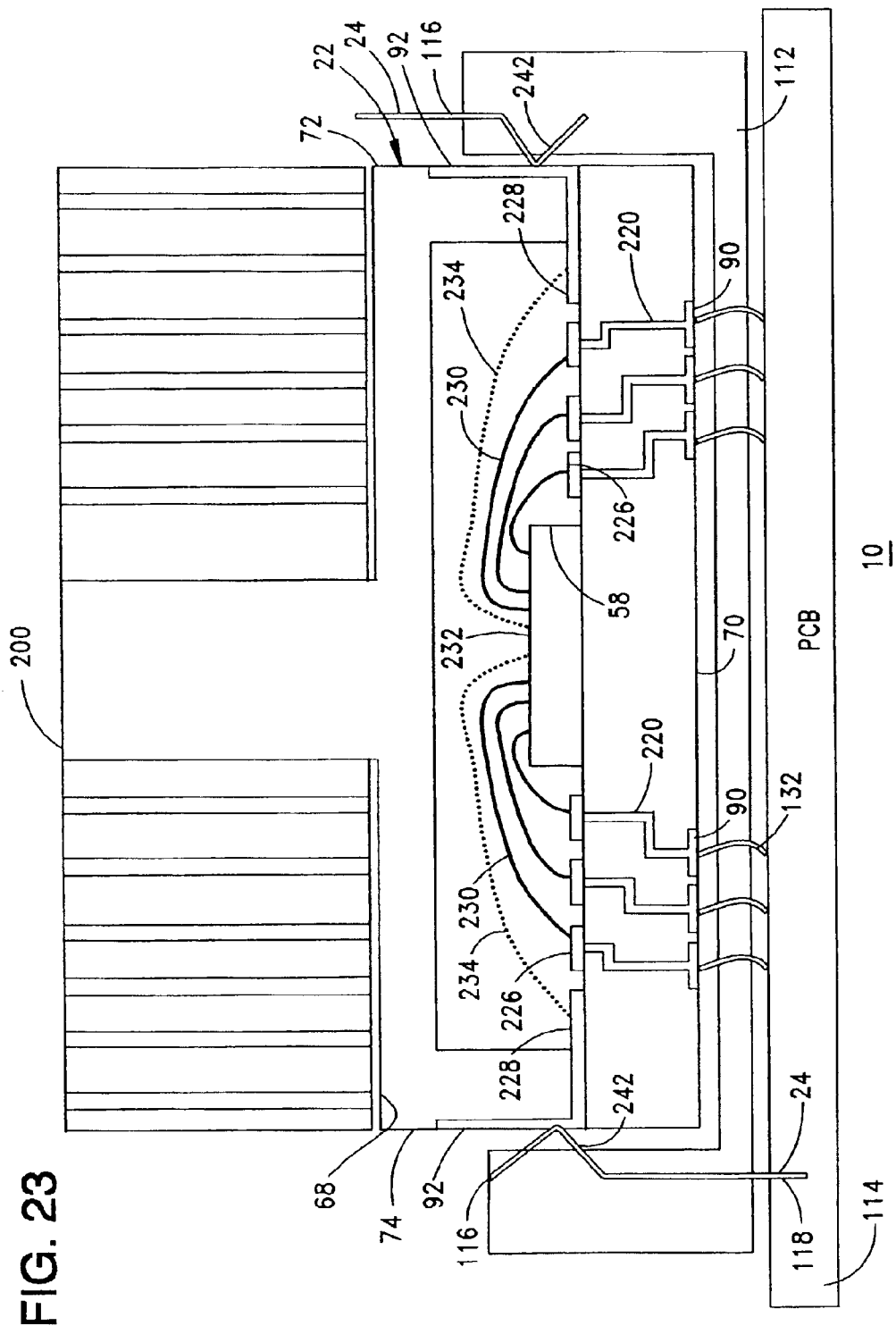
FIG. 23 is a cross-sectional view of the IC package of FIG. 21 with a heat sink member attached thereto.
Figure 24:
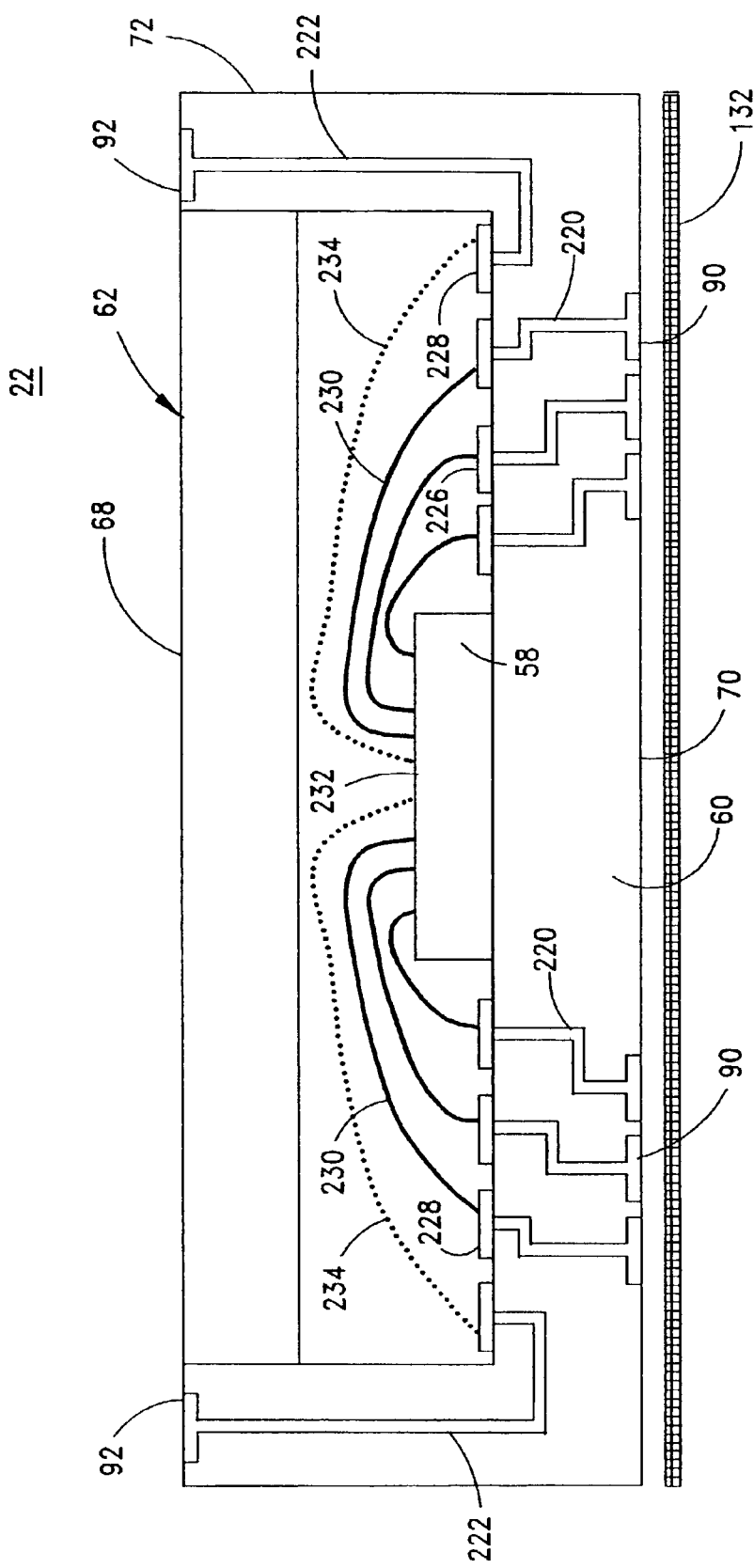
FIG. 24 is a cross-sectional view of a Level Two semiconductor package with an upright semiconductor die, capacitive type of signal interface and with power supplied from the sidewalls of the package.
Figure 27:
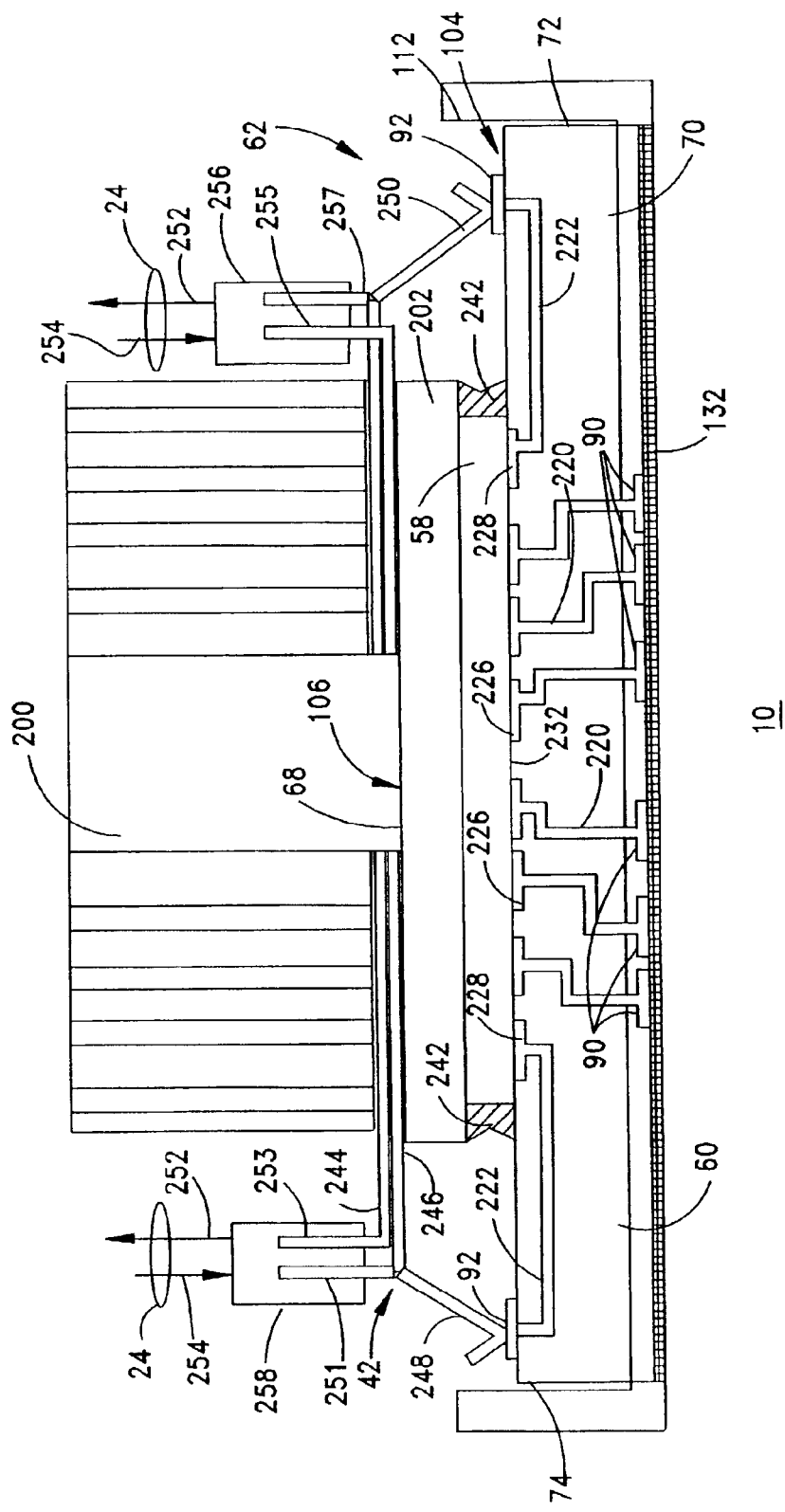
FIG. 27 is a cross-sectional view of the integrated circuit of FIG. 26, carried by a socket connector that supports both a decoupling capacitance and heat sink, similar to that shown in FIGS. 12B and 19.
Figure 32:
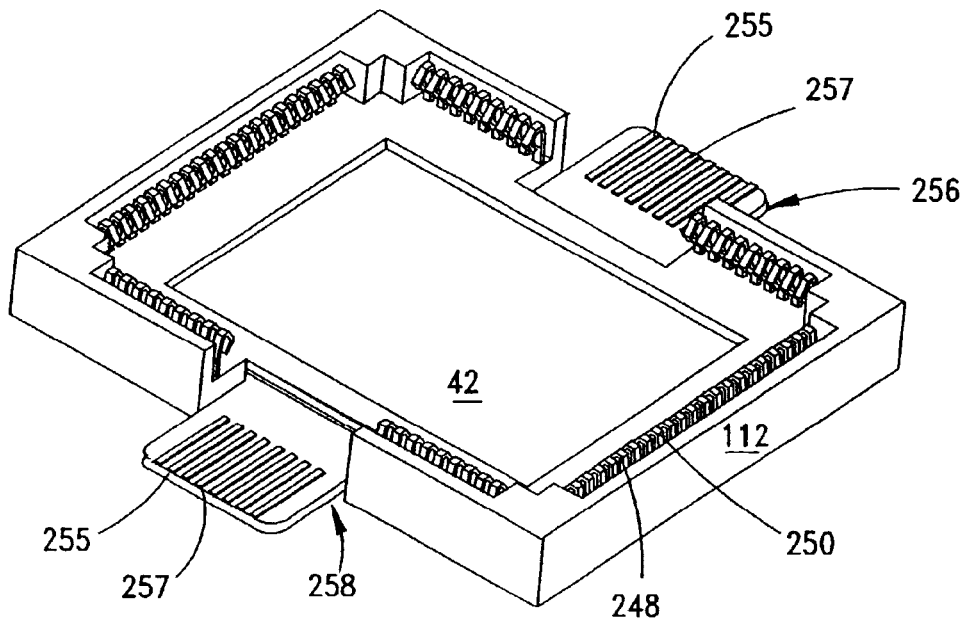
FIG. 32 is a perspective assembly view of another embodiment of a power delivery member of the present invention, taken from the underside and illustrating an alternate means of supplying power to the capacitor structure thereof; where the IC is formed as a level two semiconductor package as shown in FIG. 4C.
Figure 33:
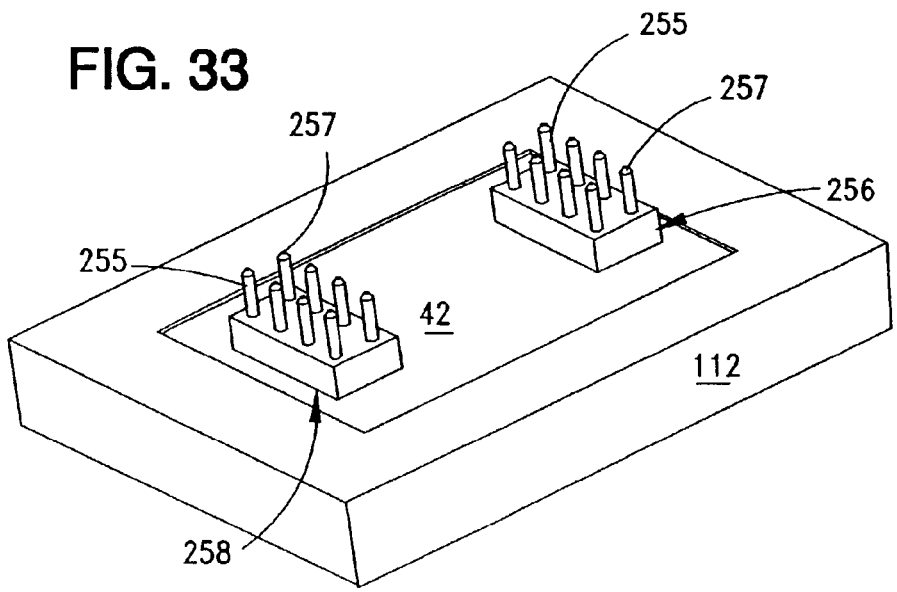
FIG. 33 is a is a perspective view of another system assembly cover used with a level two semiconductor package shown in FIG. 4C, and having an external means for connecting to a power supply.

FIG. 3 is a table 56 that lists alternative locations for each of the system blocks illustrated in FIG. 2, as well as alternate connections between and among the system blocks. FIGS. 4–10 illustrate various packaging design systems 16 for the IC 22, as shown in FIGS. 1–3. FIGS. 11 and 12A, 12B and 12C illustrate the integrated circuit, as shown in FIG. 5, being located in a connector 112, formed as a cover, a socket, or a frame, or located on a printed circuit board (PCB) 114 and having signal 26 and/or power 24 connections formed as a conductor 116 and/or as a PCB trace 118. FIGS. 13 and 14 illustrate two arrangements of the IC 22, as shown in FIG. 11, coupled to a remote circuit 52 located in a connector 140 or on a PCB 114. FIGS. 15–19 illustrate the IC 22 and the RC 52, as shown in FIGS. 13 and 14, having a voltage regulator 38 and decoupling capacitance 42, each being located in one of the connector 112, on the conductor 116, or on the PCB 114, or any combination thereof. FIG. 20 illustrates the IC 22, as shown in FIG. 11, having more details of the thermal management system 18 and the EMI emission control system 20, as shown in FIG. 1. FIGS. 21 and 22 illustrate package design systems 16 for the IC 22 having power contacts located on the side of the IC 22. FIG. 23 illustrates an assembly of the system 10 using the IC 22, as shown in FIG. 21. FIGS. 24 to 26 illustrate package design systems 16 for the IC 22 having power contacts located on the top of the IC 22. FIG. 27 illustrates an assembly of the system 10 using the IC 22, as shown in FIG. 26. FIGS. 28 to 31 illustrate various assembly views of the system 10. FIGS. 32 and 33 illustrate the connector 112, formed as a socket or a cover, having the decoupling capacitance 42, formed as an integral capacitor. FIGS. 34 to 44 illustrate various embodiments of the decoupling capacitance 42, formed as an integral capacitor, carried by a separate or integral connector 112, formed as a cover, a socket or a frame. FIGS. 45 to 60 illustrate various embodiments of the decoupling capacitance 42, formed as multiple discrete capacitors, carried by the connector 112, formed as a cover, a socket or a frame.

Referring back to FIG. 1, it presents a block diagram of an electronic device 10 that includes a power delivery system 12, a signal transfer system 14, a package design system 16, a thermal management system 18 and an EMI control system 20 for an IC 22. The present invention finds its greatest utility in use with ICs in the form of microprocessors that are used in the field of computers, but it will be understood that its principles and structure may be applied to other ICs used in other applications. The power delivery system 12 provides power to the IC 22, while the signal transfer system 14 transfers signals to and from the IC 22. The package design system concerns the construction of the package, or housing in which the IC 22 may be held, while the thermal management system 18 cools the IC 22 during operation thereof and the EMI control system 20 blocks EMI from or toward the IC 22.

The power delivery system 12 is coupled to the IC 22 by way of a power connection 24, that preferably includes both power and ground components (not shown). The power connection 24 illustrated in FIGS. 1 & 2 and is preferably a bi-directional connection that represents power being routed from the power delivery system 12 pver a power path to the IC 22, and also represents a ground path being routed from the IC 22 to the power delivery system 12.

The signal transfer system 14 is coupled to the IC 22 by way of a signal connection 26, which may include one or more signal path so that single signals may be routed along single paths and multiple signals may be routed over separate paths or multiplexed over one or more paths. The signal connection 26 also is preferably a bi-directional connection that represents signals routed from the IC 22 along the signal transfer system 14, and signals routed from the signal transfer system 14 to the IC 22. The signals typically include data, and/or control information.

The package design system 16 is typically inherent to the IC 22 and includes the construction of the IC 22 in a manner to work with the various aforementioned systems 12, 14, 18 and 20. The thermal management system 18 is preferably coupled, or attached, directly to the IC 22 in opposition to a heat-generating surface thereof and preferably over a heat connection 28, which represents a path for heat flow. The heat connection 28 shows a bi-directional connection to represent heat dissipated away from the IC 22 to the thermal management system 18, and to represent are cooling directed from the thermal management system 18 to the IC 22.

The EMI control system 20 is coupled to the IC 22 over EMI connection 30. The EMI connection 20 represents a path for EMI 30. The EMI connection 20 shows a bi-directional connection to represent EMI 30 generated and radiated by the IC 22, and that radiated towards the IC 22 by other circuits.

The IC 22 includes a semiconductor device having one or more of the characteristics and requirements, described above, to support the advanced semiconductor technology. The IC 22 is preferably a microprocessor, but may also be any other type of signal processor, such as a digital signal processor (DSP) or application specific integrated circuit (ASIC). Alternatively, in appropriate applications, the IC 22 may be another type, such as a memory device, a controller, a transmitter or a receiver.

The electronic device or system 10 of FIG. 1 represents any type of electrical and/or mechanical systems that use integrated circuits, such as computers, telecommunication and medical devices and systems. The computers may typically include workstations, desktop and notebook computers, handheld computers, personal digital assistants and the like. The telecommunication devices and systems may include communications systems, satellite systems, microwave systems, land-based telephone switching systems, internet systems, and wireless telephone systems as well as Internet systems such as servers and routers. The medical devices and systems include diagnostic, analytic and treatment devices and systems and the like. All of these devices may or may not be portable. "Portable" devices are typically those referred to in the art as having a power delivery system that is temporary and which needs to be periodically replenished. Such portable devices draw direct current (DC) power from the power delivery system 12 by way of a rechargeable or non-rechargeable DC power supply.

Electronic devices that are not portable are those that have a fixed power delivery system that draws power to the power delivery system 12 in the form of alternating current (AC)

from an AC power outlet. Usually these devices convert the AC power to DC power because the IC 22 draws DC power. However, in some applications, the IC 22 may draw AC power.

FIG. 2 is detailed block diagram 32 illustrating the power delivery, signal transfer and package design systems 12, 14 & 16 for the IC 22. The power delivery system 12 includes a power supply 34, a connection 36 between the power supply and the voltage regulator module, a voltage regulator module 38, a connection 40 between the voltage regulator module and a decoupling capacitance 42, a connection 44 from the decoupling capacitance to the IC, and, if desired, a connection 54 between the voltage regulator module and the IC. The signal transfer system 14 includes a remote circuit 52 and a connection 50 between it and the IC, while the package design system 16 preferably includes an IC power connection 46 and an IC signal connection 48.

In operation, the power supply 34 may generate a relatively coarse regulated DC power at the power connection 36. The voltage regulator module 38 converts this coarse DC power to a relatively fine regulated DC power downstream at the power connection 40 and transmits it as needed to the decoupling capacitance 42, which 42 stores a predetermined amount of this regulated DC power and provides it to the IC along the power connection 44 to its power connection, or input 46. Alternatively, the voltage regulator module 38 may supply the regulated DC power directly to the IC power connection 46 of the IC without using the decoupling capacitance 42. The IC signal connection 48 transmits and receives signals to and from, respectively, the remote circuit 52 via the signal connection 50.

In the power delivery system 12, each of the power connections 36, 40, 44 and 54 show a bi-directional to represent power and ground extending between adjacent system blocks. The power connection 24 in FIG. 1 is the same as the power connection 44 in FIG. 2. Likewise, the signal connection 50 shows a bi-directional connection to represent signals being routed from the IC 22 to the remote circuit 52, and to represent signals being routed from the remote circuit 52 to the IC 22, as described above with reference to the signal connection 26. Similarly, the signal connection 26 in FIG. 1 is the same as the signal connection 50 in FIG. 2.

The power supply 34 is preferably located at a remote location in the electronic device or system 10, as indicated in Column A, Row 2 of the table 56 in FIG. 3. The remote location may be any location that is suitable to deliver power to the electronic device or system 10. Hence, if the electronic device or system 10 has a housing, enclosure or the like, the power supply may be located inside or outside thereof. Preferably, the power supply 34 will be located inside the housing and mounted to a structure such as a chassis or circuit board. If the power supply 34 is located outside the housing, the power supply may typically be mounted to the outside of the housing. The power supply 34 is any type of device that generates power and which preferably converts power in the form of alternating current (AC) to power in the form of direct current (DC) at or along the power connection 36. Such AC to DC power conversion is typical in nonportable electronic devices, as described above. Alternatively, the power supply 34 may generate the DC power directly from a DC power supply, such as a battery, capacitor or the like. The power supply 34 preferably generates the DC power at a relatively coarse regulated level to minimize the cost and complexity of the power supply 34.

The power supply 34 will typically generate the DC power at a relatively high voltage and relatively low current at the power connection 36, as is known in the art of power supplies However, the IC 22 may require DC power of relatively low voltage and relatively high current. Therefore, according to the preferred embodiments of the present invention, special consideration is given to where the DC power conversion from high voltage and low current to low voltage and high current is made, as well as the location and type of the power connections for the high voltage, low current DC power and for the low voltage, high current DC power.

The high voltage, low current DC power advantageously permits power to be routed over power connections, such as a wire or a circuit board trace, that are constructed of a relatively lightweight amount of conductive material, which minimizes the cost of the power connections. These conductive materials may include metals, conductive inks and the like. The design of the traces on a circuit board that form the power connections will typically determine the most amount of the conductive plating on the circuit board. The thickness of the conductive plating on the circuit board is the same across the entire circuit board because it is not cost effective to selectively apply different amounts or thicknesses of plating on different areas of the board. The cost associated with circuit board power connections may sometimes drive up the cost of the circuit board. For example, one ounce of copper plating is typically used to carry high voltage, low current DC power from the power supply 34, via the traces on the circuit board to various electrical components mounted on the circuit board. In contrast, if the power supply 34 were to output low voltage, high current power, then four ounces of the same plating would be needed on the circuit board to carry that same amount of power to the components on the board. Such a circuit board having four times the amount of plating is significantly more expensive.

According to the preferred embodiments of the present invention and as described in detail below, the circuit board traces forming the power connections on the circuit board preferably carry high voltage, low current DC power rather than low voltage, high current DC power in order to minimize the cost of circuit board. In such instances, conductors carry the low voltage, high current DC power directly from the voltage regulator module 38 and/or decoupling capacitance 42 to the IC 22, without being routed through circuit board traces.

The voltage regulator module 38 may be any device that converts high voltage, low current DC power at the power connection 36 to low voltage, high current DC power appropriate for the IC 22. Preferably, the voltage regulator module 38 generates the DC power at a relatively fine regulated level to minimize the cost and complexity of the voltage regulator module 38 while maximizing the performance of the voltage regulator module 38. The terms "coarse" and "fine," and "high" and "low," as used herein, are relative terms that distinguish the performance and operation of the power supply 34 and the voltage regulator module 38, and are not intended to be limited to any particular values or levels. It is desirable that the voltage regulator module 38 is constructed as a module of discrete and/or integrated circuit components, and, if necessary, mounted on a separate circuit board. Alternatively, the voltage regulator module 38 may be constructed of only discrete circuit components or only integrated circuit components, as necessary or desired.

The decoupling capacitance 42 may include any type of capacitance that decouples power from the IC 22. The decoupling capacitance 42 advantageously supplies the IC 22 with high transient currents when required, as described above. The decoupling capacitance 42 may be formed of separate discrete capacitors or an integral capacitor. Discrete capacitors include, without limitation, ceramic, tantalum and gel (e.g., pocketed aero gel) capacitors, and the like, which may have leaded or surface mount end connections. Such capacitors also include chip-type capacitors. Discrete capacitors advantageously provide predetermined specifications and have known sizes. The connection to the discrete capacitors may utilize conductors such as single or multi-strand wire, stamped and formed, blanked leads and the like. The aforementioned discrete capacitors may be integrally formed with a carrier lead frame and may include relatively large parallel plates separated by a suitable dielectric. The integral capacitors may be rigid or flexible, and may be formed of a solid, liquid, paste, gel or gas. Integral capacitors advantageously permit custom specifications, shapes and configurations. The decoupling capacitance 42 is described in further detail below.

Each of the power supply 34, the voltage regulator module 38 and the decoupling capacitance 42 may be combined in any appropriate way to form separate or integral, modules, devices, or components, or the like. Preferably, the power supply 34, the voltage regulator module 38 and the decoupling capacitance 42 are constructed separately or in alternative constructions, the power supply 34 and the voltage regulator module 38 may be designed as a single, integrated device generating low voltage, high current, fine regulated DC power. Still further, the voltage regulator module 38 and the decoupling capacitance 42 may be designed as a single, integrated device capable of generating decoupled, low voltage, high current, fine regulated DC power.

The IC 22 may draw its power from the decoupling capacitance 42 via the power connection 44 or from the voltage regulator module 38 via the power connection 54, as desired. Typically, the specifications of the IC 22 will dictate power output needed from the decoupling capacitance 42 and/or voltage regulator module 38. If the IC 22 requires high transient currents that the voltage regulator module 38 alone cannot satisfy, an appropriate amount of the decoupling capacitance 42 is needed. Alternatively, if the voltage regulator module 38 can satisfy the transient currents required by the IC 22, then the decoupling capacitance 42 is not needed on a continuous basis.

The power connection 44 includes any type of connection including for example conductive, capacitive, inductive and similar connections. The signal connection between the IC and the circuit board may include solder, land grid array (LGA), pin grid array (PGA), ball grid array (BGA), spring contact and other similar connections. The capacitive signal interface provides an interface for transmitting signals between two conductive plates having a suitable size and separated by a suitable dielectric material. The inductive signal interface provides an interface for transmitting signals between two conductors having a particular orientation to one another and separated by a predetermined distance.

The remote circuit 52 designates memory devices, microprocessors, digital signal processor, application specific integrate circuit (ASIC), a hard disk drive, user interface device, transmitter, receiver or the like. In some applications, the remote circuit 52 and the IC 22 may be the same or different electronic circuits or devices.

The signal connection 50 may include signal interfaces such as conductive, capacitive, inductive, optical, transmission line, and wireless signal interface or the like. A con-ductive signal interface provides a galvanic signal interface that relies upon metal-to-metal contact such as those known in the art which include solder connections, land grid arrays (LGA), pin grid arrays (PGA), ball grid arrays (BGA) and the like. A capacitive signal interface is one that may transmit signals between two spaced-apart conductive plates, preferably of similar size and which are separated by a suitable dielectric material, or air. An inductive signal interface is one that transmits signals between two conductors having a particular orientation to one another and separated by a predetermined distance. The optical signal interface provides an interface for carrying signals modulated by a transmitter and demodulated by a receiver at an optical frequency, such as light, over a channel via an optical wave-guide, such as an optical fiber. The transmission line signal interface provides an interface for carrying signals between or on two parallel conductors, including coax, micro-strip, co-planar, strip-line and the like. The wireless signal interface provides an interface for carrying signals modulated by a transmitter and demodulated by a receiver at a radio frequency over a radio frequency channel via a radio transmission media, such as air or space. Each of the power and signal connections 44, 50 may be delivered to the IC 22 via any type of mating arrangement, such as a circuit board, edge card assembly, pin and socket assembly, plug assembly, solder, conductive adhesive, pins, spring fingers, and the like.

FIG. 3 illustrates a table 56 listing alternative locations listed in Columns A, C, E, H and K thereof for each system block 34, 38, 42, 22 & 52 shown in FIG. 2 and alternative connections listed in Columns B, D, F, G, I and J between the system blocks 36, 40, 44, 46, 48, and 50 of FIG. 2. System block reference numbers 36, 40, 44 and 50 of FIG. 2 that directly correspond to columns in the table 56 are not enclosed in parenthesis in the table 56. For example, the power connection 36 directly corresponds to the power connection described in Column B, Row 1. System block reference numbers 34, 38, 42, 46, 22, 48 and 52 of FIG. 2 that indirectly correspond to Columns in Table 56 are enclosed in parenthesis, such as the power supply 34 of FIG. 2 indicating the power supply itself, and Column A, Row 1 describes the location of the power supply. In the table 56, the alternative voltage regulator module to IC power connection 54 of FIG. 2, is not shown for sake of clarity. However, alternative power connection 54 includes a conductor and a circuit board trace, which is the same as all of the other connections listed in table 32 of FIG. 3.

In the table 56, the power supply location is described as being remote, as shown in column A, row 2. The term "remote" in this description generally means that the power supply is located in any suitable place away from the remaining circuitry of the electronic device 10. This description is used to reflect present and anticipated future designs of power supplies that are relatively complicated circuits in their own right and are typically formed as modules that interface to the remaining circuitry. The term "remote" does not imply a distance relationship where the power supply is located far from the remaining circuitry because, practically speaking, the power supply 34 is electrically coupled to the remaining circuitry.

The location of the voltage regulator module 38, the decoupling capacitance 42, the IC 22 and the remote circuit 52, as described in Row one, Columns C, E, H and K, respectively, are each described as being located in a connector, on a PCB, and/or on a conductor, as described in Rows 2, 3 and 4, respectively, of the same four Columns.

The connector is a device that electrically couples electrical signals to an electronic device. The electrical signals carried by the connector typically include power and/or information signals. The connector also has mechanical features to facilitate the electrical connection to the electrical device. In the preferred embodiments of the present invention, the connector is formed as a cover, a frame and/or a socket for the IC.

The circuit board is a substrate which includes one or more layers of nonconductive material for carrying conductive paths, otherwise known as traces or contact pads. The conductor is a device that electrically couples electrical signals from one electronic device to another electronic device. The electrical signals carried by the conductor typically include power and/or signals. The conductor may be flexible, or rigid or a combination thereof. Examples of flexible conductors include flexible circuitry, ribbon cable, wire, cable and the like. An example of a rigid conductor includes a conventional circuit board with conductive traces disposed thereon. The conductor is usually located off of the main circuit board, commonly referred to as a motherboard.

The power connections 36, 40 and 44, and the signal connection 50, as described in Row one, Columns B, D, F and J, respectively, are each described as being a conductor and/or circuit board trace, as described in Rows 2 and 3, respectively, of the same four Columns. The term "conductor" in this description generally means the same as described above with reference to the location of the functional blocks. Therefore, the conductor may serve as both the location of the functional blocks and the power and/or signal connection. The traces provide conductive paths, disposed on one or more layers of a nonconductive material, for carrying electrical signals. The electrical signals carried by the traces typically include power and/or information signals.

The locations of the IC power connection 46 and the IC signal connection 48, as described in Row one, Columns G and I, respectively, are each described as being located on the top, side (lateral) and/or bottom of the IC 22, as described in rows 2, 3 and 4, respectively, of the same two columns. In this description, the terms "top," "side," and "bottom" refer to different sides or surfaces of the IC 22, which typically may be square, circular or rectangular, and these are relative terms used for explanation purposes only, and should not be construed as being limited to what may be conventionally regarded as the top, side, or bottom of the IC 22. Typically, the top and bottom surfaces of the IC 22 have surface areas that are greater than that of each side of the IC, as is typical with present day ICs formed as microprocessors. The locations of the IC power connection 46 and the IC signal connection 48 are described in further detail below.

With this general overview of the table 56 of FIG. 3 Columns A, B, C, D, E, F, G, H, I, J and K describe 1, 2, 3, 2, 3, 2, 3, 3, 3, 2 and 3 individual alternatives, respectively, in rows 2, 3 and 4. Hence, the table 56, alone and without any other description or figure, discloses 11,664 possible combinations (i.e. 1×2×3×2×3×2×3×3×3×2×3=11,664) of the various individual alternatives. The number of possible combinations illustrates the many ways in which the power delivery system 12, the signal transfer system 14 and the packaging design system 16 for the IC 22 may be implemented. The present invention is not meant to be limited to this number of possible combinations because there are many other features and alternatives described in the present specification and illustrated in the present figures that may be used in combination with the alternatives listed in the table 56. Further, combinations of the various individual alternatives used at the same time would also increase the number of possible combinations.

If the alternative power connection 54 is used, without the decoupling capacitance 42 and the power connection 44, as shown in FIG. 2, then the number of total combinations would be reduced by the 3 individual alternatives for the location of the decoupling capacitance 42 and by the 2 individual alternatives for the type of the power connection 44 (i.e., 11,664/(3×2)=1,994 possible combinations).

FIGS. 4A, 4B, 4C, 4D and 4E illustrate the IC 22, as shown in FIGS. 1, 2 and 3, having increasing levels of integration and identified respectively as levels 0, 1, 2, 3 and 4 which represent the package design system 16. FIG. 4A illustrates the IC 22 constructed at integration level 0 and includes a semiconductor die 58, otherwise known as a chip, wafer, and the like. FIG. 4B illustrates the IC 22 constructed at integration level 1 and includes the semiconductor die 58, as shown in FIG. 4A, mounted on a semiconductor substrate 60. FIG. 4C illustrates the IC 22 constructed at integration level 2 and includes the semiconductor die 58 mounted on the semiconductor substrate 60, as shown in FIG. 4B, enclosed within a semiconductor package 62, such as plastic, ceramic and the like. FIG. 4D illustrates the IC 22 constructed at integration level 3 and includes the semiconductor package 62, as shown in FIG. 4C mounted on a circuit board 64, sometimes referred to as an interposer board. FIG. 4E illustrates the IC 22 constructed at integration level 4 and includes the semiconductor package 62 and the PCB 64, as shown in FIG. 4D, mounted on a larger circuit board 66, sometimes referred to as a motherboard. Preferably, the IC 22 is constructed using integration level 2, as shown in FIG. 4C. However, ICs are anticipated to be constructed using integration level 1, as shown in FIG. 4B.

The various levels of integration are illustrated for reference only and should not be interpreted as being critically defined. Various combinations of the levels of integration are possible which are not specifically shown. For example, the semiconductor die 58 mounted on the semiconductor substrate 60, as shown in FIG. 4B, may be mounted directly on the PCB 64, without using the semiconductor package 62. Likewise, the semiconductor package 62, as shown in FIG. 4C, may be mounted directly on the motherboard 66, without using the PCB 64. Hence, individual parts of the illustrated levels of the IC 22 may be mixed and matched to provide numerous combinations of integration not specifically shown in FIGS. 4A, 4B, 4C, 4D and 4E.

In FIGS. 4B to 4E, the packages have multiple surfaces that may be considered generically as "top" or "side" surfaces. These multiple surfaces result from the elements being stacked or mounted on one another to form a stair-step profile. Hence, the terms "top" or "side" may include all surfaces facing in the same direction, and are not limited to the surface farthest out in the one direction.

In FIG. 5 the IC 22, the power delivery system 12, the signal transfer system 14 are shown schematically. The IC 22 in this Figure generally includes the packaging design system 16 having the IC power connection 46 and the IC signal connection 48 formed therewith. Hence, the block diagram shown FIG. 5 is generally the same as the block diagram shown in FIG. 2, except that the IC 22 is illustrated as a schematic elevational view. FIG. 5 shows several illustration conventions that apply to all of the figures. A solid line represents the preferred path for the signal connection 26 and the preferred power connection 24. A short dashed line represents alternative paths for the signal connections 26. A long dashed line represents alternative paths for the power connections 24. These illustration conventions are provided to add clarity and understanding to the Figures and this description, and should not be interpreted as limiting in any way, such as implying that any one connection is more important or better than another.

The signal transfer system 14 is electrically coupled to the IC signal connection 48 of the IC 22, as described with FIG. 2, via the signal connection 26. The signal connection 26 may be electrically coupled to the top 68, the bottom 70 and/or the side 74 of the IC 22. Preferably, the signal connection 26 is electrically coupled to the bottom 70 of the IC 22. Hence, the IC signal connection 48, shown inside the elevation view of the IC 22, represents that the signal connection 26 may be located on any surface of the IC 22.

The power delivery system 12 is electrically coupled to the IC power connection 46 of the IC 22, as described with FIG. 2, via the power connection 24. The power connection 24 may be electrically coupled to the top 68, the bottom 70 and/or the side 74 of the IC 22. Preferably, the power connection 24 is electrically coupled to the side 72 of the IC 22. Hence, the IC power connection 46, shown inside the elevation view of the IC 22, represents that the power connection 24 may be located on any surface of the IC 22.

In the preferred embodiments of the present invention, the signal connection 26 and the power connection 24 are located on different sides (i.e., the bottom 70 and the side 72, respectively) of the IC 22. Locating the signal connection 26 and the power connection 24 on different sides of the IC 22 provides several advantages related to the package design system 16 of the IC 22. The advantages include reducing the number of ground contacts and power contacts, increasing the number of signal contacts, increasing the number of signal contacts per square area, reducing the signal contact pitch, reducing the number of total contacts, increasing the number of total contacts per square area, reducing the force per contact per square area along the Z-axis, reducing the mated contact height, increasing the signal bandwidth, increasing the semiconductor die size, reducing the IC 22 size, as well as improving other factors related to electronics, mechanics and materials.

Alternatively, the signal connection 26 and the power connection 24 may be located on the same of one or more sides (i.e., top 68, bottom 70 and side(s) 72) of the IC 22. In this case, special consideration would be given to the location of the signal connection 26 and the power connection 24 on the same side of the IC 22 to optimize the connections for various engineering reasons, as described in further detail below.

FIG. 6A illustrates the IC 22, as shown in FIG. 5, having a first (high) frequency signal interface 76 and a second (low) frequency signal interface 78, different from the first (high) frequency signal interface 76, each coupled to different sides of the IC 22 representing the package design system 16 in accordance with the preferred embodiments of the present invention. Hence, the signal connection 26 includes both the first (high) frequency signal interface 76 and the second (low) frequency signal interface 78. The frequencies of the first (high) frequency signal interface 76 and the second (low) frequency signal interface 78 are separated by at least one hertz. However, the benefits of separating the signal interfaces on different side of the IC 22 based on frequency increases as the separation between the frequencies becomes greater.

Each of the first (high) frequency signal interface 76 and the second (low) frequency signal interface 78 may be connected to any side (i.e., top 68, bottom 70 and side(s) 72) of the IC 22. Preferably, the first (high) frequency signal interface 76 is connected to the top 68 of the IC 22 and the second (low) frequency signal interface 78 is connected to the bottom 70 of the IC 22. This location arrangement advantageously permits the power connection 24 to be connected to the side(s) 72 of the IC 22, without considering the location of the signal connection 26 on the side(s) 72 of the IC 22.

Further, this location arrangement advantageously corresponds to one type of signal interface (shown in table 84 in FIGS. 7A and 7B) to be used on one side of the IC 22 and another type of signal interface to be used on another side of the IC 22. For example, the first (high) frequency signal interface 76 may use a capacitive type of signal interface and the second (low) frequency signal interface 78 may use the conductive type of signal interface. In this example, it would be beneficial for the second (low) frequency signal interface 78 to transfer signals to and from a PCB via the conductive type of signal interface, and beneficial for the first (high) frequency signal interface 76 to transfer signals to and from a conductor via the capacitive type of signal interface. In other words, the low frequency signals would be carried via PCB traces on the PCB and the high frequency signals would be carried via the conductor. The conductors carry the high frequency signals to other circuits directly, without entering the PCB, or by entering the PCB next to the other circuits and continuing over a short distance via PCB traces. This particular arrangement permits the cost and size of the PCB to be minimized because complex routing of high frequency transmission lines among multiple PCB layers is minimized or eliminated.

FIG. 6B is an elevational view of the IC 22, as shown in FIG. 5, having the first (high) frequency signal interface 76 and the second (low) frequency signal interface 78, different from the first (high) frequency signal interface 76, each coupled to the same side of the IC 22 representing the package design system 16 in accordance with the preferred embodiments of the present invention. Hence, FIG. 6B is the same as FIG. 6A except for the location of the first (high) frequency signal interface 76 and the second (low) frequency signal interface 78 on the sides (i.e., top 68, bottom 70 and side(s) 72) of the IC 22.

The first (high) frequency signal interface 76 and the second (low) frequency signal interface 78 may be located on any side (i.e., top 68, bottom 70 and side(s) 72) of the IC 22. Preferably, the first (high) frequency signal interface 76 and the second (low) frequency signal interface 78 are located on the bottom 70 of the IC 22. Alternatively, the first (high) frequency signal interface 76 and the second (low) frequency signal interface 78 may be located on the top 68 or the side(s) 74 of the IC 22.

Locating the first (high) frequency signal interface 76 and the second (low) frequency signal interface 78 on the same side of the IC 22 advantageously permits the high and low frequency signals to be electrically coupled to the same PCB, connector, conductor or other IC. This location arrangement is practical where the signal connections 26 have many of one frequency signal interface and few of the other frequency signal interface, wherein allocating them to different sides of the IC 22 would be more expensive or more complex than allocating them to the same side of the IC 22.

This location arrangement may require a hybrid interface connection between the IC 22 and the PCB, the connector, the conductor or other the IC to accommodate the different frequencies. For example, the first (high) frequency signal interface 76 may use a capacitive type of signal interface and the second (low) frequency signal interface 78 may use the conductive type of signal interface. In this case, the hybrid interface connection accommodates both the capacitive and conductive types of signals. More particularly, the hybrid interface connection would include both dielectric elements for the capacitive type of signals and galvanic contacts for the conductive type of signal.

FIG. 7A is an elevational view of the IC 22, as shown in FIG. 5, having a first type of signal interface 80 and a second type of signal interface 82, different from the type of signal interface 80, each coupled to different sides (i.e., top 68, bottom 70 and side(s) 72) of the IC 22 representing the package design system 16 in accordance with the preferred embodiments of the present invention. Hence, the signal connection 26 includes both the first type of signal interface 80 and the second type of signal interface 82. The first type of signal interface 80 and the second type of signal interface 82 may transfer signals at the same or different frequencies.

Each of the first type of signal interface 80 and the second type of signal interface 82 include, without limitation, conductive, capacitive, inductive, optical, transmission line, and wireless, as shown in a table 84 included with FIG. 7A. Each of these examples of the types of signal interfaces is described in detail above. Note that the types of signal interfaces also include characteristics of the signals carried by the types of signal interfaces. Such signal characteristics include, without limitation, frequency, amplitude, modulation, and the like.

Each of the first type of signal interface 80 and the second type of signal interface 82 may be connected to any side (i.e., top 68, bottom 70 and side(s) 72) of the IC 22. Preferably, the first type of signal interface 80 is connected to the top 68 of the IC 22, and the second type of signal interface 82 is connected to the bottom 70 of the IC 22. Alternatively, the second type of signal interface 82 may be connected to the side(s) 74 of the IC 22.

This type of signal interface arrangement is advantageous when the electrical and/or mechanical characteristics of each type of signal interface are so different that it less expensive or easier to locate them on different sides of the IC 22. For example, the first type of signal interface 80 may be optical and the second type of signal interface 82 may be capacitive. In this case, the optical interface transfers signals in the form of light and the capacitive interface transfers electrical signals in the form of electrons. Therefore, it would be beneficial to construct the optical signal interface on one side of the IC 22 and the capacitive signal interface on another side of the IC 22.

FIG. 7B illustrates the IC 22, as shown in FIG. 5, having the first type of signal interface 80 and the second type of signal interface 82, different from the type of signal interface 80, each coupled to the same side of the IC 22 representing the package design system 16 in accordance with the preferred embodiments of the present invention. Hence, FIG. 7B is the same as FIG. 7A except for the location of the first type of signal interface 80 and the second type of signal interface 82 on the sides (i.e., top 68, bottom 70 and side(s) 74) of the IC 22.

The first type of signal interface 80 and the second type of signal interface 82 may be connected to any side (i.e., top 68, bottom 70 and side(s) 74) of the IC 22. Preferably, both the first type of signal interface 80 and the second type of signal interface 82 is connected to the bottom 70 of the IC 22. Alternatively, both the first type of signal interface 80 and the second type of signal interface 82 may be connected to the top 68 or the side(s) 74 of the IC 22. Advantages of this arrangement are similar to that describe in FIG. 6B with reference to the hybrid interface connection.

Note that there is some overlap of the frequency signal interfaces described in FIGS. 6A and 6B and the types of signal interfaces described in FIGS. 7A and 7B because the frequency signal interfaces described in FIGS. 6A and 6B necessarily have some type of signal interface, such as those described in FIGS. 7A and 7B. For example, in FIG. 6A, the first (high) frequency signal interface 76 is preferably a capacitive type of signal interface, and the second (low) frequency signal interface 78 is preferably a conductive type of signal interface. In this example, each type of signal interface carries signals at different frequencies. Therefore, by this notation and by this example, various combinations of FIGS. 6A, 6B, 7A and 7B are possible and within the scope of the present description.

FIGS. 8A, 8B, 8C and 8D illustrate cross-sectional views of the IC 22, as shown in FIGS. 4C and 5, having signal 48 and/or power 46 connections located outside, flush with, recessed or inside, respectively, the semiconductor package 62 representing the package design system 16 accordance with the preferred embodiments of the present invention. Preferably, the IC 22 is a semiconductor package 62 formed as a level two design, as shown in FIG. 4C above. Alternatively, the IC 22 may be formed as any level design, as shown in FIGS. 4A, 4B, 4C, 4D and 4E, or any combination thereof. Note that the semiconductor die 58 and the semiconductor substrate 60, as shown in FIG. 4C, are both not shown in each of FIGS. 8A, 8B, 8C and 8D for the sake of clarity in these four figures.

FIGS. 8A, 8B, 8C and 8D each have features in common including the semiconductor package 62 (including the top 68, the bottom 70, the sides 72 and 74), the IC signal connection 48, the IC power connection 46, the signal connection 26 and the power connection 24, as described above. The IC power connection 46 and the signal connection 26 are the same as described above.

The semiconductor package 62 has a predetermined thickness 88. The predetermined thickness 88 may have any value and may be different on one or more sides of the semiconductor package 62. The semiconductor package 62 may be formed of any appropriate material. Preferably, the value of the predetermined thickness 88 is appropriate for microprocessors using plastic or ceramic materials for the semiconductor package 62. Preferably, the value of the predetermined thickness 88 is the same on all sides of the semiconductor package 62.

The IC 22 may have mechanical features (not shown) that permit the IC 22 to be aligned and/or attached to another structure including, without limitation, a PCB, a connector, forming a cover, a socket or a frame, a conductor, another IC, and the like. The mechanical features may be formed as separate parts that are attached to the IC 22 or integrally formed with the IC 22. The mechanical features include, without limitation, pins, ridges, posts, pegs, bumps, and the like extending beyond one or more surfaces of the IC 22, and/or holes, recesses, troughs, and the like extending into one or more surfaces of the IC 22. The mechanical features may form fasteners themselves or may cooperate with separate fasteners to aligned and/or attach the IC 22.

The IC signal connection 48 includes signal contacts 90. The signal contacts 90 provide any type of path that permits the signals on the signal connection 26 to be received by the IC 22 and/or to be transmitted by the IC 22. Hence, the signal contacts 90 are compatible with the various types of signal interfaces, as shown in the table 84 in FIGS. 7A and 7B, including, without limitation, conductive, capacitive, inductive, optical, transmission line and wireless. Depending on the type of signal interface employed, the signal contacts 90 have a variety of mechanical and electrical features and characteristics. When the signal contacts are compatible with the conductive type of signal interface, the signal contacts 90 are preferably made of metal to provide galvanic contacts.

When the signal contacts 90 are compatible with the capacitive type of signal interface, the signal contacts 90 are preferably made of metal to provide one side of the conductive plates needed for capacitive signal transfer. Alternatively, the dielectric material may be provided with the IC 22 on the conductive plates. Note that the other side of the conductive plates (not shown) could be provided on a PCB or on a connector, as is described in further detail below.

When the signal contacts 90 are compatible with the inductive type of signal interface, the signal contacts 90 are preferably made of metal to provide one side of the conductive element needed for inductive signal transfer. Note that the other side of the conductive element (not shown) could be provided on a PCB or on a connector, as will be describe in further detail below.

When the signal contacts 90 are compatible with the optical type of signal interface, the signal contacts 90 preferably form one or more optical transmitters and/or optical receivers, as will be describe in further detail below.

When the signal contacts 90 are compatible with the transmission line type of signal interface, the signal contacts 90 preferably forms a transmission line interface to provide for a proper impedance match between the signal connection 26 outside of the IC 22 and the signal connection (not shown) inside the IC 22.

When the signal contacts 90 are compatible with the wireless type of signal interface, the signal contacts 90 preferably forms an antenna interface to provide for a proper impedance match between the signal connection 26 outside of the IC 22 via an antenna (not shown) and the signal connection (not shown) inside the IC 22. Alternatively, the signal contacts 90 may form and provide the antenna itself.

The signal contacts 90 are electrically coupled to the semiconductor die 58 (not shown) located inside the semiconductor package 62. Conventional methods for providing the electrical coupling include, without limitation, wire bonding, tab bonding, flip-chip bonding, and the like, as are well known in the art of semiconductor manufacturing. Preferably, the electrical coupling between the signal contacts 90 and the semiconductor die 58 are made using wires and wire bonds, each being well known in the art of semiconductor manufacturing.

The signal contacts 90 may be located on any side or all sides (i.e., top 68, bottom 70, sides 72 and 74) of the IC 22. Preferably, the signal contacts 90 are located on the bottom 70 of the IC 22 to match the preferred location of the signal connection 26, as described above. Alternative locations for the signal contacts 90 are shown on the top 68 and the side 74 of the semiconductor package 62. The signal contacts 90 are illustrated in each figure as simple blocks for the sake of clarity. Practically, the signal contacts 90 include multiple individual signal contacts corresponding to each signal path. The signal contacts 90 may have any elevation relative to the semiconductor package 62. Preferably, the signal contacts 90 all have the same elevation relative to the semiconductor package 62. This arrangement permits ease of manufacturing of the semiconductor package 62 and ease of connection to the signal contacts 90. Alternatively, the signal contacts 90 individually may have different elevations relative to the package 62 to accommodate various desired engineering considerations. The signal contacts 90 may have any shape, size, pitch, material, and the like. Shapes include, without limitation, square, rectangular, round, oval, and the like. Preferably, the size is in the 0.5 to 1.0 mm by 0.5 to 1.0 mm square range. Preferably, the material is a galvanic material.

The IC power connection 46 includes conductive power contacts 92 formed of metal. The power contact provides any type of path that permits the power on the power connection 24 to be delivered to the IC 22. The power contacts 92 are coupled to the semiconductor die 58 (not shown) located inside the semiconductor package 62. Preferably, the electrical coupling between the power contacts 92 and the semiconductor die 58 are made using wires and wire bonds, each being well known in the art of IC package design. Preferably, the power contacts 92 are generally larger in size than the signal contacts 90, and the electrical coupling between the power contacts 92 and the semiconductor die 58 is heavier than the electrical coupling between the signal contacts 90 and the semiconductor die 58. This construction advantageously permits more current to be routed through the power contact 92 to the semiconductor die 58 than through the signal contacts 90 to the semiconductor die 58.

The power contacts 92 may be located on any side or all sides (i.e., top 68, bottom 70, sides 72 and 74) of the IC 22. Preferably, the power contacts 92 are located on the side(s) 72 of the IC 22 to match the preferred location of the power connection 24, as described above and to free up more contacts on the IC that may be used for signal and other non-power applications, if desired. Alternate locations for the power contacts 92 are shown on the top 68 and the bottom 70 of the semiconductor package 62. Locating the power contacts on the side(s) 72 of the IC 22 significantly reduces the force per signal contact per square area along the Z-axis on the bottom 70 of the IC 22 because the force per power contact is in the X axis and Y axis. Locating the power contacts on the top 68 of the IC 22 significantly reduces the force per signal contact per square area along the Z-axis on the bottom 70 of the IC 22 because less contact force is needed when the signal contacts 90 and the power contacts 92 are distributed on opposite sides of the IC 22. The power contacts 92 are illustrated in each figure as simple blocks for the sake of clarity. Practically, the power contacts 92 include multiple individual power contacts and ground contacts corresponding to each power path and ground path, as described with reference to FIG. 1.

The power contacts 92 may have any elevation relative to the semiconductor package 62 and preferably, they all have the same elevation relative to the semiconductor package 62. This arrangement permits ease of manufacturing of the semiconductor package 62 and ease of connection to the power contacts 92. Alternatively, the power contacts 92 individually may have different elevations relative to the semiconductor package 62 to accommodate various engineering considerations, if appropriate.

FIG. 8A illustrates that the signal contacts 90 and/or the power contacts 92 are located outside the semiconductor package 62. In this case, the signal contacts 90 and/or the power contacts 92 are raised above the outer surface of the semiconductor package 62 by a predetermined height 94. The predetermined height 94 of the signal contacts 90 and/or the power contacts 92 may have any value and may be different on one or more sides of the semiconductor package 62. Preferably, the value of the predetermined height 94 is appropriate for microprocessors using plastic or ceramic materials for the semiconductor package 62. Preferably, the value of the predetermined height 94 of the signal contacts 90 and/or the power contacts 92 is the same on all sides of the semiconductor package 62.

FIG. 8B illustrates that the signal contacts 90 and/or the power contacts 92 are located flush with the semiconductor package 62. In this case, the signal contacts 90 and/or the power contacts 92 are even with the outer surface of the semiconductor package 62. FIG. 8C illustrates that the signal contacts 90 and/or the power contacts 92 are located partially recessed inside corresponding indentations 98 formed in the semiconductor package 62. In this case, the signal contacts 90 and/or the power contacts 92 are recessed below the outer surface of the semiconductor package 62 by a predetermined height 96. The predetermined height 96 of the signal contacts 90 and/or the power contacts 92 may have any value and may be different on one or more sides of the semiconductor package 62. Preferably, the value of the predetermined height 96 is appropriate for microprocessors using plastic or ceramic materials for the semiconductor package 62. Preferably, the value of the predetermined height 96 of the signal contacts 90 and/or the power contacts 92 is the same on all sides of the semiconductor package 62. The recesses advantageously reduce contamination and/or damage of the signal contacts 90 and/or the power contacts 92. The recesses may also provide mechanical alignment or attachment features for the power connection 24 and/or signal connection 26.

FIG. 8D illustrates that the signal contacts 90 and/or the power contacts 92 are located inside the semiconductor package 62. In this case, the signal contacts 90 and/or the power contacts 92 are disposed inside an inner surface of the semiconductor package 62. This arrangement advantageously eliminates contamination and/or damage of the signal contacts 90 and/or the power contacts 92.

The IC signal connection 48 includes a signal package interface 100. The signal package interface 100 is any type of interface that permits the signal contacts 90 located inside the semiconductor package 62 to operate with the signal connection 26 located outside the semiconductor package 62. The signal package interface 100 may be formed as a separate part from the semiconductor package 62 and then mechanically joined to the semiconductor package 62 using various methods such as insert molding, over molding, snaps, interference press fit, adhesive, and the like. The separate part may be formed of the same or a different material as the semiconductor package 62. Alternatively, the signal package interface 100 may be formed as an integral part of the semiconductor package 62. The signal package interface 100 is illustrated in each figure as simple blocks for the sake of clarity. Practically, the signal package interface 100 may include one or more individual signal package interface 100 corresponding to each signal path.

The mechanical and electrical features and characteristics of the signal package interface 100 depend on the type of signal interface used, as shown in the table 84 in FIGS. 7A and 7B. For example, a capacitive type of signal interface may require that the signal package interface 100 be formed as a dielectric material. In this case, the signal contacts 90 provide one side of the conductive plates required for capacitive signal transfer. The second side of the conductive plates (not shown) is on the outside of the semiconductor package 62 and may be provided on a PCB or on a connector. The signal package interface 100 forms the dielectric material having an appropriate dielectric constant to permit capacitive signal transfer between the conductive plates of signals having appropriate frequencies, amplitudes, etc.

For example, an optical type of signal interface may require that the signal package interface 100 be formed as an optical lens. In this case, the signal contacts 90 form an optical transmitter and/or an optical receiver. The signal package interface 100 forms the optical lens to channel modulated signals in the form of light waves through the semiconductor package 62. Alternatively, the signal package interface 100 may form one or more holes extending through the semiconductor package 62 to permit the signal connection 26, formed as optical fibers, to be mechanically aligned with the optical transmitter and/or the optical receiver inside the IC 22. In this alternative, the one or more holes may also secure the optical fibers to the IC 22. By another example, a transmission line or wireless type of signal interface may require that the signal package interface 100 be formed as an impedance matching device.

The IC power connection 46 includes a power package interface 102. The power package interface 102 is any type of interface that permits the power contacts 92 located inside the semiconductor package 62 to operate with the power connection 24 located outside the semiconductor package 62.

The power package interface 102 may be formed as a separate part from the semiconductor package 62 and then mechanically joined to the semiconductor package 62 such as by insert molding, over molding, snaps, interference press fit, adhesive, and the like. The separate part may be formed of the same or a different material as the semiconductor package 62. Alternatively, the power package interface 102 may be formed as an integral part of the semiconductor package 62. The power package interface 102 is illustrated in each figure as simple blocks for the sake of clarity. Practically, the power package interface 102 may include one or more individual power package interface 102 corresponding to each signal path. The mechanical and electrical features and characteristics of the power package interface 102 depend on the type of method used to delivery power from the power connection 24 to the IC 22 via the power contacts 92.

In FIGS. 8A, 8B, 8C and 8D, the features are illustrated therein are for illustration and not for limitation, and any feature from any one of the Figures may be combined with any feature from another of the Figures to provide multiple combinations of features. For example, the signal contacts 90 located inside the semiconductor package 62, as shown in FIG. 8D may be combined with the power contacts 92 located outside, flush with, or recessed in the semiconductor package 62, as shown in FIGS. 8A, 8B and 8C, respectively.

FIGS. 9A, 9B and 9C illustrate a plan view of the IC 22, as shown in FIG. 8A, 8B, 8C or 8D and FIG. 5, having signal contacts 90 and/or power contacts 92 located on the top 68, bottom 70 and/or side(s) 72, respectively, of the IC 22 representing the package design system 16 in accordance with the preferred embodiments of the present invention. In each of the three figures, the signal contacts 90 and/or power contacts 92 are represented as equally spaced squares for illustration purposes only. Practically, the signal contacts 90 and/or power contacts 92 may have any appropriate size, shape, thickness, dimension, pitch, etc. Hence, the arrangement of the signal contacts 90 and/or power contacts 92 on one or more of the top 68, bottom 70 and/or side(s) 72 of the IC 22 provides multiple embodiments that are within the scope of the specification.

More particularly, FIG. 9A illustrates the top 68 of the IC 22 being available to carry signal contacts 90 and/or power contacts 92. FIG. 9B illustrates the bottom 70 of the IC 22 being available to carry signal contacts 90 and/or power contacts 92. In the preferred embodiments of the present invention, the signal contacts 90 are located on the bottom 70 of the IC 22, as shown in FIG. 9B. FIG. 9C illustrates the side(s) 72 of the IC 22 being available to carry signal contacts 90 and/or power contacts 92. In the preferred embodiments of the present invention, the power contacts 92 are located on the side(s) 72 of the IC 22, as shown in FIG. 9C.

FIGS. 10A, 10B and 10C illustrate more limited examples of the arrangement and location of the signal contacts 90 and/or power contacts 92 on one or more of the top 68, bottom 70 and/or side(s) 72 of the IC 22. FIG. 10A illustrates an outer portion 104 of the top 68 of the IC 22 being available to carry signal contacts 90 and/or power contacts 92. An inner portion 106 of the IC 22 is available to receive a heat sink, a heat spreader, or the like. Preferably, the heat sink is in mechanical contact with the IC 22 to provide a thermal path for heat to be drawn away from the IC 22.

FIG. 10B illustrates an outer portion 108 and an inner portion 110 of the top 68 of the IC 22 being available to carry signal contacts 90 and/or power contacts 92. Preferably, the outer portion 108 carries the power contacts 92 and the inner portion 110 carries the signal contacts 90. This arrangement is advantageous when the power contacts 92 and the signal contacts 90 have different types of signals interfaces, as shown in table 84 of FIGS. 7A and 7B, such as, for example, when the power contacts 92 are conductive and the signal contacts 90 are capacitive.

FIG. 10C illustrates an outer portion 112 and an inner portion 114 of the top 68 of the IC 22 each being available to carry signal contacts 90 and/or power contacts 92. Preferably, the outer portion 112 carries the power contacts 92 and the inner portion 114 carries the signal contacts 90.

In FIG. 11, the connector 112 includes appropriate electrical and mechanical features and characteristics to provide an electrical interface between the signal connection 26 and/or power connection 24 and the IC 22. The connector 112 is compatible with the various types of signal interfaces described with table 84 in FIGS. 7A and 7B.

According to the preferred embodiments of the present invention, the connector 112 carries the voltage regulator module 38 and/or the decoupling capacitance 42, as is described in further detail below. Since the connector 112 carries the IC 22, the voltage regulator module 38 and/or the decoupling capacitance 42 are located as close to the IC 22 as possible, thereby minimizing the length of the power connection 24. Minimizing the length of the power connection 24, in turn, minimizes the impedance and inductance of the power connection 24 to permit the voltage regulator module 38 and/or the decoupling capacitance 42 to deliver low voltage, narrow voltage margin and high current to a high performance IC 22.

The connector 112 may have various forms, shapes, and sizes and be made of various materials, depending on various engineering considerations. The various forms, shapes, sizes are represented in FIG. 11 with the dashed lines 120, 122 and 124 on side 74 of the IC 22 and the dashed lines 126, 128 and 130 on the side 72 of the IC 22. Dashed lines 120, 122 and 124 horizontally align with dashed lines 126, 128 and 130, respectively. The dashed lines represent various places where the connector 112 may end to form a particular form, shape or size of a connector 112. Note that the dashed lines are for illustration purposes only and should not be interpreted to limit the scope of the connector 112.

For example, an upper part of the connector 112 that is located above the top 68 of the IC 22 may extend only down to dashed lines 120 and 126 essentially forming a cover, otherwise known as a plate or cap, over the IC 22. In this case, the connector 112, formed as a cover, has a bottom surface that is located coplanar with or above the top 68 of the IC 22. The connector 112, formed as a cover, may further extend down the sides 72 and 74 of the IC 22 to dashed lines 122 and 128. In this case, the connector 112, formed as a cover, has a bottom surface that is located between the top 68 and the bottom 70 of the IC 22. The connector 112, formed as a cover, may further extend down the sides 72 and 74 of the IC 22 to dashed lines 124 and 130. In this case, the connector 112, formed as a cover, has a bottom surface that is located coplanar with or below the bottom 70 of the IC 22, and may extend to a top surface of the PCB 114, if present. Note that the connector 112, formed as a cover, is shown to extend beyond each side 72 and 74 of the IC 22, but should not be interpreted as being limited as such. Alternatively, the connector 112, formed as a cover, may be flush with or inside the sides 72 and 74 of the IC 22. FIG. 12A illustrates a more detailed illustration of the connector 112, formed as a cover.

By another example, an lower part of the connector 112 that is located below the bottom 70 of the IC 22 may extend only up to dashed lines 124 and 130 essentially forming a socket, otherwise known as a cup or pocket, under the IC 22. In this case, the connector 112, formed as a socket, has a top surface that is located coplanar with or below the bottom 70 of the IC 22. The connector 112, formed as a socket, may further extend up the sides 72 and 74 of the IC 22 to dashed lines 122 and 128. In this case, the connector 112, formed as a socket, has a top surface that is located between the bottom 70 and the top 68 of the IC 22. The connector 112, formed as a socket, may further extend up the sides 72 and 74 of the IC 22 to dashed lines 120 and 126. In this case, the connector 112, formed as a socket, has a top surface that is located coplanar with or above the top 68 of the IC 22. Note that the connector 112, formed as a socket, is shown to extend beyond each side 72 and 74 of the IC 22, but should not be interpreted as being limited as such. Alternatively, the connector 112, formed as a socket, may be flush with or inside the sides 72 and 74 of the IC 22. FIG. 12B illustrates a more detailed illustration of the connector 112, formed as a socket.

By still another example, a middle part of the connector 112 that is located around the sides 72 and 74 of the IC 22 essentially forming a frame, otherwise known as a ring or border, around a perimeter the IC 22. In this case, the connector 112, formed as a frame, may have a top surface that is located above the top 68 of the IC 22, or between the top 68 and bottom 70 of the IC 22, as represented by dashed lines 122 and 128. The connector 112, formed as a frame, may have a bottom surface that is located below the bottom 70 of the IC 22, or between the top 68 and bottom 70 of the IC 22, as represented by dashed lines 124 and 130, and may extend to a top surface of the PCB 114, if present. FIG. 12C illustrates a more detailed illustration of the connector 112, formed as a frame.

These three examples of the connector 112, formed as a cover, a frame or a socket, illustrate examples of the various forms, shapes and sizes that the connector 112 can have. Note that the descriptions in the examples above blend into each other. For example, the description of the cover blends into the description of the frame, and the description of the frame blends into the description of the socket. Hence, these examples illustrate that the connector 112 may be located on any one or more sides of the IC 22, without being limited to the illustration in FIG. 11.

The connector 112 may have any suitable material including, without limitation, plastic, metal, and may have any suitable characteristics including, without limitation, being conductive or nonconductive. Preferably, the connector is formed of a nonconductive, plastic material and carries appropriate signal contacts (not shown) and power contacts that operate with the corresponding signal contacts 90 and power contacts 92, respectively, carried by the IC 22. Alternatively, the connector 112 may be formed as a circuit board carrying the voltage regulator module 38 and/or the decoupling capacitance 42, as shown in FIG. 2 above. Alternatively, the connector 112 may be formed as the decoupling capacitance 42, itself, having an integral capacitance structure. These two alternatives are described in further detail below. Alternatively, the connector 112 may be formed as an assembly of discrete parts providing the function of the voltage regulator module 38 and/or the decoupling capacitance 42, without having what might be considered a conventional housing.

The connector 112 may have mechanical features (not shown) that permit the connector 112 to be aligned and/or attached to another structure including, without limitation, the circuit board 114, another connector 140 (illustrated in FIGS. 13 and 14), forming a cover, a socket or a frame, the conductor 116, and the like. The mechanical features may be formed as separate parts that are attached to the connector 112 or integrally formed with the connector 112. The mechanical features include, without limitation, pins, ridges, posts, pegs, bumps, and the like extending beyond one or more surfaces of the connector 112, and/or holes, recesses, troughs, and the like extending into one or more surfaces of the connector 112. The mechanical features may form fasteners themselves, such as snaps, clips, and the like, or may cooperate with separate fasteners to aligned and/or attach the connector 112.

The signal connection 26 and/or the power connection 24 are electrically and mechanically coupled to the connector 112 in such a manner as to align the signal connection 26 and/or the power connection 24 with the preferred and/or alternative locations on the IC 22, as described above. The signal connection 26 and/or the power connection 24 may be formed as a conductor 116 or as a PCB trace 118, as described above.

When the signal connection 26 and the power connection 24 are formed as a conductor 116, the connector 112, a PCB 114 may not be used at all or may be used only to provide mechanical stability for the connector 112. In this case, the connector 112 may be considered as a holder for the IC 22 and for the conductors 116 that carry the signals and the power to the IC 22. If the PCB is present to provide the mechanical stability for the connector 112, then the connector 112 may appear to be somewhat suspended above the circuit board.

The circuit board 114 may be used to route the signal connection 26 and/or the power connection 24 to and/or from the IC 22 using the conductive traces 118. When the circuit board 114 is used, an IC to circuit board signal and/or power interface 132 preferably is used to provide an appropriate connection between the IC 22 and the circuit board 114. Preferably, the interface 132 is located between the bottom 70 of the IC 22 and the top of the circuit board 114. The circuit board 114 may have various types of mechanical features to align and/or secure the IC 22, the connector 112, and/or the conductor 116 including, without limitation, holes, recesses, and the like, that mechanically cooperate with corresponding mechanical features on the mating structure or that use separate fasteners, such as pins, screws, pegs, snaps, clips, and the like to align and/or secure the mating structure.

The interface 132 may be used alone or in combination with the connector 112. When the interface 132 is used in combination with the connector 112, the connector 112 is preferably formed as a socket or a frame to help hold and align the interface 132 against the IC 22. In this case, the interface 132 is located in an inner portion of the connector 112, formed as a socket or frame, with the socket or frame forming an outer portion of the connector 112 at the perimeter of the interface 132. The interface 132 may be formed as a separate part from the IC 22 or integrally formed with the IC 22 as a single unit. When the interface 132 is formed as a separate part from the IC 22, the interface 132 may be separate from the IC 22 or attached to the IC 22. Preferably, the interface 132 is formed as a separate part and is separate from the IC 22. When the interface 132 is integrally formed with the IC 22 as a single unit, the interface 132 may be formed as the semiconductor substrate 60, as shown in FIG. 4B, as the side of the semiconductor package 62, as shown in FIGS. 4C and 8D, or as the PCB 64 or 114, as shown in FIG. 4D or 4E, for example. The interface 132 may take a variety of shapes and sizes and be formed from a variety of materials. Various shapes of the interface 132 as a whole or as individual portions may include round, square, multi-sided shapes and the like, and the interface 132 may be flat or may be bent or formed to have a particular shape.

Material properties of the interface 132 may include solids, fluids, pastes, gels or gases. The material of the interface 132 may have any level of hardness including rigid, flexible, and compressible. Interfaces 132 that are flexible advantageously permit better compliance with manufacturing variations in the IC package and/or the circuit board 114, and easier manufacturing. In some applications, it may be desirable to adjust the characteristics of the material, such as the dielectric constant, of the interface 132 using temperature, pressure or the like. The interface 132 may be formed as a single or multiple layers of material using manufacturing techniques including, without limitation, a layered build-up approach, a spray or vacuum deposited approach, an extruded approach, and the like. The interface 132 may be formed of the same material or different materials. In the case of different materials, a first material forms the carrier and a second material forms the signal and/or power path. The second material, forming the signal and/or power path, may be attached to the first material in ways such as press fit, insert molded, over molded, stitched, and the like.

The interface 132, the signal contacts 90 and/or the power contact 92 on the IC 22, and corresponding signal contact and/or power contacts on the PCB 64 or 114, the conductor 116, the connector 112 or the remote circuit 52 may be arranged in a variety of ways. For example, the various arrangements of the contacts and the interface 132 may include, without limitation, contact to interface 132, contact to interface 132 to contact, interface 132 to contact to interface 132, interface 132 to interface 132, contact to interface 132 to interface 132 to contact, and contact to interface 132 to contact to interface 132 to contact, and the like. Hence, the interface 132 may be formed on the outer surface of the IC 22, PCB 64 or 114, the conductor 116, the connector 112 or the remote circuit 52, or be formed as an inner layer thereof. Electrically, the interface 132 may support any type of signaling transfer between the IC 22 and the remote circuit 52 including, without limitation, single-ended serial, single-ended parallel, differential serial and differential parallel signaling. Further, the interface 132 and/or the signal contacts 90 and/or the power contacts, 92 and are designed to optimize electrical engineering considerations including inductance, capacitance, cross-talk, propagation delay, skew and impedance.

The interface 132 may alternatively be used as an interface between the IC 22 and the conductor 116, the connector 112 and another IC in an analogous manner as described with reference to interfacing to the circuit board 114. The interface 132 is compatible with the various types of signal interfaces listed in table 84 as shown in FIGS. 7A and 7B. For example, when the interface 132 is compatible with the conductive type of signal interface, the interface 132 preferably forms a nonconductive material carrying multiple discrete conductive segments that correspond to and align with the location of the signal contacts 90 that are compatible with the conductive type of signal interface. When the interface 132 is compatible with the capacitive type of signal interface, the interface 132 preferably forms a dielectric material having a suitable dielectric constant and a suitable predetermined thickness. In this case, the signal contacts 90 are preferably made of metal to provide one side of the conductive plates needed for capacitive signal transfer. The other side of the conductive plates (not shown) would be provided on the circuit board 114.

When the interface 132 is compatible with the inductive type of signal interface, the interface 132 preferably forms a nonconductive material having a suitable predetermined thickness. In this case, the interface 132 provides an optimal separation between one conductive element (not shown) in the IC 22 and another conductive element (not shown) in or on the circuit board. When the interface 132 is compatible with the optical type of signal interface, the interface 132 preferably forms an optical transmission channel, such as a lens, adapted to carry optical signals in the form of modulated light waves. Alternatively or in combination with the optical transmission channel, the interface 132 may be used to align and/or focus the optical signals between the IC 22 and the circuit board 114. When the interface 132 is compatible with the transmission line type of signal interface, the interface 132 preferably forms a transmission line interface or channel to provide for a proper impedance match between the IC 22 and the circuit board 114. When the interface 132 is compatible with the wireless type of signal interface, the interface 132 preferably forms a radio frequency (RF) channel suitable for carrying the RF signal from the IC 22 to the circuit board 114.

The interface 132, in cooperation with the package design system 16, advantageously permits the operating frequency of the microprocessor to increase without degrading the integrity of the signal. For example, the interface 132, forming a dielectric material, and the package design system 16, forming conductive plates as the signal contacts 90, together provide a capacitive type of signal interface. In this case the resistance due to inductance, associated with the conductive interconnection between the semiconductor die located inside the microprocessor and the motherboard, is minimized using a capacitive type of signal interface. High frequency signal operation may be transferred without increasing the impedance of the signal path that compromises the integrity of the signal. Hence, this construction maximizes the performance and minimize the cost of interconnection technology used to achieve high-speed digital signal designs.

FIG. 12A illustrates the connector 112, formed as a cover, wherein the connector 112 has side parts that extend beyond each side 72 and 74 of the IC 22, has an upper part that is located above the top 68 of the IC 22, and has a lower part that is located flush with or a little below the bottom 70 of the IC 22. Preferably, the connector 112, formed as a cover, surrounds all four sides (72, 74, one side facing out of the page, one side facing into the page) of the IC 22. The connector 112, formed as a cover, is beneficial when the IC 22 is mounted directly on the PCB 114.

FIG. 12B illustrates an elevation view of the IC 22, as shown in FIG. 11, located in a connector 112 formed as a socket in accordance with the preferred embodiments of the present invention. FIG. 12B illustrates the connector 112, formed as a socket, wherein the connector 112 has side parts that extend beyond each side 72 and 74 of the IC 22, has a lower part that is located below the bottom of the IC 22, and has an upper part that is located flush with or a little above the top 68 of the IC 22. Preferably, the connector 112, formed as a socket, surrounds all four sides (72, 74, one side facing out of the page, one side facing into the page) of the IC 22. Preferably, the connector 112, formed as a socket, is mounted on the PCB 114 and carries the IC to PCB signal and/or power interface 132. The connector 112, formed as a socket, is beneficial when the socket is directly mounted on the PCB 114 and the socket carries the IC 22.

FIG. 12C illustrates an elevation view of the IC 22, as shown in FIG. 11, located in a connector 112 formed as a frame in accordance with the preferred embodiments of the present invention. FIG. 12C illustrates the connector 112, formed as a frame, wherein the connector 112 has side parts that extend beyond each side 72 and 74 of the IC 22, has a lower part that is located flush with or a little below the bottom of the IC 22, and has an upper part that is located flush with or a little above the top 68 of the IC 22. The connector 112, formed as a frame, is beneficial when the IC 22 is directly mounted on the PCB 114.

FIG. 13 illustrates an elevation view of the IC 22, as shown in FIG. 11, coupled to the remote circuit 52 located in a connector 112 or on PCB 114 in accordance with the preferred embodiments of the present invention. The remote circuit 52 includes a remote circuit signal connection 134 and a remote circuit power connection 136, and has a top 144, a bottom 146, and sides 148 and 150. A connector 140 is disposed on one or more sides of the remote circuit 52. The remote circuit 52 may be carried by the connector 140 or may be mounted on a PCB 114. A remote circuit to PCB signal and/or power interface 138 provides paths to route signals and/or power, respectively, between the PCB 114 and the remote circuit 52. The remote circuit 52, the connector 140, the interface 138, the PCB 114, the remote circuit signal connection 134 and the remote circuit power connection 136 have features, characteristics, functions and operation analogous to the IC 22, the connector 112, the interface 132, the PCB 114, the integrated circuit signal connection 48 and the integrated circuit power connection 46, respectively, as described above.

In addition, the signal connection 26, formed as conductor 116 or as a PCB trace 118, may transfer signals between any one or more of the top 68, the bottom 70, and the side(s) 72 and 74 of the IC 22 and any one or more of the top 144, the bottom 146, and the side(s) 148 and 150 of the remote circuit 52. Preferably, the signal connection 26 is formed as a PCB trace 118 and transfers signals between the bottom 70 of the IC and the bottom 146 of the remote circuit 52.

The power connection 24, formed as a conductor 116, formed as conductor 116 or as a PCB trace 118, may be coupled to the any one or more of the top 144, the bottom 146, and the side(s) 148 and 150 of the remote circuit 52. Preferably, the power connection 24 is formed as a conductor 116 and couples power to the side(s) 148 and 150 of the remote circuit 52. Note that the power connection 24 being coupled to the remote circuit 52 is an added feature that is not shown in FIGS. 1 and 2 for the sake of clarity of those two figures. Typically, a remote circuit that is active requires power from the power delivery system 12 and a remote circuit that is passive does not require power from the power delivery system 12.

The IC 22 and the remote circuit 52 may carry the same type or different types of circuits, including, without limitation, microprocessors, digital signal processors (DSPs), memory devices, audio-visual interface devices, user interface devices, and may be active devices and/or passive devices.

A break 142 in the PCB 114 illustrates that the PCB 114 for the IC 22 may be the same or different PCB for the remote circuit 52. When the IC 22 and the remote circuit 52 are mounted on the same PCB 114, then the signal connection 26 and/or the power connection 24 may be made via the conductor 116 or the PCB trace 118. When the IC 22 and the remote circuit 52 are mounted different PCBs, then the signal connection 26 and/or the power connection 24 may be made via the conductor 116 or via PCB traces 118 on each PCB with a conductor (not shown) forming a jumper between the PCB traces 118 on the different PCBs.

The connector 112 may be integrally formed with the connector 140 as a single connector for both the IC 22 and the remote circuit 52. Alternatively, the connector 112 and the connector 140 may be formed as separate parts and then mechanically attached to each other, or used separately. When the parts are mechanically attached to each other, any side of the connector 112 may be attached to any side of the connector 140.

The interface 132 may be integrally formed with the interface 138 as a single interface for both the IC 22 and the remote circuit 52. Alternatively, the interface 132 and the interface 138 may be formed as separate parts and then mechanically attached to each other, or used separately. When the parts are mechanically attached to each other, any side of the interface 132 may be attached to any side of the interface 138.

Although FIG. 13 illustrates the IC 22 and the remote circuit 52 next to each other in a side-by-side arrangement, FIG. 13 is not intended to be limited to such an arrangement. Practically, the IC 22 and the remote circuit 52 may have any physical arrangement relative to each other. For example, the IC 22 and the remote circuit 52 may have a stacked arrangement, as shown in further detail in FIG. 14. Further, although FIG. 13 illustrates only two circuits (i.e., the IC 22 and the remote circuit 52), FIG. 13 is not intended to be limited to only two circuits. Practically, any number of ICs and/or remote circuits may operate together using the same features, characteristics, functions and operation as described above between the IC 22 and the remote circuit 52.

FIG. 14 illustrates an elevation view of the IC 22 and the remote circuit 52, as shown in FIG. 13, coupled together in a stacked arrangement in accordance with the preferred embodiments of the present invention. FIG. 14 shows connector 140, carrying the remote circuit 52, being located above or on top of the connector 112, carrying the IC 22. The signal connection 26 may be routed to another remote circuit 152 via the conductor 116 or via PCB traces (not shown). FIG. 14 shows various signal connections 26 and/or power connections 24 that may be possible when the IC 22 and the remote circuit 52 are coupled together in the stacked arrangement. The stacked arrangement is advantageous for partner, cluster or master/slave types of ICs that are substantially dedicated to work with each other, but are packaged separately to optimize the cost and/or performance of the individual semiconductor packages. Such partner ICs include, without limitation, microprocessors and memory devices.

FIGS. 15, 16, 17, 18, and 19 each illustrate an elevation view of the IC 22 and the remote circuit 52, as shown in FIG. 13 or 14, each having a voltage regulator module 38 and decoupling capacitance 42 disposed at various locations in accordance with the preferred embodiments of the present invention. In each of these figures, the IC signal connection 46, the IC power connection 48, the remote circuit signal connection 134, the remote circuit power connection 136, the reference numbers for the top, bottom and sides of the IC 22 and the remote circuit 52, and the reference numbers for the six dashed lines for each connector 112 and 140 are not shown for the sake of clarity in these figures.

The signal connection 26 and the power connection 24 are each illustrated as being coupled to one side of the IC 22 and the remote circuit 52 for the sake of clarity in these five figures. Practically, the signal connection 26 and/or the power connection 24 may be coupled to one or more sides of the IC 22 and/or the remote circuit 52, as described above.

These five figures introduce new system blocks including a voltage regulator module 154 and decoupling capacitance 158 that are not illustrated in FIGS. 1 and 2 above for the reason stated in the description for FIG. 13. The introduction of the voltage regulator module 154 and/or the decoupling capacitance 158 provides synergy with the voltage regulator module 38 and the decoupling capacitance 42 by introducing a variety of alternative paths to route the signals and/or power to the IC 22 and the remote circuit 52. Solid lines represent the preferred path and the dashed lines represent alternate paths. This synergy applies to each of the five figures. The synergy relates to the specifications of the remote circuit 52, the voltage regulator module 154, the decoupling capacitance 158, the IC 22, the voltage regulator module 38, and the decoupling capacitance 42 in an analogous manner as that described above for the IC 22, the voltage regulator module 38, and the decoupling capacitance 42. The specifications of the IC 22 and the remote circuit 52 typically determine whether one or two voltage regulator modules or whether one or two decoupling capacitances are required. The physical proximity of the IC 22 and the remote circuit 52 to the voltage regulator modules and the decoupling capacitances is also a factor to minimize the impedance and resulting voltage drop, as described above. Hence, the specifications for the remote circuit 52 and the IC 22 may permit the remote circuit 52 to share the voltage regulator module 38 and/or the decoupling capacitance 42 along with the IC 22. Otherwise, the remote circuit 52 must use its own voltage regulator module 154 and/or the decoupling capacitance 158.

The voltage regulator module 38, the decoupling capacitance 42, the voltage regulator module 154 and the decoupling capacitance 158 are shown in a particular part of the connector 112 or 140 for illustration purposes only and for the sake of clarity of the drawings. As described above with reference to FIG. 11, each of these elements may be located in any part of the connector 112 or 140 including, without limitation, the cover, the socket and/or the frame, as shown in FIGS. 12A, 12B and 12C.

FIG. 15 illustrates an elevation view of the IC 22 and the remote circuit 52, as shown in FIG. 13 or 14, each having the voltage regulator module 38 and 154 and the decoupling capacitance 42 and 158 located in the connector 112 and 140, respectively, in accordance with the preferred embodiments of the present invention. The power delivery system 12 is coupled to the IC 22 to provide power to the IC 22, as described with reference to FIG. 2. As described above with reference to FIG. 2, the preferred path for high voltage, low current power delivery is from the power supply 34 to the voltage regulator module 38 via the power connection 36 using the conductor 116 or the PCB trace 118, then to the decoupling capacitance 42 as low voltage, high current power via the power connection 40 using the conductor 116, then to the IC 22 as low voltage, high current power via the power connection 44 using the conductor 116. Also as described with reference to FIG. 2, the voltage regulator module 38 may be alternatively directly coupled to the IC 22 as low voltage, high current power via the power connection 54 using the conductor 116, without using the decoupling capacitance 42.

In an analogous manner as describe with reference to FIG. 2, the power delivery system 12 is coupled to the remote circuit 52 to provide power to the remote circuit 52. The preferred path for power delivery is from the power supply 34 to the voltage regulator module 154 as high voltage, low current power via the power connection 36 using the conductor 116 or the PCB trace 118, then to the decoupling capacitance 158 as low voltage, high current power via the power connection 156 using the conductor 116, then to the remote circuit 52 as low voltage, high current power via the power connection 166 using the conductor 116. Also in an analogous manner as describe with reference to FIG. 2, the voltage regulator module 154 alternatively may be directly coupled to the remote circuit 52 as low voltage, high current power via a voltage regulator module to remote circuit power connection 160 using the conductor 116, without using the decoupling capacitance 158.

Alternatively, the voltage regulator module 38 may deliver low voltage, high current power to the decoupling capacitance 158 via power connection 162 using the conductor 116 or, alternatively, directly to the remote circuit 52 via the power connections 162 and 160 using the conductor 116, without using the voltage regulator module 154. Alternatively, the decoupling capacitance 42 may deliver low voltage, high current power directly to the remote circuit 52 via power connection 164 using the conductor 116, without using the voltage regulator module 154 or the decoupling capacitance 158.

Hence, in FIG. 15, the connector 112 may carry only the voltage regulator module 38, only the decoupling capacitance 42, or both the voltage regulator module 38 and the decoupling capacitance 42. Similarly, the connector 140 may carry neither the voltage regulator module 154 or the decoupling capacitance 158, only one of the voltage regulator module 154 and the decoupling capacitance 158, or both the voltage regulator module 154 and the decoupling capacitance 158. The particular desired combination depends on various engineering considerations including, without limitation, the types of circuits employed in the IC 22 and the remote circuit 52, the type of signal interface used as shown in table 84 of FIGS. 7A and 7B, the desired characteristics of the thermal management system 18, etc., as described herein.

FIG. 16 illustrates an elevation view of the IC 22 and the remote circuit 52, as shown in FIG. 13 or 14, each having the voltage regulator module 38 and 154 and the decoupling capacitance 42 and 158 located on a conductor 116 and 117, respectively, in accordance with the preferred embodiments of the present invention. The power delivery system 12 is coupled to the IC 22 to provide power to the IC 22, as described with reference to FIG. 2. As described with reference to FIG. 2, the preferred path for high voltage, low current power delivery is from the power supply 34 to the voltage regulator module 38 via the power connection 36 using the conductor 116, then to the decoupling capacitance 42 as low voltage, high current power via the power connection 40 using the conductor 116, then to the IC 22 as low voltage, high current power via the power connection 44 using the conductor 116. Also as described with reference to FIG. 2, the voltage regulator module 38 may be alternatively directly coupled to the IC 22 as low voltage, high current power via the power connection 54 using the conductor 116, without using the decoupling capacitance 42.

In an analogous manner as describe with reference to FIG. 2, the power delivery system 12 is coupled to the remote circuit 52 to provide power to the remote circuit 52. The preferred path for power delivery is from the power supply 34 to the voltage regulator module 154 as high voltage, low current power via the power connection 36 using the conductor 117, then to the decoupling capacitance 158 as low voltage, high current power via the power connection 156 using the conductor 117, then to the remote circuit 52 as low voltage, high current power via the power connection 166 using the conductor 117. Also in an analogous manner as describe with reference to FIG. 2, the voltage regulator module 154 alternatively may be directly coupled to the remote circuit 52 as low voltage, high current power via a voltage regulator module to remote circuit power connection 160 using the conductor 117, without using the decoupling capacitance 158.

Alternatively, the voltage regulator module 38 may deliver low voltage, high current power to the decoupling capacitance 158 via power connection 162 using the conductor 116 and/or 117 or, alternatively, directly to the remote circuit 52 via the power connections 162 and 160 using the conductor 116 and/or 117, without using the voltage regulator module 154.

Alternatively, the decoupling capacitance 42 may deliver low voltage, high current power directly to the remote circuit 52 via power connection 164 using the conductor 116 and/or 117, without using the voltage regulator module 154 or the decoupling capacitance 158.

Hence, in FIG. 16, the conductor 116 may carry only the voltage regulator module 38, only the decoupling capacitance 42, or both the voltage regulator module 38 and the decoupling capacitance 42. Similarly, the conductor 117 may carry neither the voltage regulator module 154 or the decoupling capacitance 158, only one of the voltage regulator module 154 and the decoupling capacitance 158, or both the voltage regulator module 154 and the decoupling capacitance 158. The particular desired combination depends on various engineering considerations including, without limitation, the types of circuits employed in the IC 22 and the remote circuit 52, the type of signal interface used as shown in table 84 of FIGS. 7A and 7B, the desired characteristics of the thermal management system 18, etc., as described herein.

FIG. 17 is an elevation of the IC 22 and the remote circuit 52, as shown in FIG. 13 or 14, each having the voltage regulator module 38 and 154 and the decoupling capacitance 42 and 158, respectively, located on the PCB 114 in accordance with the preferred embodiments of the present invention. The power delivery system 12 is coupled to the IC 22 to provide power to the IC 22, as described with reference to FIG. 2. As described with reference to FIG. 2, the preferred path for high voltage, low current power delivery is from the power supply 34 to the voltage regulator module 38 via the power connection 36 using the PCB trace 118, then to the decoupling capacitance 42 as low voltage, high current power via the power connection 40 using the PCB trace 118, then to the IC 22 as low voltage, high current power via the power connection 44 using the PCB trace 118 and the conductor 116. Also as described with reference to FIG. 2, the voltage regulator module 38 may be alternatively directly coupled to the IC 22 as low voltage, high current power via the power connection 54 using the PCB trace 118 and the conductor 116, without using the decoupling capacitance 42.

In an analogous manner as describe with reference to FIG. 2, the power delivery system 12 is coupled to the remote circuit 52 to provide power to the remote circuit 52. The preferred path for power delivery is from the power supply 34 to the voltage regulator module 154 as high voltage, low current power via the power connection 36 using the PCB trace 118, then to the decoupling capacitance 158 as low voltage, high current power via the power connection 156 using the PCB trace 118, then to the remote circuit 52 as low voltage, high current power via the power connection 166 using the PCB trace 118 and the conductor 116. Also in an analogous manner as describe with reference to FIG. 2, the voltage regulator module 154 alternatively may be directly coupled to the remote circuit 52 as low voltage, high current power via a voltage regulator module to remote circuit power connection 160 using the PCB trace 118 and the conductor 116, without using the decoupling capacitance 158.

Alternatively, the voltage regulator module 38 may deliver low voltage, high current power to the decoupling capacitance 158 via power connection 162 using the using the PCB trace 118 or, alternatively, directly to the remote circuit 52 via the power connections 162 and 160 using the PCB trace 118 and the conductor 116, without using the voltage regulator module 154. Alternatively, the decoupling capacitance 42 may deliver low voltage, high current power directly to the remote circuit 52 via power connection 164 using the PCB trace 118 and the conductor 116, without using the voltage regulator module 154 or the decoupling capacitance 158.

Hence, in FIG. 17, the PCB 114 may carry only the voltage regulator module 38, only the decoupling capacitance 42, or both the voltage regulator module 38 and the decoupling capacitance 42. Similarly, the conductor 117 may carry neither the voltage regulator module 154 or the decoupling capacitance 158, only one of the voltage regulator module 154 and the decoupling capacitance 158, or both the voltage regulator module 154 and the decoupling capacitance 158. The particular desired combination depends on various engineering considerations including, without limitation, the types of circuits employed in the IC 22 and the remote circuit 52, the type of signal interface used as shown in table 84 of FIGS. 7A and 7B, the desired characteristics of the thermal management system 18, etc., as described herein.

FIG. 18 is an elevational view of the IC 22 and the remote circuit 52, as shown in FIG. 13 or 14, each having a voltage regulator module 38 and 154 located on a conductor 116 and 117, respectively, and decoupling capacitance 42 and 158 located in a connector 112 and 140, respectively, in accordance with the preferred embodiments of the present invention. The power delivery system 12 is coupled to the IC 22 to provide power to the IC 22, as described with reference to FIG. 2. As described with reference to FIG. 2, the preferred path for high voltage, low current power delivery is from the power supply 34 to the voltage regulator module 38 via the power connection 36 using the conductor 116, then to the decoupling capacitance 42 as low voltage, high current power via the power connection 40 using the conductor 116, then to the IC 22 as low voltage, high current power via the power connection 44 using the conductor 116. Also as described with reference to FIG. 2, the voltage regulator module 38 may be alternatively directly coupled to the IC 22 as low voltage, high current power via the power connection 54 using the conductor 116, without using the decoupling capacitance 42.

In an analogous manner as describe with reference to FIG. 2, the power delivery system 12 is coupled to the remote circuit 52 to provide power to the remote circuit 52. The preferred path for power delivery is from the power supply 34 to the voltage regulator module 154 as high voltage, low current power via the power connection 36 using the conductor 117 and 116, then to the decoupling capacitance 158 as low voltage, high current power via the power connection 156 using the conductor 117, then to the remote circuit 52 as low voltage, high current power via the power connection 166 using the conductor 117. Also in an analogous manner as describe with reference to FIG. 2, the voltage regulator module 154 alternatively may be directly coupled to the remote circuit 52 as low voltage, high current power via a voltage regulator module to remote circuit power connection 160 using the conductor 117, without using the decoupling capacitance 158.

Alternatively, the voltage regulator module 38 may deliver low voltage, high current power to the decoupling capacitance 158 via power connection 162 using the conductor 116 or, alternatively, directly to the remote circuit 52 via the power connections 162 and 160 using the conductor 116, without using the voltage regulator module 154. Alternatively, the decoupling capacitance 42 may deliver low voltage, high current power directly to the remote circuit 52 via power connection 164 using the conductor 116, without using the voltage regulator module 154 or the decoupling capacitance 158.

Hence, in FIG. 18, the conductor 116 carries the voltage regulator module 38 and the connector 112 carries the decoupling capacitance 42. Similarly, the conductor 117 carries the voltage regulator module 154 and the connector 140 carries the decoupling capacitance 158.

FIG. 19 is an elevation of the IC 22 and the remote circuit 52, as shown in FIG. 13 or 14, each having the voltage regulator module 38 and 154 located on the PCB 114 and the decoupling capacitance 42 and 158 located in the connector 112 and 140, respectively, in accordance with the preferred embodiments of the present invention. The power delivery system 12 is coupled to the IC 22 to provide power to the IC 22, as described with reference to FIG. 2. As described with reference to FIG. 2, the preferred path for high voltage, low current power delivery is from the power supply 34 to the voltage regulator module 38 via the power connection 36 preferably using the PCB trace 118 and alternatively using the conductor 116, then to the decoupling capacitance 42 as low voltage, high current power via the power connection 40 preferably using the conductor 116 and alternatively using the PCB trace 118, then to the IC 22 as low voltage, high current power via the power connection 44 preferably using the conductor 116 and alternatively using the PCB trace 118. Also as described with reference to FIG. 2, the voltage regulator module 38 may be alternatively directly coupled to the IC 22 as low voltage, high current power via the power connection 54 preferably using the conductor 116 and via the power connection 162 and 44 alternatively using the PCB trace and the conductor 116, respectively, without using the decoupling capacitance 42.

In an analogous manner as describe with reference to FIG. 2, the power delivery system 12 is coupled to the remote circuit 52 to provide power to the remote circuit 52. The preferred path for power delivery is from the power supply 34 to the voltage regulator module 154 as high voltage, low current power via the power connection 36 preferably using the PCB trace 118 and alternatively using the conductor 116, then to the decoupling capacitance 158 as low voltage, high current power via the power connection 156 preferably using the conductor 116 and alternatively using the PCB trace 118, then to the remote circuit 52 as low voltage, high current power via the power connection 166 preferably using the conductor 116 and alternatively using the PCB trace 118. Also in an analogous manner as describe with reference to FIG. 2, the voltage regulator module 154 alternatively may be directly coupled to the remote circuit 52 as low voltage, high current power via a voltage regulator module to remote circuit power connection 160 preferably using the conductor 116 and alternatively using the PCB trace 118, without using the decoupling capacitance 158.

Alternatively, the voltage regulator module 38 may deliver low voltage, high current power to the decoupling capacitance 158 via power connection 162 preferably using the conductor 116 and alternatively using the PCB trace 118 or, alternatively, directly to the remote circuit 52 via the power connections 162 preferably using the conductor 116 or alternatively using the PCB trace 118, without using the voltage regulator module 154. Alternatively, the decoupling capacitance 42 may deliver low voltage, high current power directly to the remote circuit 52 via power connection 164 preferably using the conductor 116 and alternatively using the PCB trace 118, without using the voltage regulator module 154 or the decoupling capacitance 158.

Hence, in FIG. 19, the PCB 114 carries the voltage regulator module 38 and the connector 112 carries the decoupling capacitance 42. Similarly, the PCB 114 carries the voltage regulator module 154 and the connector 140 carries the decoupling capacitance 158.

In FIGS. 15, 18 and 19 the decoupling capacitance 42, located in the connector, may take the form of an integral capacitor or a plurality of discrete capacitors soldered directly to the power contacts 92 on the top 68 and/or side(s) 72 and 74 of the IC 22. The decoupling capacitance 42 receives power from power connection 24, formed as the conductor 116, via a connector (not shown) mounted on the IC 22 rather than from the IC 22 via the PCB trace 118. In this case, the connector 112 includes the decoupling capacitance 42, the IC power connection 46, formed as power contacts 92, possibly the solder electrically coupling the decoupling capacitance 42 and the power contacts 92, and possibly the connector (not shown) connecting the conductor 116 and the decoupling capacitance 42. In this example, the connector 112 represents a collection of discrete parts assembled in a particular way rather than a conventional single piece structure such as a plastic cover.

FIG. 20 illustrates an elevation view of the IC 22, as shown in FIGS. 11 to 19, having the thermal management system 18 and an electromagnetic interference (EMI) emission control system 20 in accordance with the preferred embodiments of the present invention. In FIG. 20, the power delivery system 12, the signal transfer system 14, the signal connection 26, the power connection 24, the IC signal connection 48, the IC power connection 46 and the dashed lines 120, 122, 124, 126, 128 and 130 are each not shown for the sake of clarity in the figure, but are intended to be included to form a more detailed design.

The thermal management system 18 includes a first heat sink 200 and alternatively includes a first heat spreader 202 and a first fan 204, each being preferably located above the top 68 of the IC 22. Alternatively, the thermal management system 18 includes a second heat sink 206 and alternatively includes a second heat spreader 208 and a second fan 210, each being preferably located below the bottom 70 of the IC 22.

The first heat sink 200 and the second heat sink 206 provide a path for the heat to be drawn away from the IC 22 via the heat connection 28, as shown in FIG. 1. The first heat sink 200 and the second heat sink 206 may be made of any type of material, and are preferably made of metal. The first heat sink 200 and the second heat sink 206 may have one or more points of contact with the IC 22, the heat spreader 202, and/or the PCB 114. The first heat sink 200 and the second heat sink 206 may have any type of design, and preferably have multiple fins that permit air to travel between adjacent fins. Alternatively, the first heat sink 200 and the second heat sink 206 may be formed as a heat pipe containing a material that changes phases (e.g., between a liquid and a gas) responsive to temperature. The first heat sink 200 and the second heat sink 206 may be secured to the connector 112, the PCB 114 or the conductor 116. The first heat sink 200 and the second heat sink 206 are preferably formed as separate parts, but may be formed as one integral part.

The first heat spreader 202 and the second heat spreader 208 provide a thermally conductive path to conduct heat from the IC 22 to the first heat sink 200 and the second heat sink 206, respectively. The first heat spreader 202 and the second heat spreader 208 may be made of any type of material, are preferably made of metal, and are alternatively made of a gel or glue. Typically, the first heat spreader 202 and the second heat spreader 208 are in direct contact with the IC 22. The first heat spreader 202 and the second heat spreader 208 are preferably formed as separate parts, but may be formed as one integral part.

The first fan 204 and the second fan 210 force air across the first heat sink 200 and the second heat sink 206, respectively, to draw heat away from the first heat sink 200 and the second heat sink 206, respectively. The first fan 204 and the second fan 210 may have any type of design suitable for pushing and/or pulling air across the first heat sink 200 and the second heat sink 206, respectively. The first fan 204 and the second fan 210 may receive power via the PCB 114, the connector 112, or the conductor 116. The first fan 204 and the second fan 210 may be aligned and/or secured to the connector 112, the PCB 114 and/or the conductor 116. The first fan 204 and the second fan 210 are preferably formed as separate parts, but may be formed as one integral part.

The first heat spreader 202, the first heat sink 200 and the first fan 204 are preferably located in a stacked arrangement over the top 68 of the IC 22 to draw heat away from the IC 22. Similarly, the second heat spreader 208, the second heat sink 206 and the second fan 210 are preferably located in a stacked arrangement under the bottom 70 of the IC 22 to draw heat away from the IC 22.

The second heat spreader 208 may also provide the IC to PCB signal and/or power interface 132, as described above. In this case, the IC to PCB signal and/or power interface 132 is constructed, as described above, and further is constructed to have thermally conductive characteristics to provide a heat spreader. Hence, the second heat spreader 208 may also provide the IC to PCB signal and/or power interface 132 advantageously provides each of the signal and/or power interface function and the heat conduit function.

The second heat spreader 208 conducts heat to the PCB 114 or through the PCB 114 using PCB vias, heat pipes, and the like, to the second heat sink 206 located on the bottom of the PCB 114. The second fan 210 cools the second heat sink 206. The connector 112 and/or the PCB 114 may provide suitable alignment and/or attachment mechanisms for one or more of the first heat sink 200, the first heat spreader 202, the first fan 204, the second fan 210, the second heat sink 206 and the second heat spreader 208.

Thermal grease (not shown) may be used between the IC 22 and the first heat spreader 202, between first heat spreader 202 and the first heat sink 200, between the IC 22 and the second heat spreader 208, between the second heat spreader 208 and the PCB 114, and/or between the second heat spreader 208 and the second heat sink 206. The thermal grease improves the thermal conductivity between the adjacent parts.

The EMI emission control system 20 is coupled to the IC 22 over the EMI connection 30, which represents a path for EMI emissions, as describe above. The EMI emission control system 20 may be located on one or more sides of the IC 22, and is preferably located on the four sides 72 and 74 of the IC 22, as shown in FIG. 20. The EMI emission control system 20 may be formed of any type of suitable conductive material including, without limitation, metal, metal coated plastic, flex circuit, conductive ink coated plastic, etc. The EMI emission control system 20 may be rigid or flexible. The EMI emission control system 20 may have any suitable form, shape and size. Preferably, the EMI emission control system 20 is carried by the connector 112, which provides a suitable alignment and/or attachment mechanism. In this case, the EMI emission control system 20 may be located on the inside surface of, embedded within, or on the outside surface of the connector 112. The EMI emission control system 20 and the connector 112 are preferably formed as separate parts that are mechanically aligned and secured together using insert molding, over molding, press fit, snaps, clips, adhesive, and the like, and, alternatively, may be integrally formed as a single part.

The EMI emission control system 20 may be coupled to the first heat spreader 202 and/or the first heat sink 200 via EMI junctions 212 and 214, respectively. Likewise, the EMI emission control system 20 may be coupled to the second heat spreader 208 and/or the second heat sink 206 via EMI junctions 216 and 218, respectively. The EMI junctions 212, 214, 216 and 218 represent conductive paths to electrically connect the respective parts to the EMI emission control system 20. Any EMI emission that is directed towards the first heat spreader 202 and/or the first heat sink 200 will be routed through the first heat spreader 202 and/or the first heat sink 200, then through the EMI junctions 212 and 214, respectively, to the EMI emission control system 20. Hence, the first heat spreader 202 and/or the first heat sink 200 advantageously provide EMI emission control over the top 68 of the IC 22. Likewise, any EMI emission that is directed towards the second heat spreader 208 and/or the PCB 114 will be routed through the second heat spreader 208 and/or the PCB 114, then through the EMI junctions 216 and/or 218, respectively, to the EMI emission control system 20. Hence, the second heat spreader 208 and/or the PCB 114 advantageously provide EMI emission control under the bottom 70 of the IC 22. The EMI emission control system 20 is electrically coupled to a suitable ground potential via EMI ground path 220 to cause any undesirable EMI emissions radiated by the IC 22 to be properly grounded rather than interfering with other circuits in the area and/or to cause any undesirable EMI emissions radiated towards the IC 22 to be properly grounded rather than interfering with the IC 22.

FIG. 21 illustrates a cross-sectional view of the IC 22, formed as a Level Two semiconductor package 62 with an upright semiconductor die 58, having a capacitive type of signal interface on the bottom 70 of the IC 22 and power contacts 92 on the sides 72 and 74 of the IC 22, as shown in FIGS. 4C, 5, 8A, 8B, 9A, 9B, 9C and 11. This package 62 is preferably formed as a low temperature co-fired ceramic ("LTCC") package, as is well known in the art. With the LTCC package, the semiconductor substrate 60 and the bottom side of the semiconductor package 62, as shown in FIG. 4C, are integrally formed as a single piece.

The semiconductor substrate 60 carries signal lead frames 220, power lead frames 222, and the semiconductor die 58. The signal lead frames 220 and the power lead frames 222 each extend from the inside of the semiconductor package 62 to the outside of the semiconductor package 62. The signal lead frames 220 each have a signal pad 226, located inside the semiconductor package 62 and disposed on the top of semiconductor substrate 60, and a signal contact 90, located outside the semiconductor package 62 and disposed on the bottom of semiconductor package 62, as shown in FIGS. 5, 9B and 11. Note that the signal contacts 90 are flush with the semiconductor package 62, as described with reference to FIG. 8B. Preferably, the signal contacts 90 form one side of the conductive plates adapted for use with the capacitive type of signal connection, as shown in table 84 of FIGS. 7A and 7B.

Similarly, the power lead frames 222 each have a power pad 228, located inside the semiconductor package 62 and disposed on the top of semiconductor substrate 60, and a power contact 92, located outside the semiconductor package 62 and disposed on the side(s) 72 and 74 of semiconductor package 62, as shown in FIGS. 5, 9C and 11. Preferably, the power contacts 92 are located on the side 72 of the IC 22. Alternatively, the power contacts 92 are located on the side 74 of the IC 22. Note that the power contacts 92 are raised and outside the semiconductor package 62, as described with reference to FIG. 8A.

The semiconductor die 58 is mounted on the semiconductor substrate 60 in an upright orientation, wherein the top 232 of the semiconductor die 58, having power and/or signal pads (not shown), faces away from the semiconductor substrate 60.

Signal wire bonds 230 connect appropriate signal pads on the top 232 of the semiconductor die 58 to corresponding signal pads 226 disposed on the top of semiconductor substrate 60. Similarly, power wire bonds 234 connect appropriate power pads on the top 232 of the semiconductor die 58 to corresponding power pads 228 disposed on the top of semiconductor substrate 60.

The IC to PCB signal and/or power interface 132 is disposed on the bottom 70 of the IC 22. Preferably, the interface 132 forms a dielectric material having an appropriate dielectric constant, as described above. Preferably, the interface 132 is formed as a separate part and then attached to the bottom 70 of the IC 22.

FIG. 22 illustrates a cross-sectional view of the IC 22, formed as a Level Two semiconductor package 62 with a flipped semiconductor die 58, having a capacitive type of signal interface on the bottom of the IC 22 and power contacts 92 on the sides 72 and 74 of the IC 22, as shown in FIGS. 4C, 5, 8A, 8B, 9A, 9B, 9C and 11. The IC 22 in FIG. 22 is the same as that described for the IC 22 in FIG.

21 except that the semiconductor die 58 is placed up side down, otherwise known as a "flip chip" orientation, on the semiconductor substrate 60, as is well known in the art of semiconductor design. The flip chip orientation requires that the signals and power be routed to the signal contacts 90 and the power contacts 92, respectively, in different ways than with the upright orientation.

The top 232 of the semiconductor die 58 that was facing away from the semiconductor substrate 60 in FIG. 22 is facing towards the semiconductor substrate 60 in FIG. 22. Hence, in FIG. 22, what may be conventionally referred to as the top 232 of the IC 22 in FIG. 21 may be conventionally referred to as the bottom 232 of the IC 22. With the flip chip orientation in FIG. 22, the power and/or signal pads (not shown) on the bottom 232 of the IC 22 face towards the semiconductor substrate 60. The signal pads (not shown) on the bottom 232 of the IC 22 are electrically coupled to corresponding signal pads 226 disposed on the top of semiconductor substrate 60 using coupling techniques that are well known in the art of semiconductor manufacturing.

A second power lead frame 236 has a first power pad 238 and a second power pad 240 electrically coupled to opposite ends of the second power lead frame 236. The first power pad 238 and the second power pad 240 are each located inside the semiconductor package 62 and disposed on the top of semiconductor substrate 60. The first power pad 238 is located outside of and uncovered by the semiconductor die 58 and the second power pad 240 is located under the semiconductor die 58. Preferably, the power wire bond 234 connects the first power pad 238 to the corresponding power pad 228. Alternatively, the first power pad 238 may be integrally formed with the corresponding power pad 228. Alternatively, the first power pad 238 may be welded to the corresponding power pad 228.

FIG. 23 illustrates a cross-sectional view of the IC 22, as shown in FIG. 21, carried by the connector 112, formed as a socket, and supporting a heat sink 200, as shown in FIGS. 4C, 5, 8A, 8B, 10A, 10B, 10C, 11, 12B and 20. The IC 22 in FIG. 23 is the same as that described for the IC 22 in FIG. 21. Additional elements shown in FIG. 23 include the connector 112, formed as a socket, and the heat sink 200.

The IC 22 is carried by a connector 112 formed as a socket, as shown in FIG. 12B. The IC to PCB signal and/or power interface 132 is represented by the curved lines extending from the power contacts 90 across the bottom side of the connector 112. In FIG. 23, the interface 132 capacitively couples only the signals between the IC 22 and the PCB 114 because the power is delivered to the sides 72 or 74 of the IC 22. Preferably, the interface 132 is carried with the bottom of the connector 112, either as a separate piece part or as an integral part of the connector 112.

Power is delivered to the IC 22 via the power contacts 92 located on the sides 72 or 74 of the IC 22. Preferably, power is delivered to the power contacts 92 located on the side 72 of the IC 22 via the power connection 24, formed as a conductor 116. Alternatively, power is delivered to the power contacts 92 located on the side 74 of the IC 22 via the power connection 24, formed as a PCB trace 116 on the PCB and formed as a conductor 116 carried by the connector 116. The connector 112 is electrically coupled to the power contacts 92 via corresponding power contacts 242 carried by the connector 112. The power contacts 92 carried by the connector 112 are made of a suitable conductive material, such as metal, and physically touch and make electrical contact with the power contacts 92 on the IC 22.

The heat sink 200 is disposed on top 68 of and makes direct contact with the top 68 of the IC 22. The heat sink 200 draws heat away from the IC 22. The heat sink 200 is aligned and/or secured in its location, as describe with reference to FIG. 20 above.

FIG. 24 illustrates a cross-sectional view of the IC 22, formed as a Level Two semiconductor package 62 with an upright semiconductor die 58, having a capacitive type of signal interface on the bottom 70 of the IC 22 and power contacts 92 on the top 68 of the integrated circuit, as shown in FIGS. 4C, 5, 8A, 8B, 9A, 9B, 9C and 11. The IC 22 in FIG. 24 is the same as that described for the IC 22 in FIG. 21, except that the power contacts 92 are located on the top 68 of the IC 22.

The power lead frame 222 has the power pad 228 and the power contact 92 electrically connected at each end of the power lead frame 222. The lead frame 222 is routed through the semiconductor substrate 60 and up through the sides 72 and 74 of the semiconductor package 62. The power pad 228 is located inside the semiconductor package 62 and is disposed on the top of semiconductor substrate 60. The power contact 92 is located outside the semiconductor package 62 and disposed on the top 68 of semiconductor package 62, as shown in FIGS. 5, 9A or 10A, and 11. Note that the power contacts 92 are flush with the semiconductor package 62, as described with reference to FIG. 8B. The power wire bond 234 connects appropriate the power pad on the top 232 of the semiconductor die 58 to the corresponding power pad 228.

FIG. 25 illustrates a cross-sectional view of the IC 22, formed as a Level Two semiconductor package 62 with a flipped semiconductor die 58, having a capacitive type of signal interface on the bottom 70 of the IC 22 and power contacts 92 on the top 68 of the IC 22, as shown in FIGS. 4C, 5, 8A, 8B, 9A, 9B, 9C and 11. The IC 22 in FIG. 25 is a combination of that described for the IC 22 in FIGS. 22 and 24, except for the location of the power pad 228. The IC 22 in FIG. 25 has the semiconductor die 58 in the flip chip orientation, as described with reference to FIG. 22, and has the power contacts 92 located on the top 68 of the IC 22, as described with reference to FIG. 24. The power pads 228 are located under the semiconductor die 58 along with the signal pads 226 and are connected to corresponding power pads (not shown) on the bottom 232 of the semiconductor die 58 in a conventional manner.

FIG. 26 illustrates a cross-sectional view of the IC 22, formed as a Level One semiconductor package with a flipped semiconductor die 58, having a capacitive type of signal interface on the bottom 70 of the IC 22 and power contacts 92 on the top 68 of the IC 22, as shown in FIGS. 4B, 5, 8A, 8B, 10A, 10B, 10C, 11 and 20. The IC 22 in FIG. 26 is similar to that described for the IC 22 in FIGS. 22 and 25, except for the type of semiconductor package 62 employed. In FIG. 26, the semiconductor die 58 is mounted on the semiconductor substrate 60 in the flip chip orientation, as described with reference to FIGS. 22 and 25.

FIGS. 22 and 25 each illustrates an LTCC type semiconductor package 62 that encapsulates the semiconductor die 58, as first described with reference to FIG. 21. However, FIG. 26 illustrates a semiconductor package formed as a combination of an encapsulating material 242 and the heat spreader 202.

The encapsulating material 242, otherwise known as a "glob top", is a compliant material having a liquid, paste or gel consistency and is applied directly over the semiconductor die 58, as is well known in the art of semiconductor manufacturing. Preferably, the encapsulating material 242 is applied to the perimeter of the semiconductor die 58 and is permitted to run down the sides of the semiconductor die 58 and make contact with the semiconductor substrate 60. Alternatively, the encapsulating material 242 may also be applied to the top and sides of the semiconductor die 58. In this alternative case, the application of the encapsulating material 242 completely encapsulates the semiconductor die 58 against the semiconductor substrate 60.

The heat spreader 202 is placed in direct contact with the top surface of the semiconductor die 58. The heat spreader is preferably formed as a thermally conductive material, such as metal. Preferably, the heat spreader 202 is held in place by the encapsulating material 242 disposed at the perimeter of the semiconductor die 58 by the encapsulating material 242 drying and solidifying or by an adhesive or sticky characteristic of the encapsulating material 242. In this case, the combination of the heat spreader 202 and the application of the encapsulating material 242 at the perimeter of the semiconductor die 58 completely encapsulates the semiconductor die 58 against the semiconductor substrate 60. Alternatively, the heat spreader 202 may be aligned and/or attached to the semiconductor substrate 60. Alternatively, the heat spreader 202 may be secured in place by the encapsulating material 242 disposed on the top of the semiconductor die 58.

In FIG. 26 the top of the semiconductor substrate 60 carries the power contact 92. In this case, the top of the semiconductor package is represented by reference number 68 and includes the top of the heat spreader 202 and the top of the semiconductor substrate 60.

FIG. 27 illustrates a cross-sectional view of the IC 22, as shown in FIG. 26, carried by a connector 112, formed as a socket, and supporting decoupling capacitance 42 and a heat sink 200, as further shown in FIGS. 12B and 19. The IC 22 and semiconductor package 62 in FIG. 27 is the same as that described for the IC 22 and semiconductor package 62 in FIG. 26. Additional elements shown in FIG. 27 include the connector 112, formed as a socket, and the heat sink 200, and the decoupling capacitance 42.

The decoupling capacitance 42 includes a first conductive plate 244 and a second conductive plate 246 separated by a dielectric material (not shown), forming the decoupling capacitance 42, as is well known in the art of capacitor design. The decoupling capacitance 42 is disposed on the top 68 of the IC 22, and, more particularly, on the top 68 of the heat spreader 202.

A first power connector 256 and an alternate second power connector 258, located on opposite sides of the decoupling capacitance 42, permit power from the power connection 24 to be electrically coupled to the decoupling capacitance 42. The power supply 34 delivers power to the first power connector 256 via the voltage regulator module 38. The second power connector 258 may also receive power from the power supply 34 via the voltage regulator module 38 or provide power to a remote circuit 52.

The first power connector 256 includes a first power terminal 255 and a second power terminal 257. The second power connector 258 includes a first power terminal 251 and a second power terminal 253. Preferably, the first power terminal 255 of the first power connector 256 and the first power terminal 251 of the second power connection 258 are integrally formed with the second conductive plate 246 as a single unit, such as by metal stamping, blanking or forming, but may be formed as separate piece parts that are electrically coupled to the second conductive plate 246, such as by soldering, welding, and the like. Likewise, the second power terminal 257 of the first power connector 256 and the second power terminal 253 of the second power connection 258 are integrally formed with the first conductive plate 244 as a single unit, such as by metal stamping, blanking or forming, but may be formed as separate piece parts that are electrically coupled to the first conductive plate 244, such as by soldering, welding, and the like.

The power connection 24 includes a power line 254 and a ground line 252, as are well known in the art and as are referred to above with reference to FIG. 1. The power line 254 carries a predetermined voltage potential and the ground line 252 carries a ground potential. The power line 254 routes power to the decoupling capacitance 42 and the ground line 252 provides a return path for the ground potential from the decoupling capacitance 42. The power line 254 is electrically coupled to the first power terminal 255 of the first power connector 256 and is electrically coupled to the first power terminal 251 of the second power connection 258. The ground line 252 is electrically coupled to the second power terminal 257 of the first power connector 256 and is electrically coupled to the second power terminal 253 of the second power connection 258. With these connections, the first conductive plate 244 carries the predetermined voltage potential and the second conductive plate 246 carries the ground potential.

The first conductive plate 244 of the decoupling capacitance 42 includes one or more power members 250 that is preferably formed with the first conductive plate 244, such as by metal stamping, blanking or forming, but may also be formed as a separate piece part and then electrically coupled to the first conductive plate 244, such as by solder, welding, and the like. The power members 250 electrically contact the power contacts 92, corresponding to the voltage potential, on the IC 22 preferably on the top of the semiconductor substrate 60 for the level two semiconductor package 62, as shown in FIG. 27.

The second conductive plate 246 of the decoupling capacitance 42 includes one or more ground members 248 that is preferably formed with the second conductive plate 246, such as by metal stamping, blanking or forming, but may also be formed as a separate piece part and then electrically coupled to the second conductive plate 246, such as by solder, welding, and the like. The ground members 248 electrically contact the ground contacts 92, corresponding to the ground potential, on the IC 22 preferably on the top of the semiconductor substrate 60 for the level two semiconductor package 62, as shown in FIG. 27.

Preferably, the power members 250 and the ground members 248 are each formed as compliant spring members, but may be formed as rigid members, such as pins, posts, and the like. Preferably, the power members 250 and the ground members 248, formed as compliant spring members, have legs that are angled away from the semiconductor die 58 and feet that are turned upwards away from the semiconductor substrate 60. Alternatively, the power members 250 and the ground members 248, formed as compliant spring members, may have arms that are curled inward in a semi-circular or semi-elliptical fashion with hands curled inward towards the center of the circle or ellipse. The upturned feet or the inward curled hands permit a solder-less connection for easy and convenient assembly. The compliant spring members advantageously reduce the compression forces on the IC 22 along the Z-axis.

The heat sink 200 is disposed on top 68 of the IC 22. More particularly, the heat sink 200 is disposed on top 68 of the decoupling capacitance 42. The heat spreader 202 dissipates the non-uniform heat density on the semiconductor die 58.

The heat sink 200 conducts heat away from the semiconductor die 58 via the heat spreader 202 and/or the decoupling capacitance 42.

Preferably, the decoupling capacitance 42 has a hole extending through the center portion of the first conductive plate 244, the second conductive plate 246, and the dielectric material to permit the heat sink 200 to directly contact the heat spreader 202. In this case, although most of the heat generated by the IC 22 conducts to the heat sink 200 via the heat spreader 202, some heat also conducts to the heat sink 200 via the decoupling capacitance 42. Alternatively, the hole in the decoupling capacitance 42 may be eliminated to permit the heat sink 200 to conduct all of the heat through the decoupling capacitance 42. Still alternatively, the heat sink 200 may have one or more regions that directly contact the heat spreader 202 around at least a portion of the perimeter of the decoupling capacitance 42.

Figure 28:
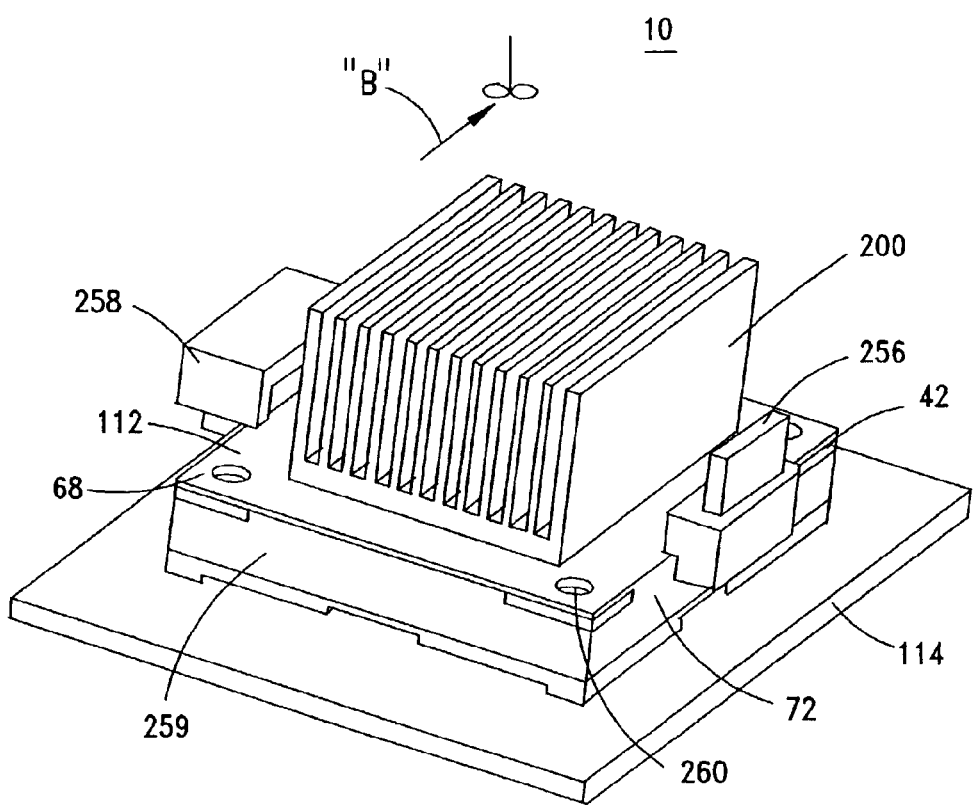
FIG. 28 is a perspective view of an IC assembly incorporating systems of the present invention, that is formed as a level two semiconductor package carried in a connector that is formed as a cover and a socket that supports a decoupling capacitance and heat sink.

FIG. 28 illustrates a side perspective assembly view of the system 10 for the IC 22, formed as a Level Two semiconductor package 62, carried in a connector 112, formed as a two piece cover and as a socket, and supporting decoupling capacitance 42 and a heat sink 200, as shown in FIGS. 4C, 5, 8A, 8B, 9A, 9B, 9C, 11, 12A, 12B, 19 and 20. The connector 112 carries the IC 22 (not shown in FIG. 28), formed as the level-two semiconductor package 62, the decoupling capacitance 42, and the IC to PCB signal and/or power interface 132 (not shown in FIG. 28). The connector 112 is disposed on the PCB 114. The heat sink 200 is disposed on the connector 112. A fan is not shown directly in FIG. 28, but is typically attached to the top of the heat sink 200 at B.

The connector 112 includes the first power connector 256 and the second power connector 258, analogous to those shown in FIG. 27. The first power connector 256 is preferably shown as an edge card connector. The second power connector 258 is preferably shown as a pin connector. The system 10 includes one or more holes 260, preferably located at the four corners of the system 10. The holes 260 preferably extend through the connector 112 and the decoupling capacitance 42 to mechanically align and secure the system 10.

Figure 29:
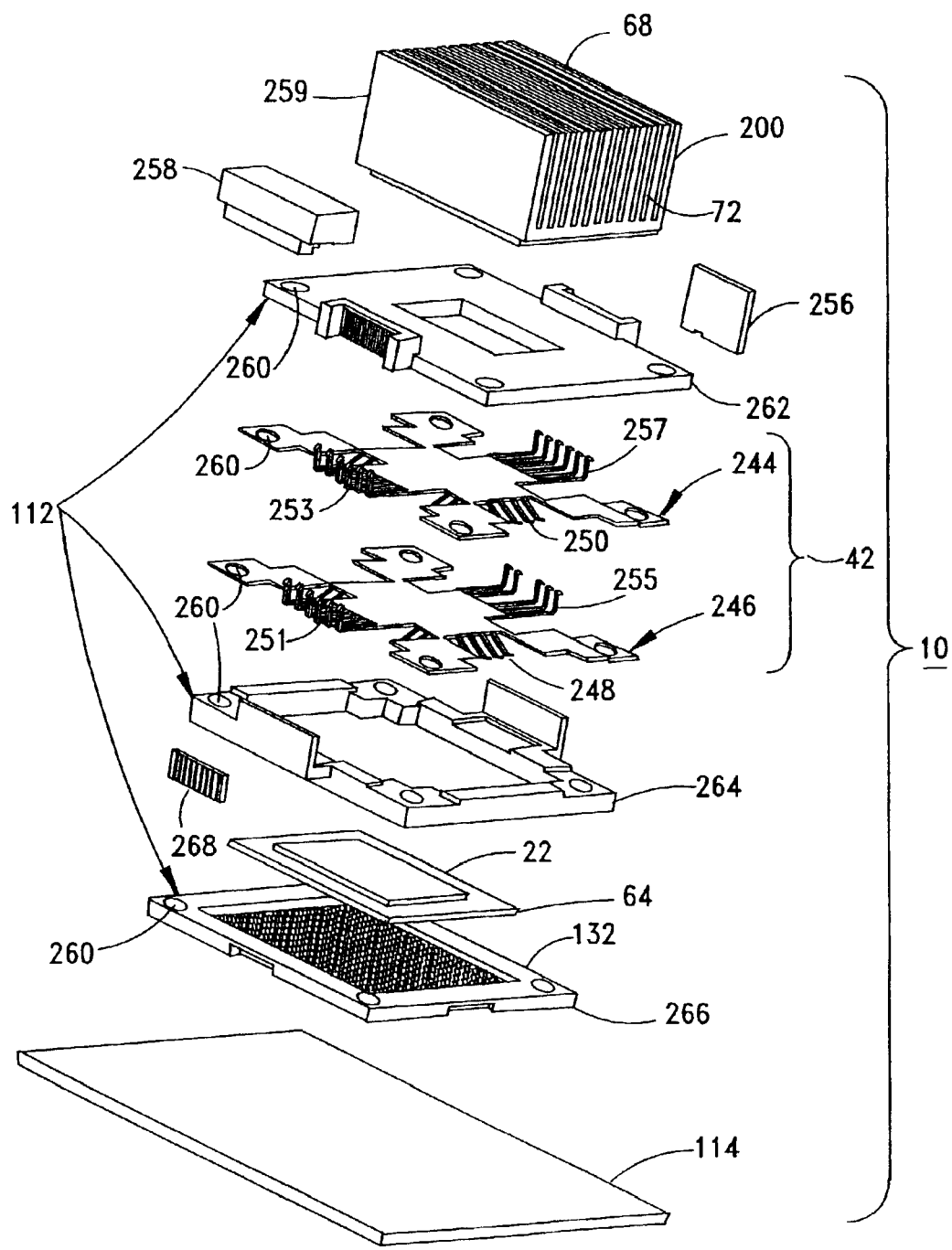
FIG. 29 is an exploded view of the system assembly of FIG. 29.

FIG. 29 is an exploded view of the assembly view of the system 10, as shown in FIG. 27 and it includes, as shown from top to bottom, the heat sink 200, the first power connector 256, the second power connector 258, a top portion 262 of the connector 112, the first conductive plate 244, the second conductive plate 246, a center portion 264 of the connector 112, a signal contact plate 268, the IC 22, the PCB 64, a bottom portion 266 of the connector 112 and the PCB 114.

The heat sink 200 is disposed on the top portion 262 of the connector 112. The top portion 262 of the connector 112 has integrally molded features adapted to receive the first power connector 256 and the second power connector 258. The top portion 262 of the connector 112 has a hole extending through the center area thereof, which is adapted to receive a center portion of the bottom of the heat sink 200. The top portion 262 of the connector 112 also has four holes 260 at the four corners thereof.

The first conductive plate 244, carrying the voltage potential, includes the second power terminal 253 of the second power connection 258, the second power terminal 257 of the first power connector 256, and a plurality of power contacts 250. The power members 250 extend from each of the four sides of the first conductive plate 244. The second power terminal 253 of the second power connection 258 and the second power terminal 257 of the first power connector 256 are bent upwards. The power members 250 are bent downwards. The first conductive plate 244 also has four holes 260 at the four corners thereof.

The second conductive plate 246, carrying the ground potential, includes the first power terminal 255 of the first power connector 256, the first power terminal 251 of the second power connection 258, and the ground members 248. The ground contacts 248 extend from each of the four sides of the second conductive plate 246. The first power terminal 255 of the first power connector 256 and the first power terminal 251 of the second power connection 258 are bent upwards. The ground members 248 are bent downwards. The second conductive plate 246 also has four holes 260 at the four corners thereof.

Preferably, the first power terminals 255, carried with the second conductive plate 246, of the first power connector 256 and the second power terminals 257, carried with the first conductive plate 244, of the first power connector 256 are alternately arranged adjacent to each other at a predetermined pitch in the first power connector 256, but, alternatively, may have any arrangement. Preferably, the first power terminals 251, carried with the second conductive plate 246, of the second power connection 258 and the second power terminals 253, carried with the first conductive plate 244, of the second power connector 258 are alternately arranged adjacent to each other in the second power connector 258, but, alternatively, may have any arrangement. Preferably, the power contacts 250, carried with the second conductive plate 246, and the ground contacts 248, carried with the second conductive plate 246, are alternately arranged adjacent to each other, but, alternatively, may have any arrangement.

The center portion 264 of the connector 112 has integrally molded features adapted to receive the first power connector 256 and the second power connector 258. The integrally molded features on the top portion 262 of the connector 112 and the center portion 264 of the connector 112 mechanically align and mate with each other to provide connector housings for their respective terminals. The connector housings are adapted to receive the first power connector 256 and the second power connector 258. The center portion 264 of the connector 112 and the top portion 262 of the connector 112 mechanically align and mate with each other to provide a housing, otherwise described as a cover as shown in FIG. 12A, for the decoupling capacitance 42. The center portion 264 of the connector 112 also has four holes 260 at the four corners thereof.

The signal contact plate 268 aligns and secures the first power terminals 251, carried with the second conductive plate 246, of the second power connection 258 and the second power terminals 253, carried with the first conductive plate 244, of the second power connector 258. The IC 22 is mounted to the circuit board 64, otherwise known as an interposer board, forming a Level Three IC 22 as shown in FIG. 4D, as is well known in the art of IC manufacturing.

The bottom portion 266 of the connector 112, forming a socket as shown in FIG. 12B or forming a frame as shown in FIG. 12C, carries the IC to PCB signal and/or power interface 132. The bottom portion 266 of the connector 112 is adapted to mechanically align and secure the PCB 64 to the interface 132 to permit the signal contacts 90 (not shown) on the bottom of the PCB 64 to align with corresponding signal contacts preferably on the interface 132 and alternatively on the PCB 114. The bottom portion 266 of the connector 112 also has four holes 260 at the four corners thereof.

The holes 260 in the four corners in each of the top portion 262 of the connector 112, the first conductive plate 244, the second conductive plate 246, the center portion 264 of the connector 112, and the bottom portion 266 of the connector 112 are aligned with each other along four common axes at each corner.

A fastener extends through the five holes aligned on a common axis at each of the four corners to mechanically secure the connector 112 together as an assembly of the system 10 as shown in FIG. 28. Alternatively, four holes, aligned with the four holes in the assembly of the system 10, may extend through the PCB 114 to attach the system 10 to the PCB 114. The fasteners may be of any type including, without limitation, screws, heat stakes, pins, pegs, clips, and the like. The fasteners may be separate piece parts or integrally formed with a part of the connector 112. Preferably, the fasteners are formed as four separate screws. Alternatively, the fasteners form snaps or clips that are integrally formed with at least one portion of the connector 112 that mechanically engage mating features on at least one other portion of the connector 112. In this alternative, the fasteners, formed as snaps or clips, preferably create an assembly of the system that can be easily assembled and disassembled to permit repair or reuse, but, alternatively, may create an assembly of the system 10 that is permanently assembled in the sense that it cannot be disassembled without damaging the assembly of the system 10.

The circuit board 114 carries the connector 112 and the heat sink 200. The circuit board 114 is typically referred to as the motherboard because is also carries many of the circuits that the IC 22 interfaces with. The board 114 includes multiple conductive contacts (not shown) that correspond to the conductive contacts 90 on the IC 22 or on the interface 132. The PCB also includes multiple PCB traces 118 (not shown in FIG. 29) that electrically couple the conductive contacts (not shown) on the PCB to the various other circuits interfacing with the IC 22.

Note that FIG. 29 does not show a hole in the center region of the first conductive plate 244 and the second conductive plate 246 of the decoupling capacitance 42, as shown in FIG. 27. Further, note that FIG. 29 does not show a heat spreader 202, as shown in FIG. 27. The absence of these two elements in FIG. 29 illustrates the alternative described with reference to FIG. 27, wherein the decoupling capacitance 42 in FIG. 29 performs the function of the heat spreader 202 in FIG. 27 and the heat sink 200 directly contacts the top of the decoupling capacitance 42. This alternative is further described with reference to FIGS. 30 and 31.

Figure 30:
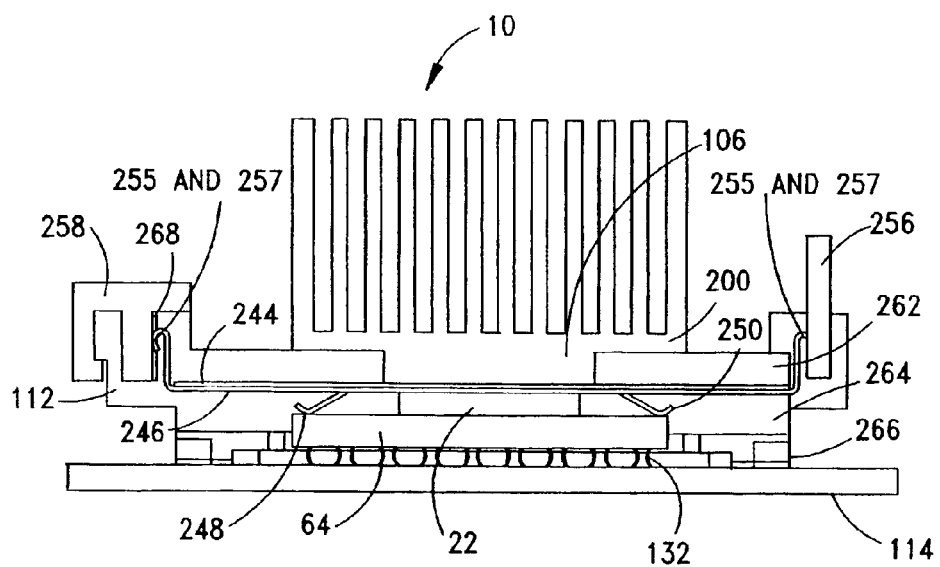
FIG. 30 is a cross-sectional view of the assembly of FIG. 28, taken along lines 30—30 thereof.

FIG. 30 illustrates a cross-sectional view of the assembly of the system 10, as shown in FIGS. 28 and 29. The PCB 114 carries the connector 112. The interface 132 provides a signal interface between the PCB 64 and the PCB 144, as described above. The PCB 64 carries the IC 22. The decoupling capacitance 42 is disposed over the IC 22. The decoupling capacitance 42 has characteristics of a heat spreader and directly contacts the top of the IC 22 to spread the heat of the IC 22 throughout the structure of the decoupling capacitance 42. The power members 248 and the ground members 250, forming extended legs and upturned feet as described with reference to FIG. 27, contact corresponding power contacts 92 (not shown) and ground contacts 92 (not shown) on the top of the PCB 64. The heat sink 200 is carried on the top of the connector 112. A center region of the heat sink 200 extends through the hole in the top portion 262 of the connector 112 to directly contact the top of the decoupling capacitance 42.

Figure 31:
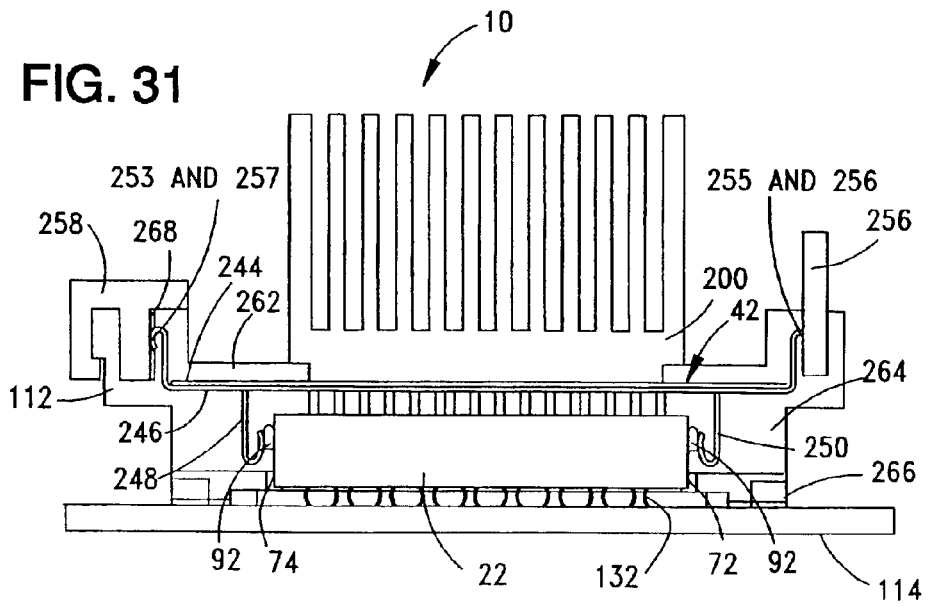
FIG. 31 is a cross-sectional view of an alternate system assembly constructed in accordance with the principles of the present invention.

FIG. 31 illustrates an alternative cross-sectional view of the assembly of the system 10, as shown in FIG. 28. The assembly of the system 10 in FIG. 30 is the same as the assembly of the system 10 in FIG. 31, except that the power contacts 92 are disposed on the sides (72 and 74) of the IC 22, that the power members 248 and the ground members 250 are shown as inwardly curled arms and hands, and that the signal interface 132 forms a dielectric material to capacitively couple signals between the IC 22 and the PCB 114.

The PCB 114 carries the connector 112. The interface 132 provides a capacitive signal interface between the IC 22 and the PCB 144. Note that the PCB 64 is not present in FIG. 31. In this case, the IC 22 has one set of the signal contacts 90 (not shown), forming one side of the individual capacitors, and the PCB 114 has the other set of the corresponding signal contacts (not shown), forming the other side of the individual capacitors. The interface 132 provides the dielectric material, having the appropriate dielectric constant, between the corresponding signal contacts on the IC 22 and the PCB 114 to permit capacitive signal coupling between the IC 22 and the PCB 114.

The decoupling capacitance 42 is disposed over the IC 22. The power members 248 and the ground members 250, forming inwardly curled arms and hands, contact corresponding power contacts 92 and ground contacts 92 on the sides 72 and 74 of the IC 22, as well as the back side (shown) and the front side (not shown). The heat sink 200 is carried on the top of the connector 112 and makes direct contact with the decoupling capacitance 42.

FIG. 32 illustrates a connector 112 of the present invention that is hermaphroditic in the sense that it may serve as either a socket with a recess to receive the IC therein, or as a cover that may fit over the IC. This type of construction is suitable for use with a Level Two type of semiconductor package of the type illustrated in FIGS. 4C, 5, 8A, 8B, 9A, 9B, 9C, 11, 12A and 12B. In this construction, the connector includes an external means for connecting to a source of power, illustrated as a pair of edge circuit cards, or boards 256, 258 which may serve as respective first and second power connectors. This construction is suitable for use where power may be supplied to the IC package from the sides of the package. The connector 112 carries the decoupling capacitance 42, preferably in the form of plate capacitors that include distinct power contacts 248 and ground contacts 250. The connector 112 has a recess, or cavity, that is formed as part of the connector 112, with the power contacts 248 and ground contacts 250 are disposed inside the recess at the perimeter of the connector 112. The recess has an appropriate shape and depth adapted to receive the IC 22 to permit the power contacts 248 and ground contacts 250 to align with and contact corresponding power and or ground contacts 92 on the IC 22 in the manner generally shown in FIG. 34.

The connector 112 may also be considered a cover, as shown schematically in FIG. 12A, that fits over the top of the IC 22 as shown in FIG. 31. In this instance, the decoupling capacitance 42 is disposed over the top 68 of the IC 22 and the power and contacts members 248, 250 contact corresponding contacts 92 disposed on each side of the IC 22. Alternatively, the connector 112 may also be considered a socket, as shown in FIG. 12B. In this case, the connector 112 is shown upright to reveal the features on the inside of the socket. As a socket, IC 22 fits into the connector 112 as shown in FIG. 23. The decoupling capacitance 42 is disposed under the bottom 70 of the IC 22 and the power and ground contacts 248, 250 make contact corresponding power contacts 92 disposed on each side of the IC 22. In this case, the signals would be transferred through the top 68 of the IC 22 via a signal conductor because the decoupling capacitance 42 blocks signals from being transferred through the bottom of the connector 112. The first power connector 256 and the second power connector 258, shown as edge card connectors, connect the voltage potential and ground potential to the decoupling capacitance 42.

FIG. 33 illustrates an alternate connector 112 that is formed as a cover suitable for use with a Level Two semiconductor package 62, as shown in FIGS. 4C, 5, 8A, 8B, 9A, 9B, 9C, 11, 12A and 12B, and the connector 112 may be considered as similar to that shown in FIG. 32, with the connector body portion inverted have having power supply mating members of a different style. In this embodiment, an external means for connecting to a source of power is provided in the form of two pin headers 256, 258, each of which include conductive pins 255, 257 that extend outwardly from the cover, or upwardly in FIG. 33. This type of construction permits the power to be conveyed to the package from the top. Multiple conductive capacitor plates are formed in the connector.

Figure 34:
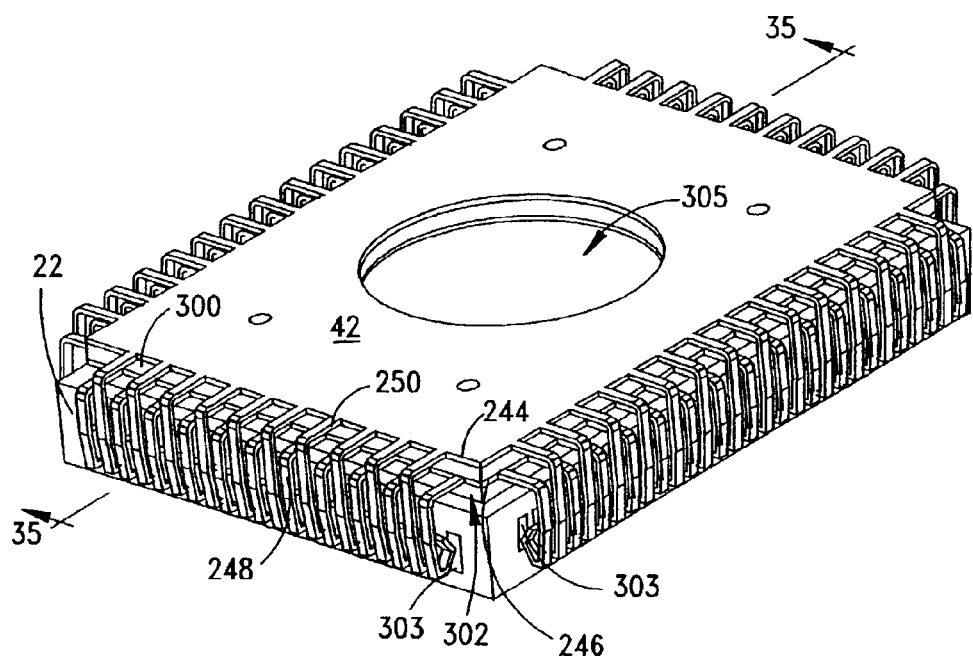
FIG. 34 is a perspective view of an alternate embodiment of a system assembly utilizing a capacitor power delivery structure of the present invention in place upon a chip package and having a means for communicating with a heat sink.

FIG. 34 illustrates another embodiment of the present invention wherein the power delivery system is incorporated within a cover member (not shown) that fits over the IC 22. In this embodiment, the power delivery system includes at least a pair of conductive plates 244, 246 that are similarly sized and which are aligned with each other in the vertical (Z-axis) direction. The two plates are separated by an intervening dielectric layer 300, the dielectric constant and or thickness of which may be chosen to provide a certain capacitance to store sufficient power to supply normal operating, or surge, current to the IC. A second insulative layer 302 is provided on the bottom surface of the bottom capacitor plate 246 so as to insulate it from the IC. As mentioned above, the power delivery system includes a plurality of contacts, 248, 250 which may include interlaced power and ground (power return) contacts that extend outwardly from the plates 244, 246 and down along the sides of the IC package, preferably in the cantilevered or bellows fashion illustrated, where they engage contacts 303 formed in the IC. The two plates 264, 266 and portions of the contacts 248, 250 are typically encapsulated or otherwise molded within an exterior insulative material, such as a plastic.

These contacts 248, 250 are formed in each of the two plates 244, 246 and they contact the IC package. This embodiment is suitable for use in combination with a heat sink (not shown) and as such, it may be provided with an opening 305 that extends through both plates 244, 246 and the intervening dielectric layer 300 and the lower insulation layer 302. A portion of the heat sink may extend through this opening 305 into contact with a heat generating surface of the IC 22. In some constructions, a thermal conducting member may be used to fit in the opening and extend between the IC heat generating surface and the heat sink.

Figure 35:
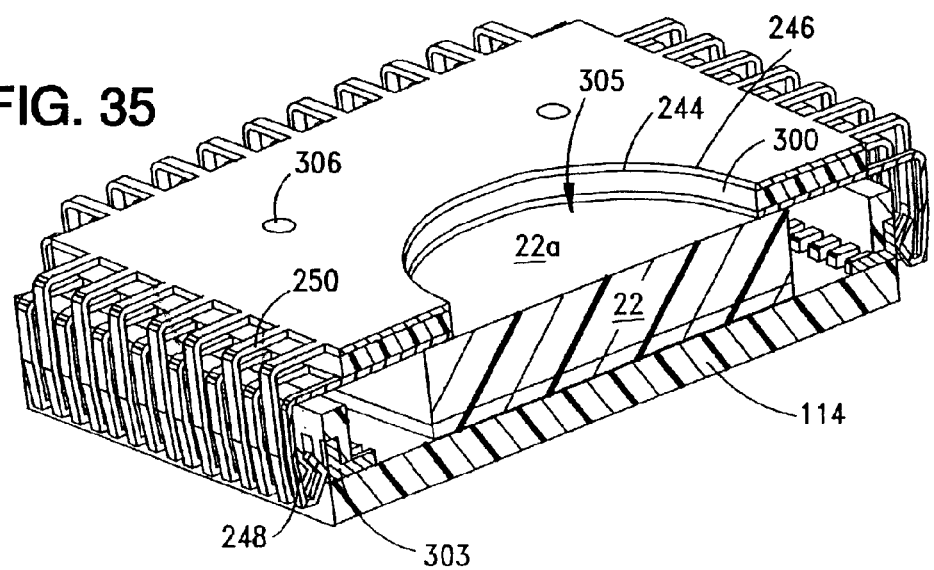
FIG. 35 is a sectional view taken along lines 34—34 of FIG. 34.
Figure 42:
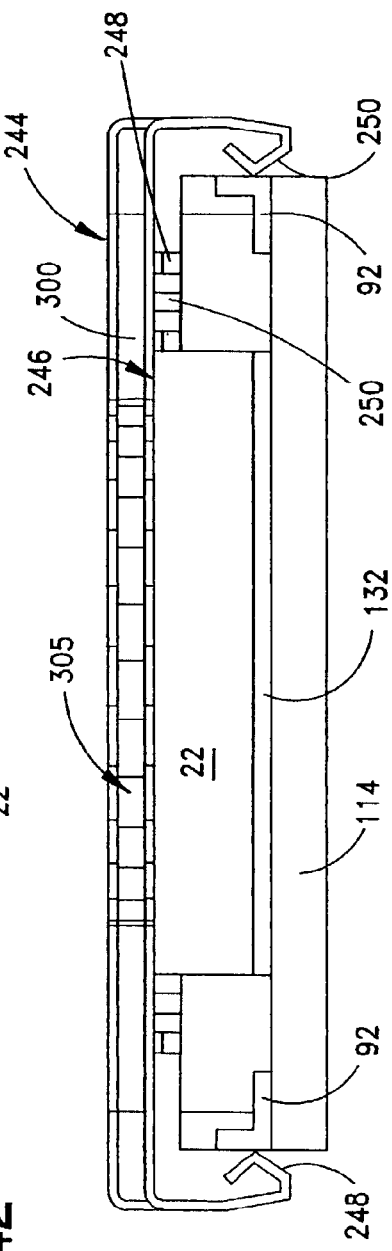
FIG. 42 is an end view of the section of FIG. 35.

FIG. 35 is a sectional view of FIG. 34, but with the lower insulating layer 302 not shown for clarity, and illustrates the relationship between the IC 22, its package 114 and the power delivery system. As shown in FIG. 35, the lower insulating layer 302 abuts against the top surface 22a of the IC, and additional, but smaller, openings 306, may be provided for purposes of additional cooling. FIG. 42 presents the end of this section for better clarity. The contacts 248, 250 are positioned around the perimeter as illustrated and this arrangement reduces the amount of force required for insertion and removal in that the contacts engage the IC along a horizontal line of action, rather than a vertical line of action.

Figure 37:
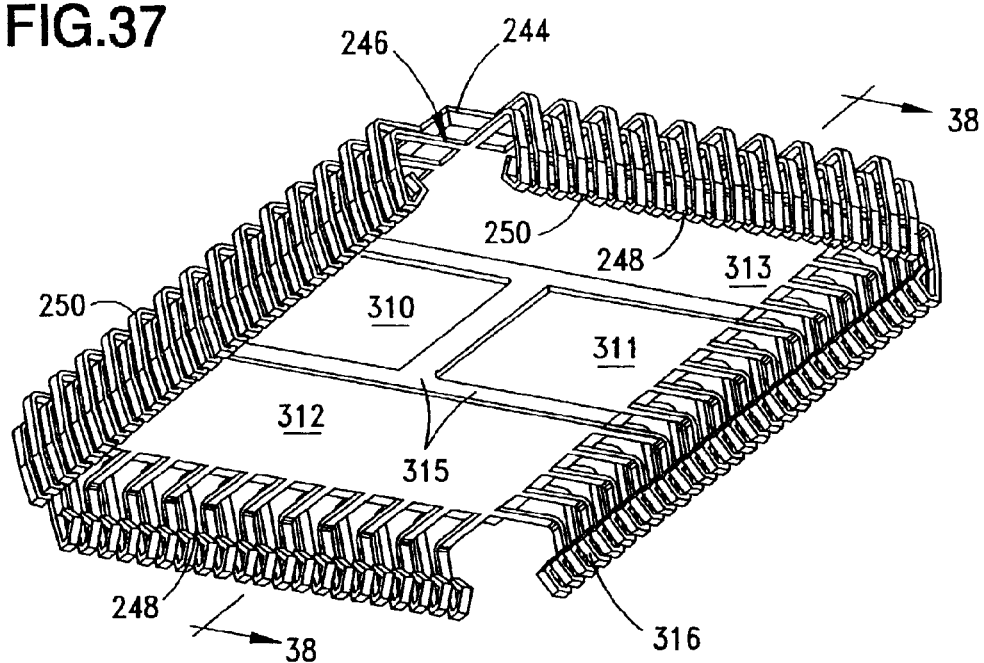
FIG. 37 is the same view as FIG. 36, but taken from a different angle and with its housing removed for clarity.
Figure 36:
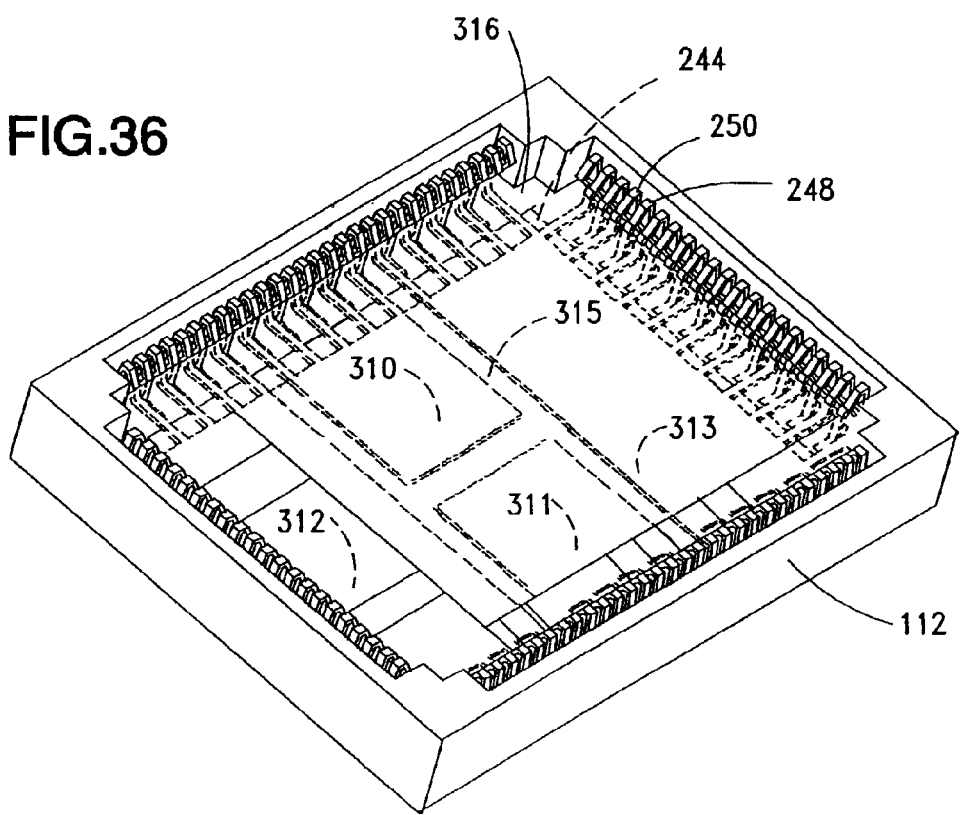
FIG. 36 is a perspective view, taken from the underside, of an alternate embodiment of a capacitor structure used in the power delivery systems of the present invention and useful for supplying different levels of power to an IC.

FIGS. 36 and 37 illustrate another embodiment of the present invention that incorporates a power delivery supply that is capable of supplying multiple and distinct voltages to the IC at various locations on the IC body. This is accomplished by incorporating multiple, distinct capacitors in the cover member which are formed as individual lower conductive plates 310–313. Each of these plates is spaced apart from each other as illustrated best in FIG. 37 by intervening spaces 315, and each such plate includes, as illustrated, individual contact members 316 extending therefrom outwardly and downwardly therefrom into position for contact with contacts of the IC or the IC package. As with the previous embodiments discussed, the individual plates 310–313 are separated from the top, single, or multiple sectioned capacitor plate 244 by an intervening dielectric layer 300 so that the lower plates 310–313 of the system are separated from the upper plate 244 in the vertical direction by the intervening dielectric layer 300 and are separated from each other in the X and Y directions by either air or an intervening dielectric in the spaces 315. It is also contemplated that each such lower plate 310–313 may have a corresponding, separate top plate associated therewith so that the connector will support four sets of pairs of capacitive plates in the embodiment of FIG. 32.

Figure 38:
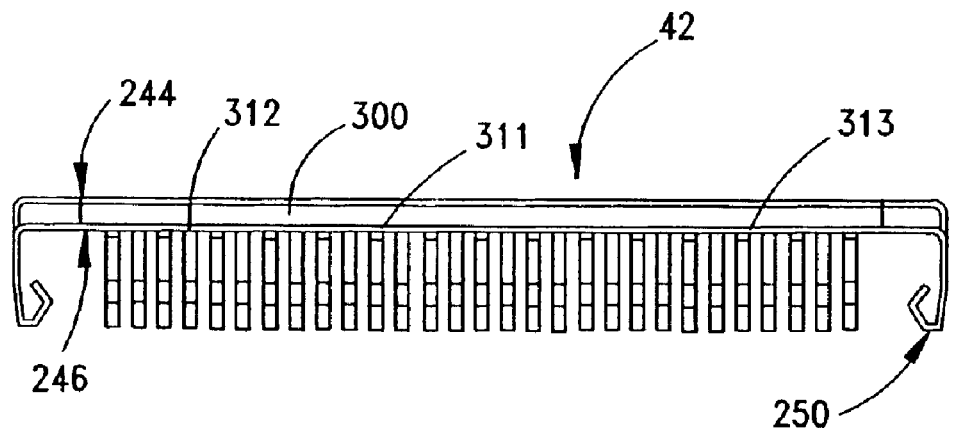
FIG. 38 is a sectional view of the capacitor structure of FIG. 37, taken along lines 38—38 thereof.

FIG. 36 illustrates the set of multiple plates (and the upper plate 244 and intervening dielectric 300) embedded or encapsulated within a housing or cover portion 112 that is also preferably formed from either a dielectric or electrically insulative material. In this type of structure, the material that forms the cover portion 112 will fill the intervening spaces 315 between the lower capacitor plates 310–313. The plate contacts 316 that extend therefrom may also be partially embedded with in the cover portion 112 or may be disposed within a series of slots 316 formed therein so as to not unduly limit the spring action of the contacts. FIG. 38 is a sectional view of the power delivery structure of FIG. 37 (as well as a portion of FIG. 34) prior to its embedding within a cover portion 112. With this structure it is possible to deliver different voltages to different parts of the IC, such as 0.5V, 1.0V, −2.0V and so on.

Figure 39:
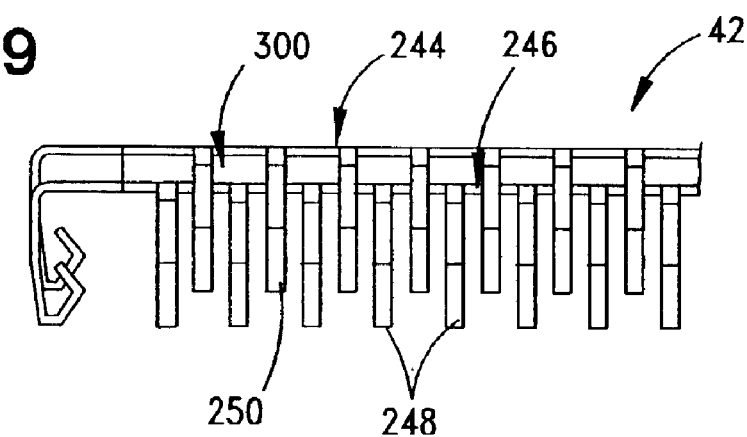
FIG. 39 is a partial end view of another embodiment of a capacitor structure constructed in accordance with the principles of the present invention and having staggered power leads extending therefrom.

FIG. 39 illustrates a staggered contact arrangement that may be used with the power delivery systems of the present invention. In FIG. 39, two conductive plates 244, 246 are illustrated as separated by an intervening dielectric layer 300 and the contacts 248, 250 of each plates extend downwardly therefrom at approximate right angles thereto, but the contacts 248, 250 have different contact locations in the vertical directions. As illustrated, the contacts 248 of the lower plate 246 have a first length and the contacts 250 of the upper plate 244 have a second length, with both lengths being equal as shown, however, the contact arms of the contacts 248, 250 are arranged at different elevations. This staggered arrangement assist in the reduction of forces required for insertion and removal of the cover portion 112 upon the IC or its package in that the number of contacts that engage the IC/package are halved at the first contact. This arrangement further permits the implementation of a first mate, last break aspect to the power delivery structure to reduce the likelihood of shorting and arcing occurring during connection.

Figure 40:
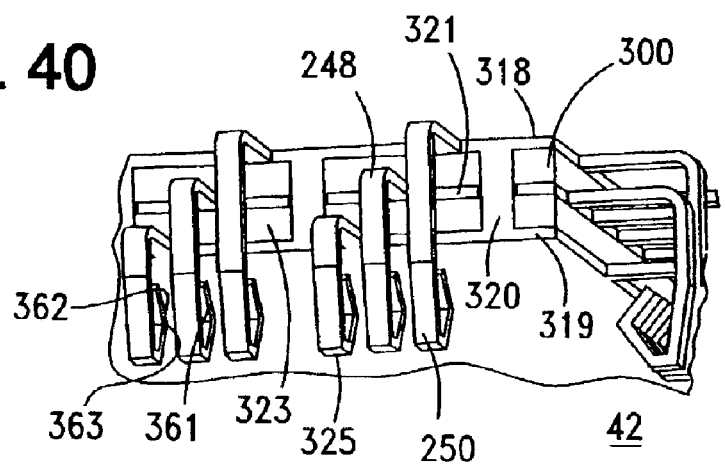
FIG. 40 is an enlarged perspective detail view of a corner of another embodiment of a power delivery structure constructed in accordance with the principles of the present invention and illustrating the use of more than two capacitor plates.

FIG. 40 illustrates still another embodiment of a power delivery system constructed in accordance with the principles of the present invention, wherein the power delivery system 375 includes three capacitor plates 318, 319 and 321 which are separated by intervening dielectric material layers 300, 323. The top and bottom capacitor plates 318, 319 are interconnected together, preferably at their sides as illustrated, by interconnecting members 320. These points of interconnection are isolated and separated from the middle, or interior capacitor plate 321 by a spacing, or clearance 322. Sets of three contacts 248, 250, 325 are arranged around the perimeter of the power delivery system for contacting corresponding contacts on the IC or its package. The power delivery system in this form and the previous forms may be considered in one aspect as a module due to its structure which may be inserted into cover and socket members alike. This Figure illustrates the exemplary construction of the contacts 248, 250 and 325 which have elongated, cantilevered or bellows arm portions 360 that that are bent downwardly and slightly inwardly and which terminate in free end portions 361 that define inner contact arm portions 362 of the contacts. Each such contact arm portion preferably has an inwardly angled contact surface 363 that is used to effect the contact with the side of the IC/package.

The use of two outer capacitor plates in this embodiment flanking the inner capacitor plate has the effect of increasing the total capacitance of the decoupling capacitance because of the increased surface area of the top and bottom plates. In other words, with this embodiment, it is possible to increase the capacitance (and current supplied tot he IC) in the same horizontal surface area provided by t he connector body portion Thus, such a construction may be used where the designer has a limited amount of space available of the circuit board, or in instances where the IC is small. In this construction, the capacitor plates are preferably vertically arranged in either a Power-Ground-Power or a Ground-Power-Ground order.

Figure 41:
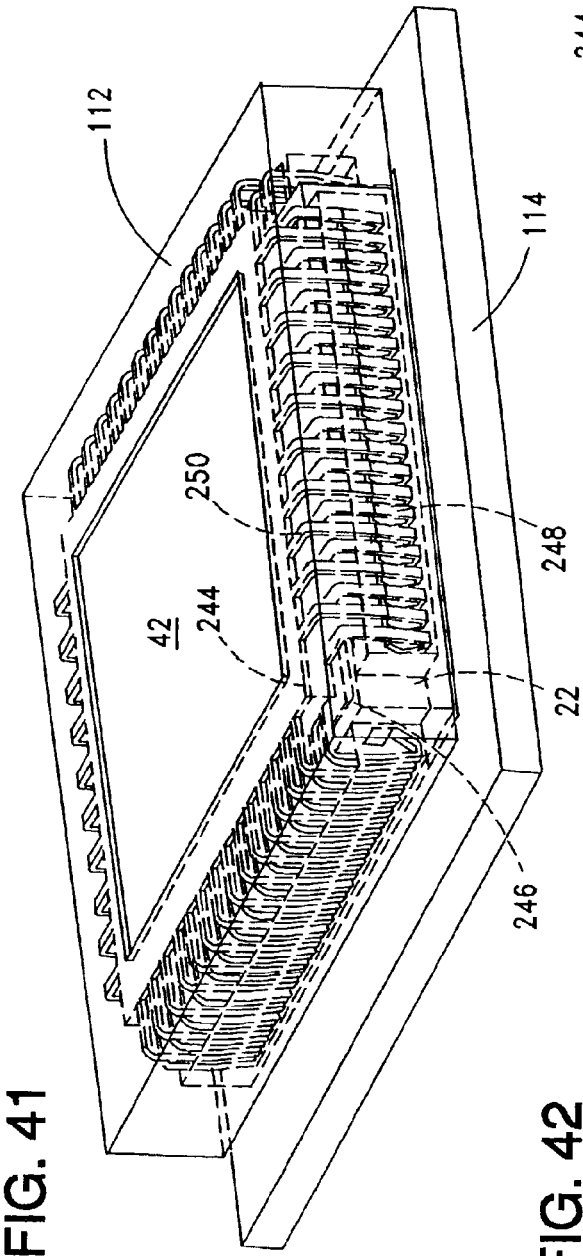
FIG. 41 is a perspective view of a power delivery member of the present invention mounted within a housing mounted to an IC, with the housing shown transparent for clarity.

FIG. 41 illustrates a power delivery system incorporated within a cover portion 112 that fits over an IC 22 and the cover portion 112 has been rendered transparent for clarity to show how it engages the IC/package around its perimeter.

Figure 43:
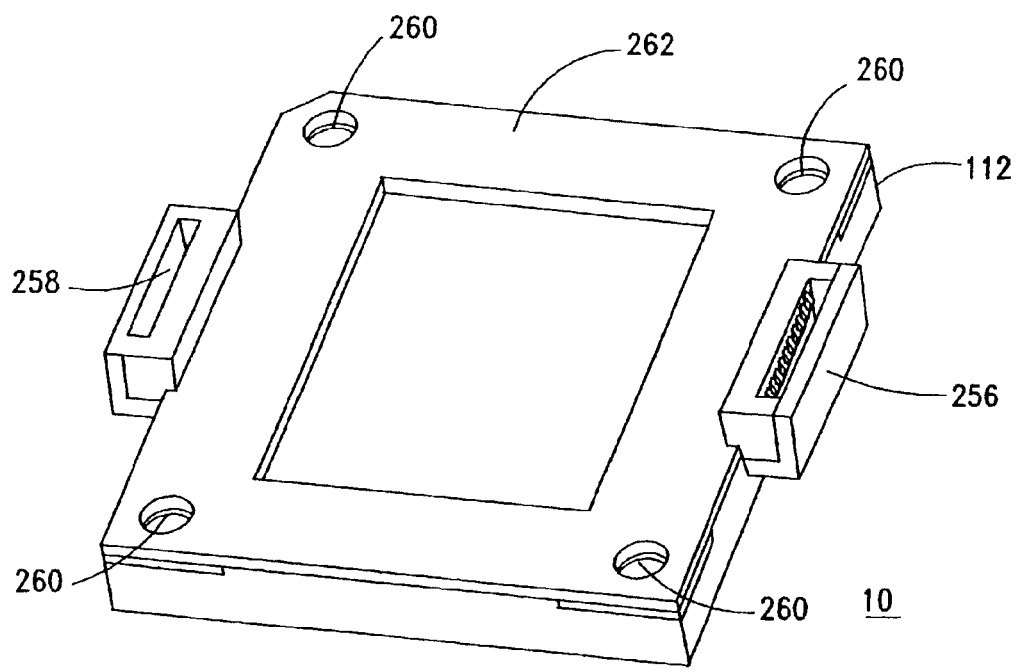
FIG. 43 is a perspective view of a connector structure constructed in accordance with the principles of the present invention.
Figure 44:
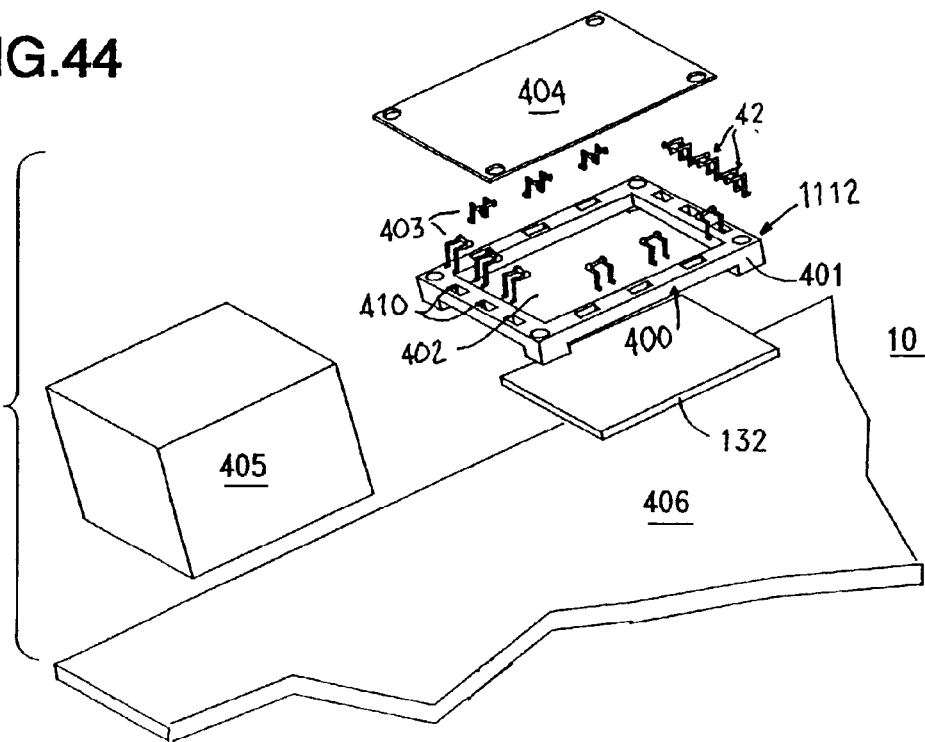
FIG. 44 is an exploded view of an alternate power delivery system constructed in accordance with the principles of the present invention and which utilize a plurality of discrete power capacitors supported within a housing that supports the IC.
Figure 47:
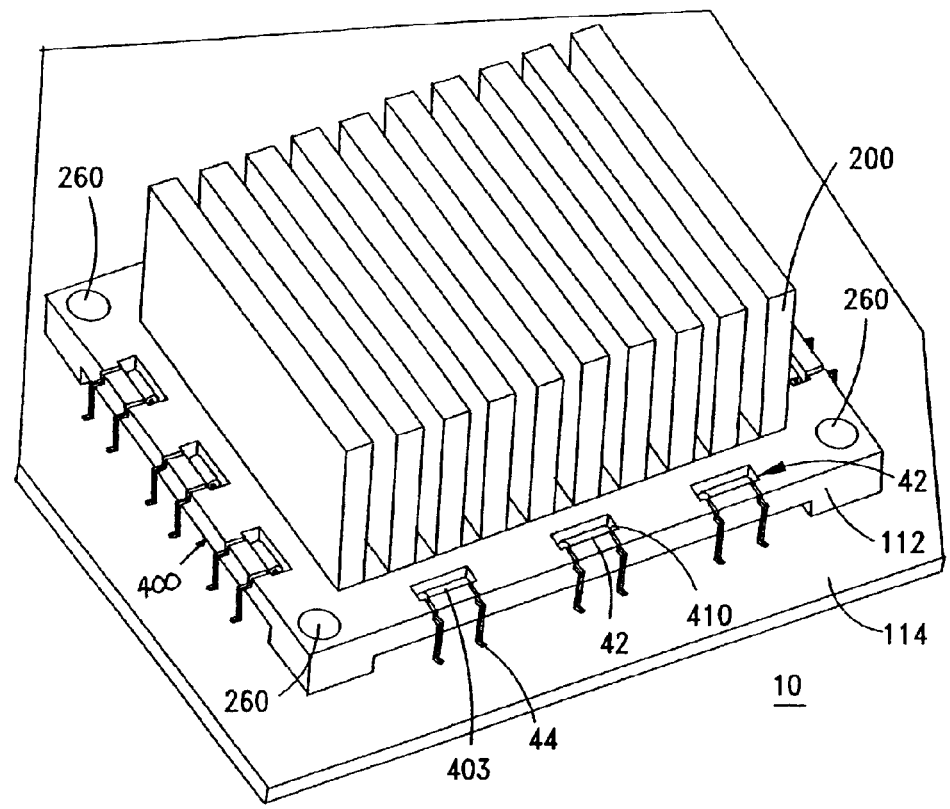
FIG. 47 is a perspective view of the assembly of FIG. 45 with a heat sink member in place upon the IC and assembly.

FIG. 43 illustrates the exterior of an assembled IC package with the power delivery structure incorporated therein, wherein the decoupling capacitance 42 is held over the IC by means of a cover member 262. The assembly has a plurality of mounting holes formed in the body portion thereof for mounting the assembly to a circuit board and further has means 256, 258 for mating with external power leads to supply power to the decoupling capacitance 42.

FIGS. 44–50 illustrate another embodiment of the present invention in which an IC 132 is held within a socket-style connector 112 which has the decoupling capacitance 42 incorporated therein. As illustrated, the socket connector 112 is rectangular or square in shape and has a body portion 400 that is formed from a plurality of sidewalls 401 that cooperatively define a central opening 402 disposed therein that receives the IC 132. The opening 402 may be a through hole, wherein the IC sits on the circuit board in contact with contacts or terminals 890. (FIG. 46.) The decoupling capacitance 42 includes a plurality of discrete capacitors 403 each of which may deliver the same voltage or different voltages to appropriate contacts disposed on the IC 132 (not shown). A cover plate 404 encloses and seals the IC within the socket connector 112. The capacitors 403 receive their power from a power supply 405 mounted to the circuit board 406 by way of traces. (FIG. 45.) The incorporation of these discrete capacitors into the socket connector frees up space surrounding the IC 132 on the circuit board 406.

Figure 48:
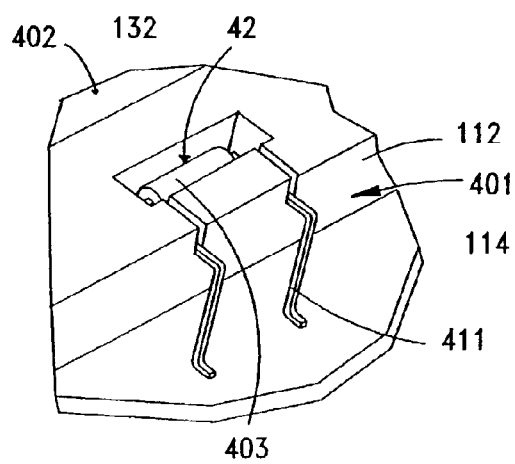
FIG. 48 is an enlarged detail view of a portion of the assembly of FIG. 45, illustrating a discrete capacitor used therein.
Figure 50:
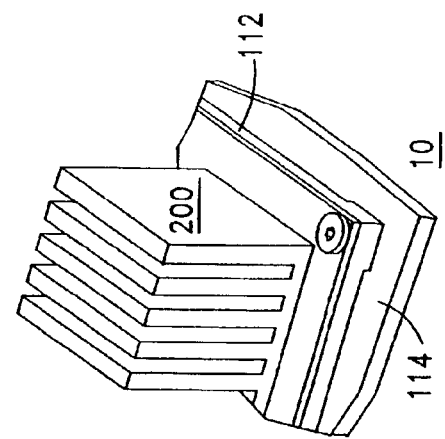
FIG. 50 is an enlarged detail view of the corner of the assembly of FIG. 45, illustrating a means for retaining the assembly in place.
Figure 49:
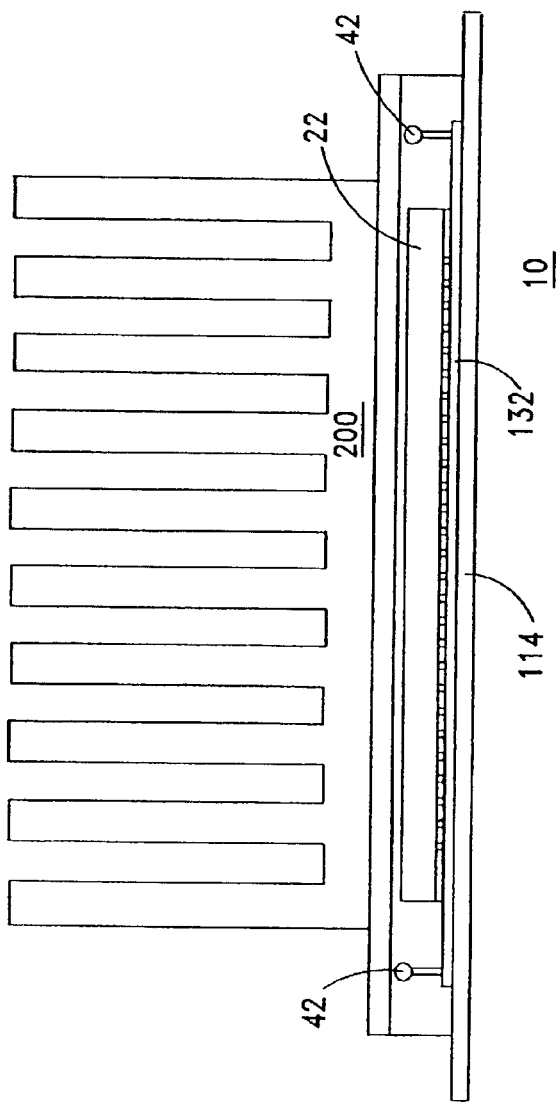
FIG. 49 is a sectional view of the connector assembly of FIG. 47 taken along lines 49—49 thereof.
Figure 51:
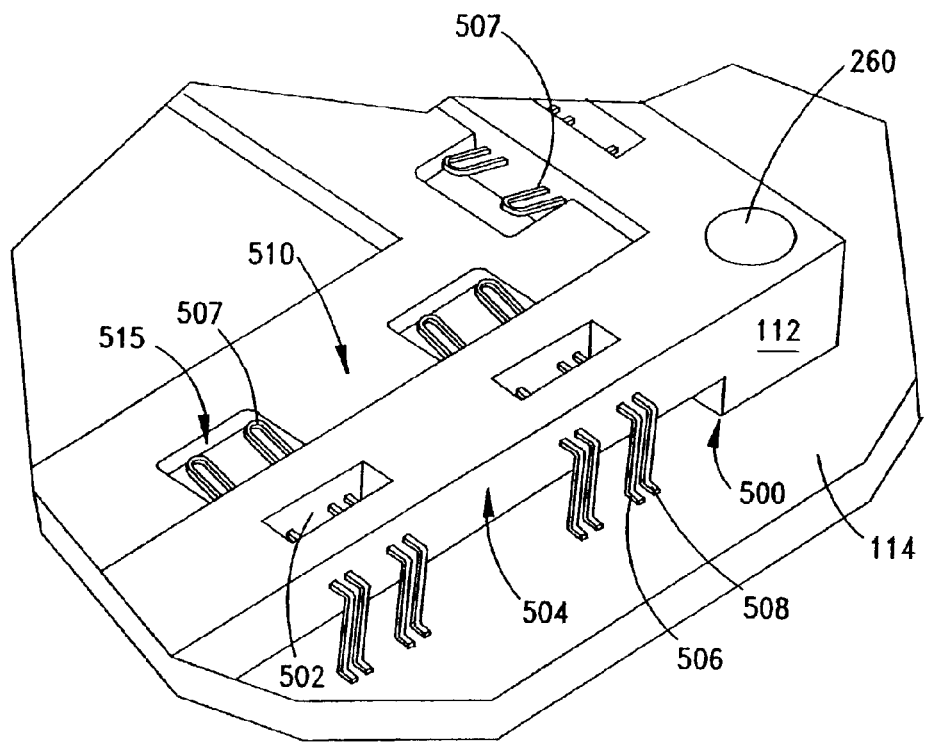
FIG. 51 is an enlarged detail view of an alternate construction of a socket connector constructed in accordance with the principles of the present invention illustrating the use of wire contacts that contact both the IC and discrete capacitors.
Figure 53:
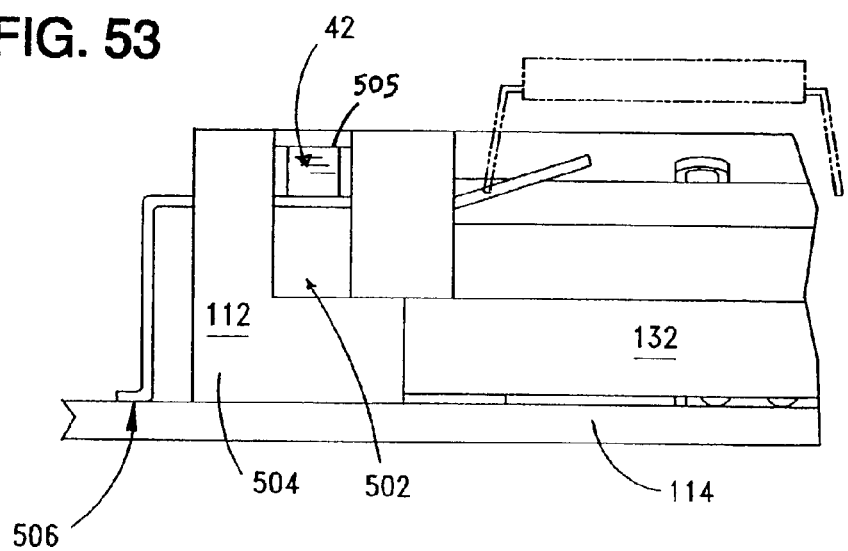
FIG. 53 is an enlarged detail sectional view of interior area "A" the connector assembly of FIG. 52.
Figure 52:
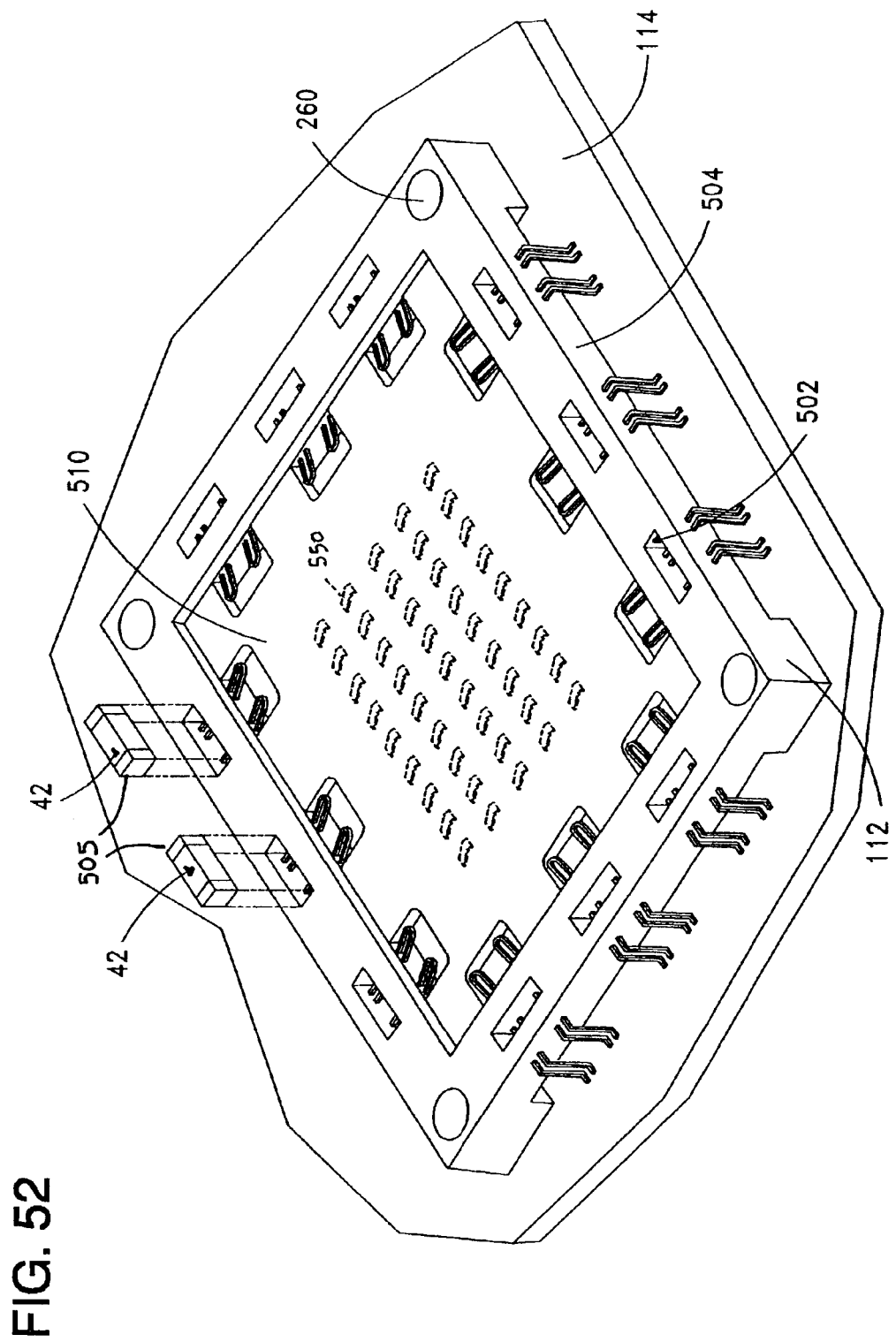
FIG. 52 is a perspective view of the connector assembly of FIG. 51.
Figure 54:
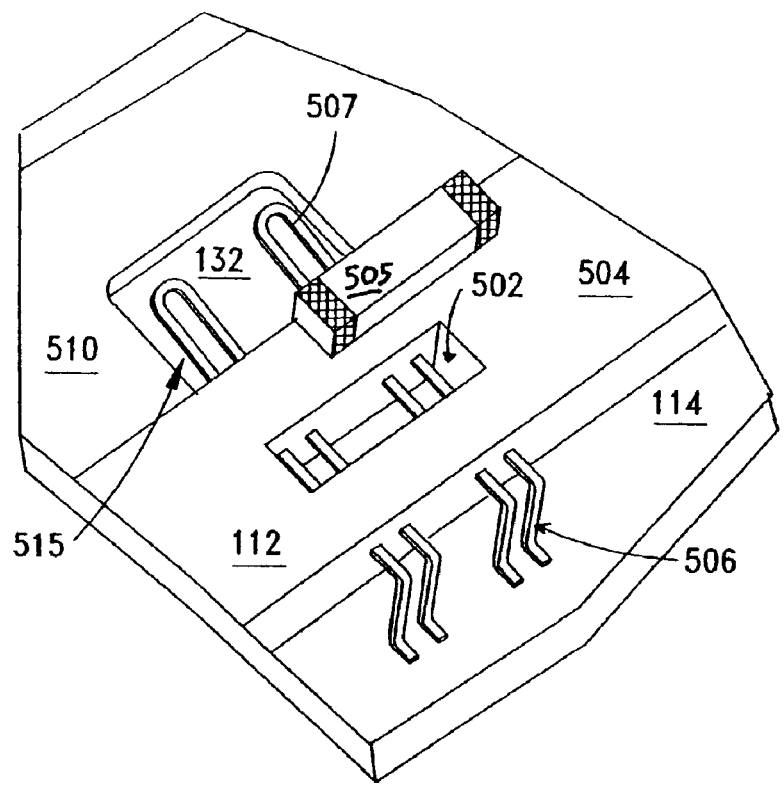
FIG. 54 is a detailed exploded view of a portion of the connector assembly of FIG. 52, illustrating the placement of a discrete capacitor therewith.
Figure 55:
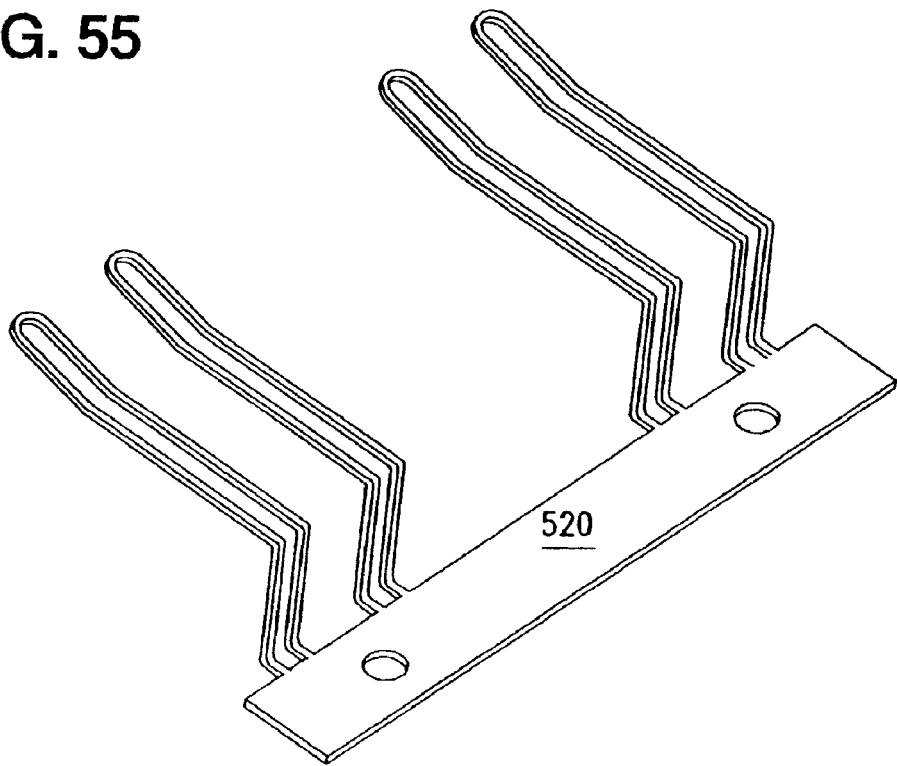
FIG. 55 is a perspective view of a carrier strip containing leads used in the connector assembly of FIG. 52.

The capacitors 403 are received within openings 410, such as slots, or openings, that are disposed in the body portions on the socket connector sidewalls 401. The capacitors may include conventional capacitors as shown in FIGS. 44–48, which utilize conductive wire leads 411 for connection purposes or chip-type capacitors 505. In order to accommodate these leads 411, the body portion sidewalls 401 may further includes passages 412 formed therein which receive the leads so as to maintain a low profile and low space aspect of the socket connector. (FIG. 48.) The body portion sidewalls 401 may have a height so as to form a slight recess that will accommodate a heat transfer member, such as a heat sink 200. This type of connector may be fastened to the circuit board with fasteners 415. (FIG. 50.) The capacitor-receiving openings 410 are preferably spaced apart from each other around the perimeter of the receptacle as illustrated, or they may be spaced in different spacings that correspond to location(s) of different power contacts or terminals on the IC.

FIGS. 51–54 illustrate another embodiment of a power delivery system 500 constructed in accordance with the principles of the present invention wherein the connector 112 is in the form of a socket 501 which has a plurality of discrete openings 502 formed in the sidewalls 504 thereof, each of which receives a decoupling capacitance 42 in the form of a chip capacitor 505. A different terminal, or lead, structure may be used with this embodiment and the leads 506 of which are shown as wire-formed leads having a general U-shaped configuration which terminate at one end in a loop end 507 and at the opposite end 508 in free tails 509 that may be soldered to the circuit board. The wire loop leads 506 pass through the sidewalls 504 of the socket connector 112 and may be easily molded in place therein during manufacture of the socket connector and the loop ends 507 thereof are bent slightly upwardly so that they will make effective electrical contact with the bottom of an IC inserted into the socket connector. The "looped" nature of this portion of the terminal 506 provides for a redundant circuit path to the IC and also lowers the inductance of the terminals and the overall connector. The leads serve as a set of first, or "power" terminals" which are arranged in a pattern, or array that encompasses a plurality of second, preferably non-power terminals 550 arranged within the interior of the connector receptacle and which serve to connect aspects of the IC to an underlying circuit board. These non-power terminals 550 may includes LGA, PGA, BGA, spring contacts and the like.

An inner carrier frame 510 may be provided as part of the package and this inner frame 510 sits within the socket connector sidewalls to form a support for the IC. In order to accommodate the lop ends of the wire leads 506, the frame 510 may be provided as illustrated with recesses 515 that enclose the loop ends 507 and which permit them to deflect under the insertion force of the IC when inserted into the socket connector opening. The wire leads 506 may be easily stamped and formed at low cost as part of an overall carrier strip 520 and may be formed in alternate directions from that shown in order to accommodate the position of the IC. The inner frame 510 and the sidewalls 504 may be formed together as a single piece by way of insert or overmolding, so that, in effect, the inner frame 510 serves as a base, or floor portion of the socket connector housing.

Figure 58:
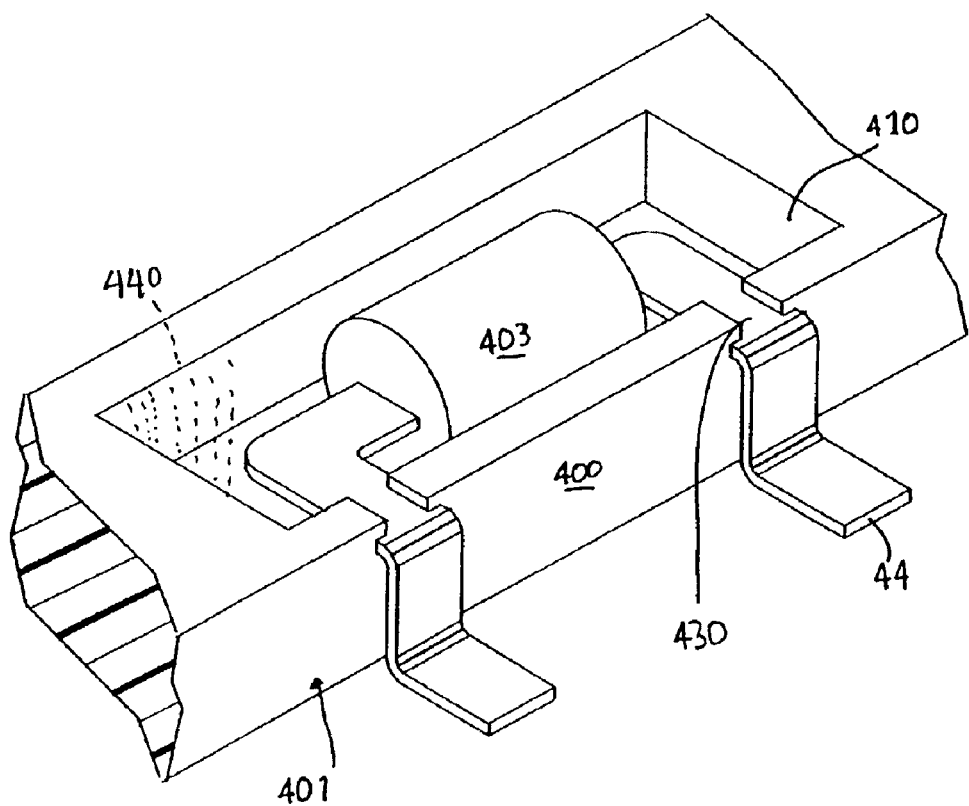

FIG. 58 illustrates another manner in which the discrete capacitors 403 have their terminals, or leads 44 extend through slots 430 that are formed in the connector body portion sidewalls 401. In this instance, the leads are connected to terminals and the sidewalls 401 surrounding the capacitor-receiving openings 410 may have excess material added to them or may be configured in such a manner so as to facilitate the heat-staking of the capacitors 403 and their leads in order to hold them in place within the connector body portion. Alternatively, the discrete capacitors 403 may be completely encapsulated within the sidewalls 401 by sealing the openings 410 with additional materials, as at 440, or by molding the capacitors and leads in place within the connector body portion.

Figure 56:
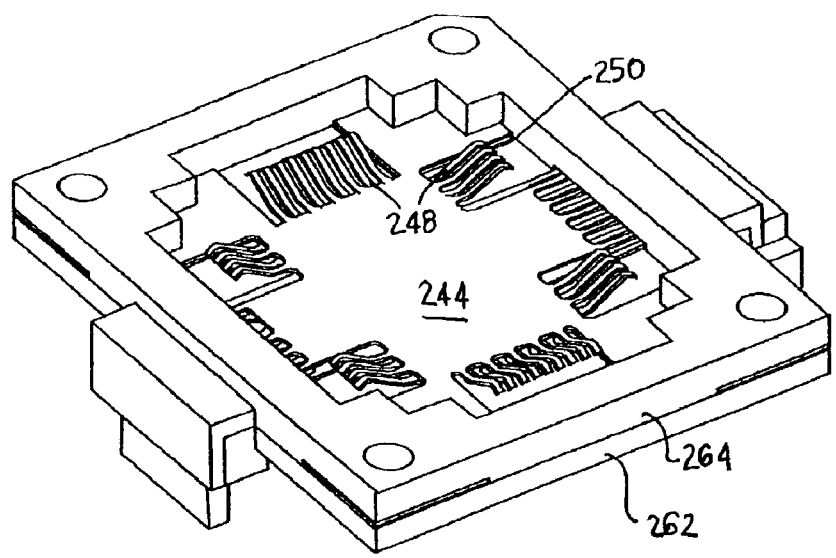
FIGS. 56 and 57 are underside perspective views of the cover member used in the systems illustrated in FIG. 30; and, FIG. 58 is an enlarged detail view of an alternative manner of mounting a discrete capacitor in a connector of the present invention.
Figure 57:
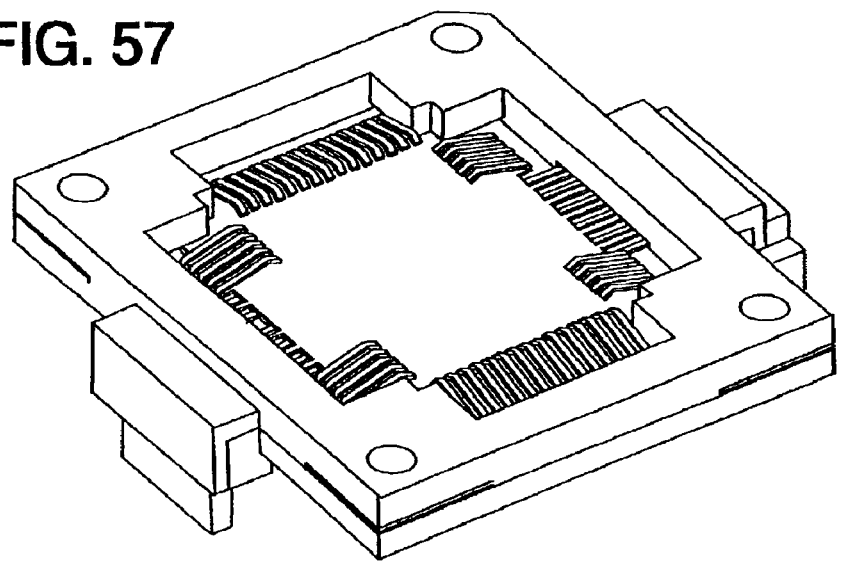

Lastly, FIGS. 56 and 57 are underside perspective views of the cover member used in the systems illustrated in FIG. 30, which illustrate the placement, in an assembled state, of the capacitor plates 244, 246 within their outer support members 262, 264.

The specification describes and the figures illustrate many features and characteristics of the preferred embodiments of the present invention. Any feature or characteristic described in any one part of the specification or shown in any one figure may be combined with any feature or characteristic described in any other part of the specification or shown in any other part of the same or different figure. For example, although the above description has been written in terms of power delivery systems, it will be appreciated that the present invention, may be used for signal transfer with the various capacitor plates being sized for optimum performance .

While the preferred embodiment of the invention have been shown and described, it will be apparent to those skilled in the art that changes and modifications may be made therein without departing from the spirit of the invention, the scope of which is defined by the appended claims.

What is claim is:

1. An electronic package comprising:
    an integrated circuit having top side having a first surface area, a bottom side having a second surface area and disposed opposite to the top side, a lateral side having a third surface area and disposed between the top side and the bottom side, wherein the third surface area is smaller than each of the first surface area and the second surface area;
    a signal connection disposed at the bottom side of the integrated circuit for electrically coupling a semiconductor die carried with the integrated circuit to a signal transfer system; and,
    a power connection disposed on at least one of the top or lateral sides of said integrated circuit for electrically coupling the semiconductor die to a power delivery system, the power connection having a current carrying capacity that is greater than a current carrying capacity of said signal connection.

2. An electronic package according to claim 1, wherein the signal connection further includes a first signal interface for carrying first signals of a first frequency and a second signal interface for carrying second signals of a second frequency that are different from the first frequency.

3. An electronic package according to claim 1, wherein the signal connection further includes a bi-directional signal path including a first signal path for electrically coupling first signal from the signal transfer system to said semiconductor die, and a second signal path for electrically coupling a second signal from the semiconductor die to the signal transfer system.

4. An electronic package according to claim 1, wherein the power connection further comprises a bi-directional power path including a power path for electrically coupling power from the power delivery system to said semiconductor die, and a ground path for electrically coupling ground from said semiconductor die to the power delivery system.

5. An electronic package according to claim 1, wherein the electronic package top side further includes an inner portion located proximate to a center of said top side and an outer portion located proximate to a perimeter of said top side, said power connection is located being disposed at the outer portion of said top side.

6. An electronic package according to claim 1, wherein at least one of said signal and power connections is selected from the group consisting of a conductive connection; a capacitive connection; an inductive connection; an optical connection; a transmission line connection; and a wireless connection.

7. An electronic package according to claim 1, said semiconductor die is electrically coupled to said signal and power connections.

8. An electronic package according to claim 4, wherein the power delivery system is decoupled from said semiconductor die.

9. An electronic package according to claim 6, wherein the conductive connection further includes one of the following: a solder connection; a spring connection; a land grid array (LGA); a pin grid array (PGA); and a ball grid array (BGA).

10. An electronic package according to claim 6, wherein the capacitive connection further includes a signal contact forming a first capacitor plate, the first capacitor plate being disposed opposite to a second capacitor plate.

11. An electronic package according to claim 7, wherein the semiconductor die includes an electronic clement chosen from the group consisting of: a microprocessor, a controller, a memory device, a transmitter, a receiver, and a signal processor.

12. An electronic package according to claim 7, further including a lead frame carrier; and,
    said signal connection includes a signal lead frame carried by the lead frame carrier, the signal lead frame including signal contacts at one end on the bottom side thereof for electrically coupling to said signal transfer system, and a second end, opposite the first end, having a signal pad for electrically coupling to said semiconductor die; and
    wherein said power connection further includes a power lead frame carried by said lead frame carrier, the power lead frame having power contacts at a first end thereof and, located proximate to said lateral side for electrically coupling to said power delivery system, and a second end, opposite to the first end, having a power pad for electrically coupling to said semiconductor die.

13. An electronic package according to claim 7, further including a semiconductor package adapted to encapsulate the semiconductor die.

14. An electronic package according to claim 7, wherein said semiconductor die is part of an integration chosen from the group consisting of a level zero integration, a level one integration, a level two integration, a level three integration and a level four integration.

15. An electronic package according to claim 10, wherein said capacitive connection further includes a dielectric material disposed between said first and second capacitor plates.

16. An electronic package according to claim 12, wherein said lead frame carrier includes at least one element chosen from the group consisting of: a semiconductor substrate, a semiconductor package, and a printed circuit board.

17. An electronic package according to claim 13, wherein the semiconductor package is chosen from the group consisting of: a plastic package, a ceramic package and a glob top package.

18. An electronic package, comprising:
    a top side having a first surface area, a bottom side having a second surface area and disposed opposite to the top side, and a lateral side having a third surface area and disposed between said top and bottom sides, the first and second surface areas being greater than said third surface area;

a semiconductor substrate;

a semiconductor die mounted on the semiconductor substrate;

a semiconductor package encapsulating the semiconductor die; and, a lead frame carrier including a signal connection located at said package bottom side, and electrically coupled between said semiconductor die and a signal transfer system, and said signal connection includes a signal lead frame;

the signal lead frame including first end having a signal contact located at said package bottom side for electrically coupling to said signal transfer system, said signal lead frame including a second end opposite said the first end and having a signal pad for electrically coupling to said semiconductor die;

a bi-directional signal path including a first signal path for electrically coupling a first signal from said signal transfer system to said semiconductor die and a second signal path for electrically coupling a second signal from said semiconductor die to said signal transfer system;

a power connection proximate to one of said package top and lateral sides and electrically coupled between said semiconductor die and a power delivery system, the power connection further including a power lead frame with power contacts disposed at a first end thereof located proximate to one of said package top and lateral sides for electrically coupling to said power delivery system and a second end opposite to said fins end, having a power pad for electrically coupling to said semiconductor die; and, a bi-directional power path including a power path for electrically coupling power from said power delivery system to said semiconductor die, wherein said power includes a decoupled, regulated direct current (DC) voltage that is lower than a DC voltage generated by said power delivery system and a decoupled, regulated DC current that is higher than a DC current generated by said power delivery system and a ground path for electrically coupling ground from said semiconductor die to said power delivery system, wherein a current carrying capacity of said power connection is greater than a current carrying capacity of said signal connection.

19. The electronic package of claim 18, wherein said signal connection further includes a first signal interface for carrying first signals of a first frequency and a second signal interface for carrying second signals having a second frequency different from the first frequency.

20. The electronic package of claim 18, wherein said signal contact is located at a location chosen from the group of locations consisting of: (1) outside said package bottom side, (2) flush with said package bottom side, (3) recessed below said package bottom side, and (4) inside said package bottom side; and, said power contact is located on said electronic package at a location chosen from the group of locations consisting of: (5) outside said at least one of said package top and lateral sides, (6) flush with at least one of said package top and lateral sides, (7) recessed below at least one of said package top and lateral sides, and (8) inside at least one of said package top and lateral sides.

21. An electronic package comprising:

an integrated circuit having top side having a first surface area, a bottom aide having a second surface area and disposed opposite to the top side, a lateral side having a third surface area and disposed between the top side and the bottom side, wherein the third surface area is smaller than each of the first surface area and the second surface area;

a signal connection disposed at the bottom side of the integrated circuit for electrically coupling a semiconductor die carried with the integrated circuit to a signal transfer system; and, a power connection disposed on at least one of the top or lateral sides of said integrated circuit for electrically coupling the semiconductor die to a power delivery system, wherein the signal connection further includes a first signal interface for carrying first signals of a first frequency and a second signal interface for carrying second signals of a second frequency that are different from the first frequency.

* * * * *